(12) United States Patent
Kawa et al.

(10) Patent No.: US 9,378,320 B2
(45) Date of Patent: Jun. 28, 2016

(54) ARRAY WITH INTERCELL CONDUCTORS INCLUDING NANOWIRES OR 2D MATERIAL STRIPS

(71) Applicant: SYNOPSYS, INC., Mountain View, CA (US)

(72) Inventors: Jamil Kawa, Campbell, CA (US); Victor Moroz, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 3 days.

(21) Appl. No.: 14/312,285

(22) Filed: Jun. 23, 2014

(65) Prior Publication Data

US 2015/0370950 A1    Dec. 24, 2015

(51) Int. Cl.
*G06F 17/50*    (2006.01)
(52) U.S. Cl.
CPC ................... *G06F 17/5072* (2013.01)
(58) Field of Classification Search
CPC ............... B82Y 10/00; H01L 21/2603; H01L 21/02606; H01L 23/528; H01L 27/0207; H01L 29/413; B81B 2207/07; H01J 2237/334; H01J 37/32431
USPC .................................................. 716/30, 119
See application file for complete search history.

(56) References Cited

U.S. PATENT DOCUMENTS

| | | | |
|---|---|---|---|
| 5,406,497 A * | 4/1995 | Altheimer | G06F 17/5068 716/104 |
| 5,610,833 A | 3/1997 | Chang et al. | |
| 6,601,220 B1 * | 7/2003 | Allen | G06F 17/5022 716/108 |
| 6,897,098 B2 * | 5/2005 | Hareland | B82Y 10/00 257/210 |
| 7,908,571 B2 * | 3/2011 | Bowers | G06F 17/505 716/119 |
| 8,237,228 B2 | 8/2012 | Or-Bach et al. | |
| 8,490,244 B1 | 7/2013 | Joshi et al. | |
| 8,492,208 B1 * | 7/2013 | Cohen | H01L 29/66439 257/288 |
| 8,549,455 B2 | 10/2013 | Quandt et al. | |
| 8,581,349 B1 | 11/2013 | Sekar et al. | |

(Continued)

FOREIGN PATENT DOCUMENTS

KR    10-0585157 B1    5/2006
KR    10-1076767 B1    10/2011

OTHER PUBLICATIONS

Rrnst et al., "3D Multichannels and Stacked Nanowires Technologies for New Design Opportunities in Nanoelectronics", Jun. 2008, IEEE International Conference on Integrated Circuit Design and Technology and Tutorial (ICICDT), Technical Abstract, pp. 265-268.*

(Continued)

*Primary Examiner* — Sun Lin
(74) *Attorney, Agent, or Firm* — Yiding Wu; Haynes Beffel & Wolfeld LLP

(57) ABSTRACT

An integrated circuit design tool includes a cell library. The cell library includes entries for a plurality of cells, entries in the cell library including specifications of particular cells in a computer executable language. At least one entry in the cell library can comprise a specification of physical structures and timing parameters of an array of circuit cells, the circuit cells including one or more transistors and a cell interconnect terminal; and a conductor configured to connect interconnect terminals of a plurality of the circuit cells in the array, the conductor comprising one or more nanowires or 2D material strips arranged in parallel. An integrated circuit including the array of circuit cells is described.

25 Claims, 34 Drawing Sheets

(56) References Cited

U.S. PATENT DOCUMENTS

| | | | |
|---|---|---|---|
| 8,587,989 B2* | 11/2013 | Manning | B82Y 10/00 365/148 |
| 8,595,661 B2* | 11/2013 | Kawa | H01L 27/0207 716/110 |
| 8,667,443 B2 | 3/2014 | Smayling et al. | |
| 8,669,778 B1 | 3/2014 | Or-Bach et al. | |
| 8,839,175 B2 | 9/2014 | Smayling et al. | |
| 8,863,063 B2 | 10/2014 | Becker et al. | |
| 8,875,071 B2* | 10/2014 | Wang | G06F 17/5045 716/103 |
| 8,890,117 B2* | 11/2014 | Wernersson | B82Y 10/00 257/168 |
| 9,009,638 B1 | 4/2015 | Hook et al. | |
| 9,021,414 B1 | 4/2015 | Or-Bach et al. | |
| 2009/0020787 A1 | 1/2009 | Shioya et al. | |
| 2009/0055789 A1 | 2/2009 | McIlrath | |
| 2011/0031473 A1 | 2/2011 | Chang et al. | |
| 2011/0185323 A1 | 7/2011 | Hogan et al. | |
| 2012/0091587 A1 | 4/2012 | Or-Bach et al. | |
| 2013/0334613 A1 | 12/2013 | Moroz | |
| 2014/0003133 A1 | 1/2014 | Lin et al. | |
| 2014/0015135 A1 | 1/2014 | Rieger et al. | |
| 2014/0084249 A1 | 3/2014 | Basker et al. | |
| 2014/0353574 A1* | 12/2014 | Li | H01L 29/0673 257/9 |
| 2015/0112646 A1 | 4/2015 | Kamal et al. | |

OTHER PUBLICATIONS

Strukov et al., "Monlithically Stackable Hybrid FPGA", 2010, EDAA, Proceedings of Conference on Design, Automation and Test in Europe, pp. 661-666.*

Gholipour et al., "Design Investigation of Nanoelectronic Circuits using Crossbar-based Nanoarchitectures", Feb. 2013, Elsevier Ltd., Microelectronics Journal 44, pp. 199-200.*

Avci, U., et al. "Energy efficiency comparison of nanowire heterojunction TFET and si MOSFET at Lg=13nm, including P-TFET and variation considerations." Proc. IEEE Int. Electron Devices Meet Dec. 9-11, 2013: 33-4.

Bernard, et al., "Novel integration process and performances analysis of Low STandby Power (LSTP) 3D multi-channel CMOSFET (MCFET) on SOI with metal / high-K gate stack," 2008 Symp. on VLSI Technology, Jun. 17-19, 2008, 2 pages.

Geim et al., "Van der Waals Heterostructures," Jul. 25, 2013, vol. 499, Nature 419-425.

Goldberger et al., "Silicon Vertically Integrated Nanowire Field Effect Transistors," American Chemical Society, Nano Letters 2006, vol. 6, No. 5, Mar. 30, 2006, 973-977.

Goldberger et al., "Vertically Integrated Nanowire Field Effect Transistors," 2006, consisting of 7 pages.

Hochbaum, et al., "Controlled Growth of Si Nanowire Arrays for Device Integration," Nano Letters 2005 vol. 5 (3), Jan. 6, 2005, 457-460.

Ma, et al., "Modeling of stress-retarded orientation-dependent oxidation: shape engineering of silicon nanowire channels," 2009 IEEE Electron Devices Meeting, Dec. 7-9, 2009, 4 pages.

PCT/US2015/037252—International Search Report dated Oct. 8, 2015, 12 pages.

PCT/US15/037169—International Search Report dated Aug. 31, 2015, 9 pages.

U.S. Appl. No. 14/312,352—Office Action dated Aug. 17, 2015, 12 pages.

U.S. Appl. No. 14/312,186—Office Action dated Sep. 11, 2015, 11 pages.

U.S. Appl. No. 14/312,352—Response to Office Action dated Aug. 17, 2015, filed Nov. 3, 2015, 8 pages.

Whang et al., "Large-Scale Hierarchical Organization of Nanowires for Functional Nanosystems," Japanese Journal of Applied Physics, vol. 43, No. 7B, Jul. 2004, pp. 4465-4470.

Wong et al., "Carbon Nanotube Field Effect Transistors—Fabrication, Device Physics, and Circuit Implications," 2003 IEEE Int'l Solid-State Circuits Conference, ISSCC Feb. 13, 2003, pp. 370-500.

Wang et al., Silicon p-FETs from Ultrahigh Density Nanowire Arrays, Nano Lett. 6, May 2, 2006, 1096-1100.

Panchapakeshan, et al., "N3ASICs: Designing nanofabrics with fine-grained CMOS integration," 2011 IEEE/ACM Int'l Symp. on Nanoscale Architectures (NANOARCH), pp. 196-202, Jun. 8-9, 2011.

Snider, et al., "Nano/CMOS architectures using a field-programmable nanowire interconnect," Nanotechnology 18 (3), Jan. 3, 2007, 11 pages.

U.S. Appl. No. 14/312,186—Response to Office Action dated Sep. 11, 2015, filed Jan. 6, 2016.

* cited by examiner

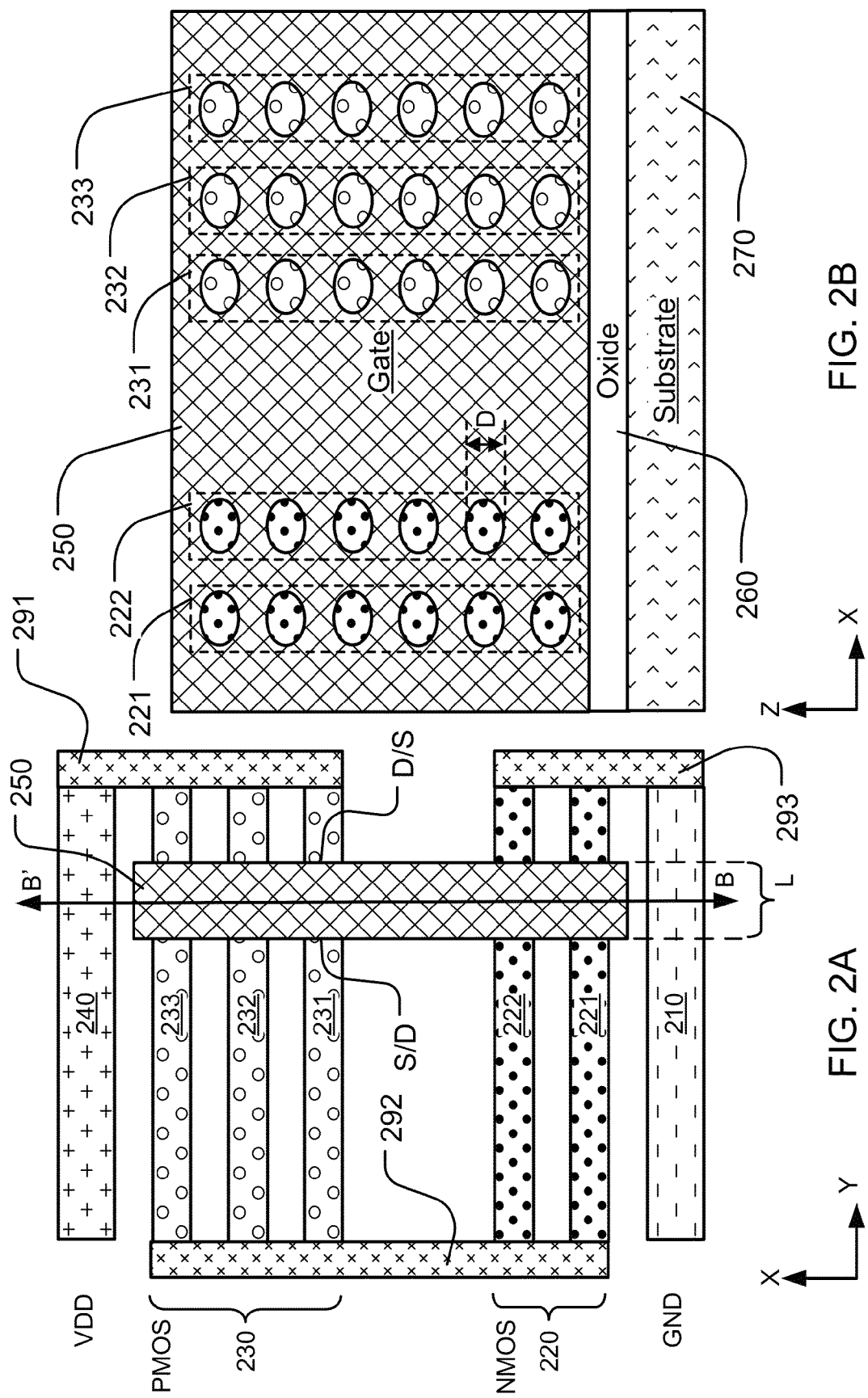

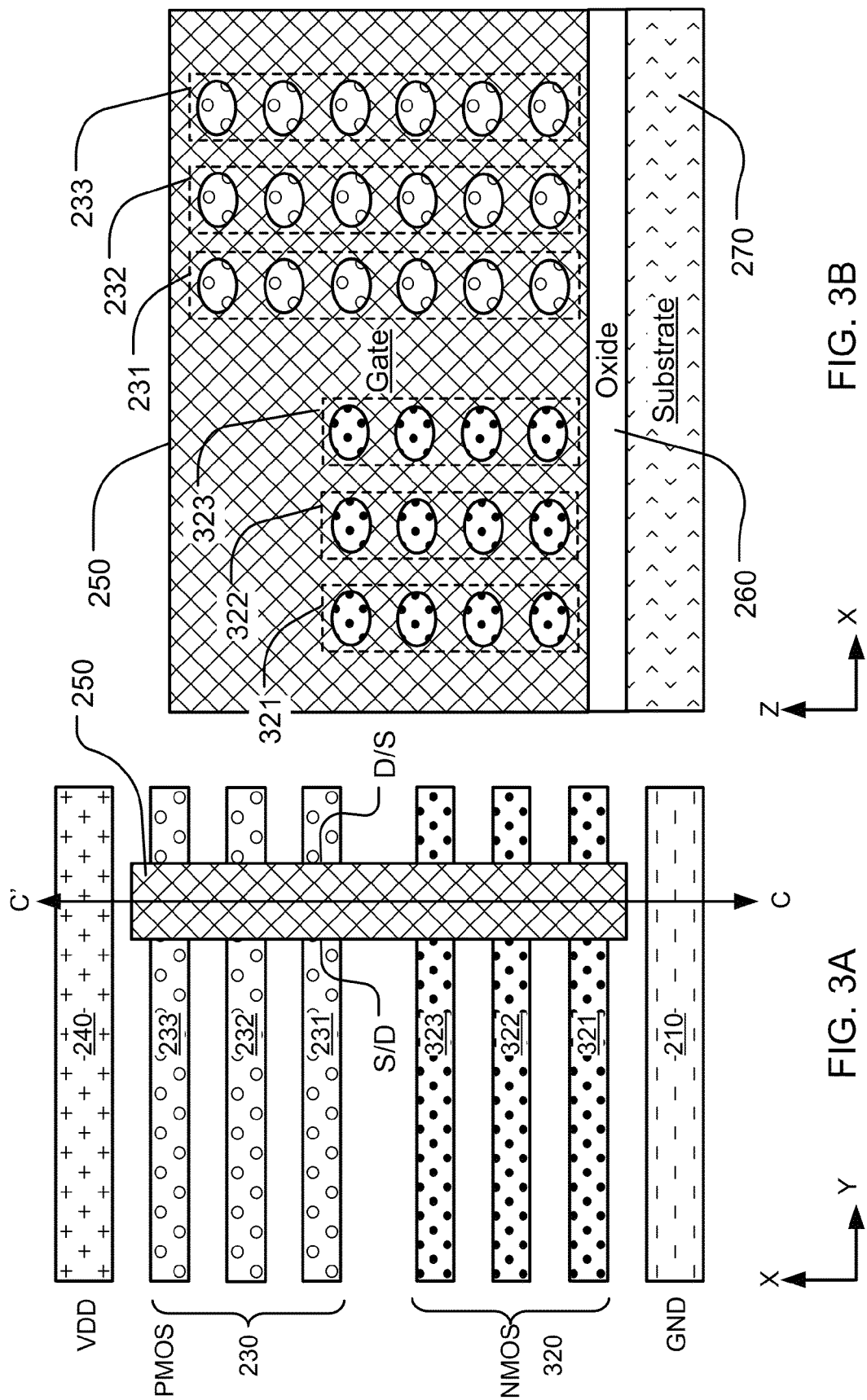

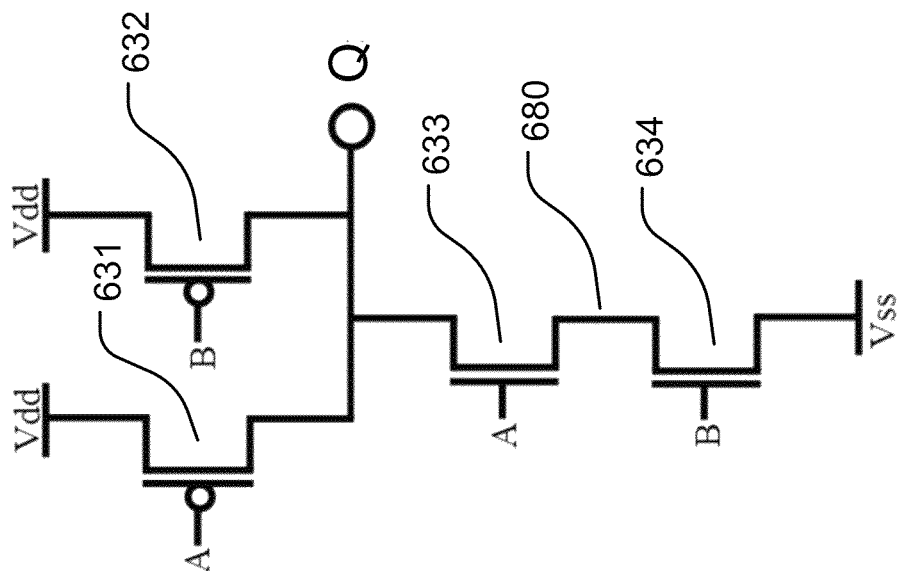
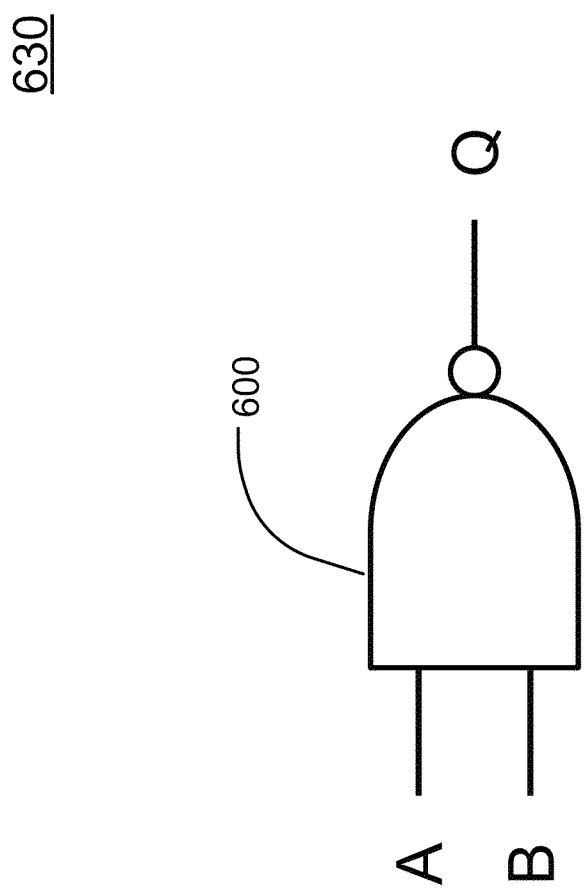
FIG. 10B
FIG. 10A

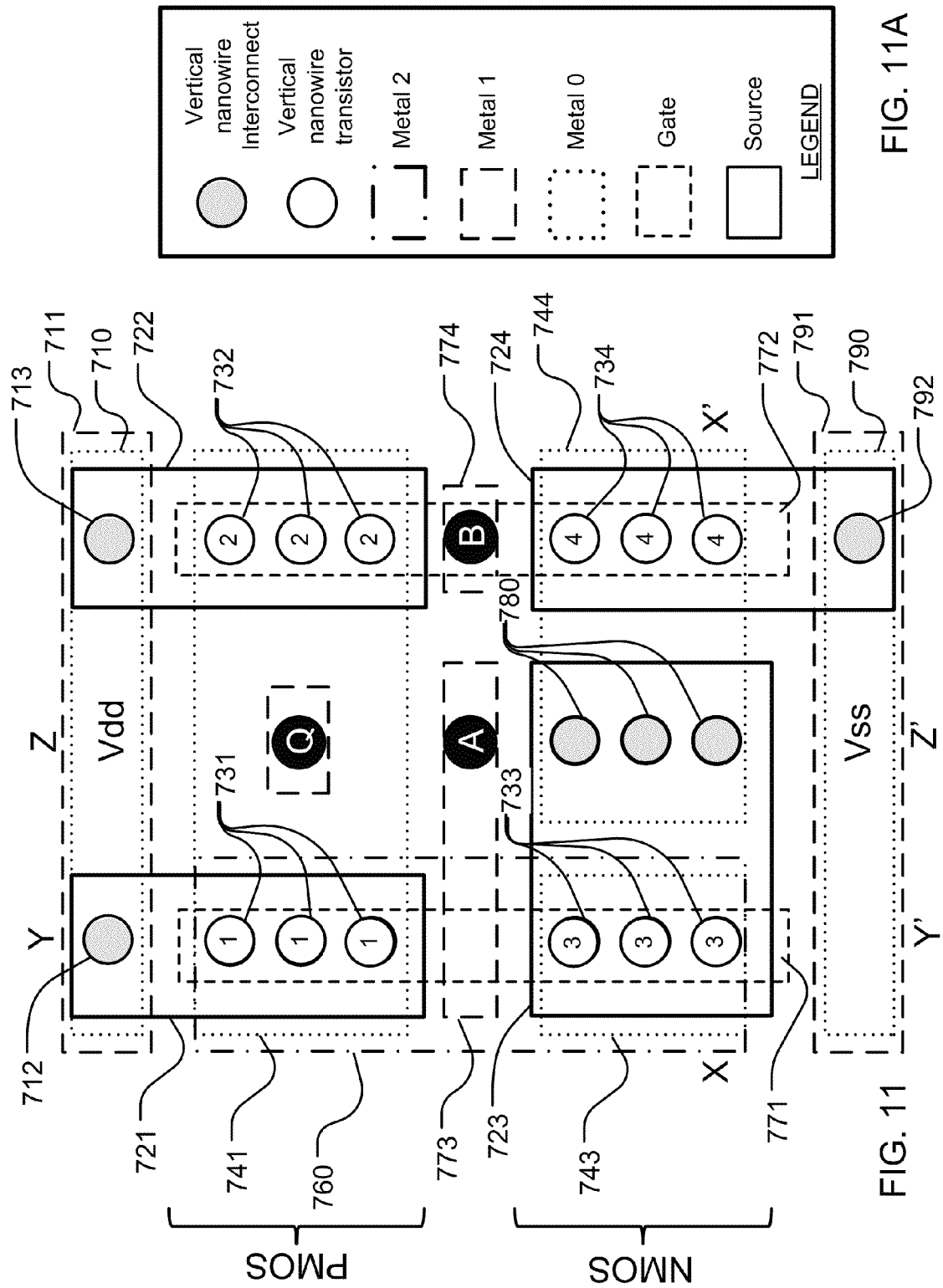

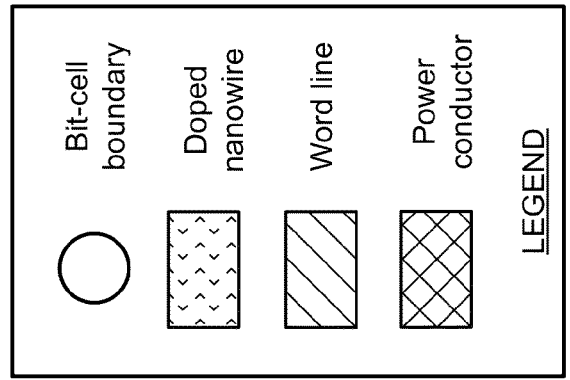
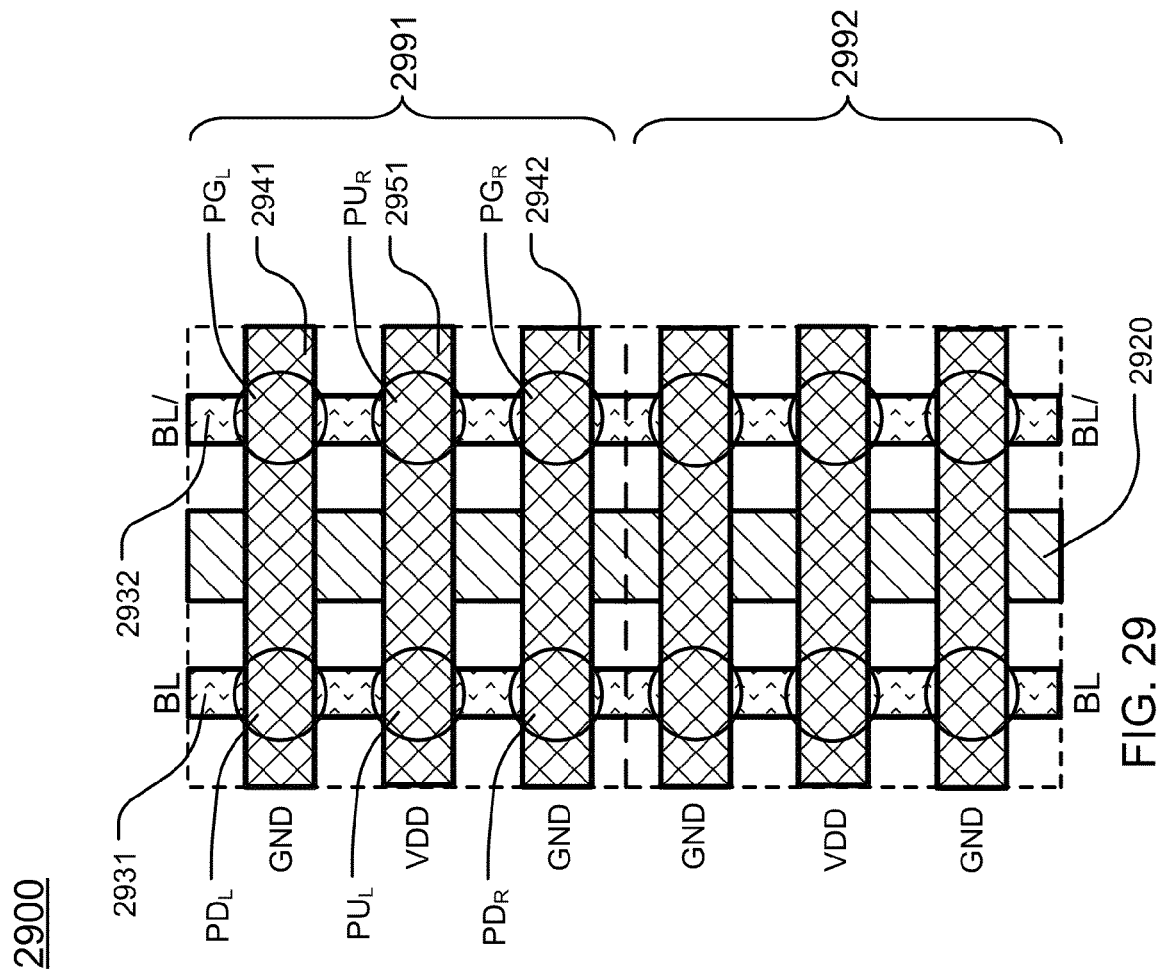

ARRAY WITH INTERCELL CONDUCTORS INCLUDING NANOWIRES OR 2D MATERIAL STRIPS

BACKGROUND

1. Field of the Invention

The present invention relates to integrated circuit devices, cell libraries, cell architectures and electronic design automation tools for integrated circuit devices.

2. Description of Related Art

In the design of integrated circuits, standard cell libraries are often utilized. The process of designing the cells specified by entries in the cell libraries can be intensive, where trade-offs among variables such as the size of the cells, the drive power of the cells, the speed of the cells and so on, are made by adjusting the materials, geometry and size of the components of the cell. The procedure of designing cells to be specified in a cell library is often a labor-intensive process, requiring highly skilled designers to manually design and refine the designs of the cells.

The development of finFETs has provided some additional flexibility for designers which can be applied in the efficient design of variations of specific cells. Thus, some functional libraries are based on finFETs. FinFETs have been implemented in block structures having a grid structure, in which fins are laid out in parallel in a first direction on a substrate with a narrow pitch, and gates are laid out in an orthogonal direction across the fins. The individual cells are formed using sets of complementary re-channel and p-channel transistors having their source, drain and channel in the fins. The drive power and other characteristics of individual transistors in a cell utilizing finFETs can be adjusted by increasing or decreasing the number of identical fins utilized in parallel as the channel structure for a given transistor. This provides some granularity of design in the development of a cell library. However, many circuit parameters can benefit from finer tuning of circuit structures. To fine tune finFET type circuits, complex reconfiguration of the fins or other structures may be required.

The following documents describe developments in the nanowire and 2D material field, and are incorporated by reference for all information presented therein:

*Van der Waals Heterostructures*, A. K. Geim et al., 25 Jul. 2013 |VOL 499| NATURE| 419-425;

*Vertically Integrated Nanowire Field Effect Transistors*, Josh Goldberger et al., Department of Chemistry, University of California, Berkeley, and Materials Science Division, Lawrence Berkeley National Laboratory;

*Silicon Vertically Integrated Nanowire Field Effect Transistors*, Josh Goldberger et al., Nano Letters, 2006 Vol. 6, No. 5 973-977;

*Controlled Growth of Si Nanowire Arrays for Device Integration*, Allon I. Hochbaum et al., Nano Letters, 2005 Vol. 5, No. 3 457-460;

*Modeling of Stress-retarded Orientation-dependent Oxidation: Shape Engineering of Silicon Nanowire Channels*, F.-J ma et al., 97-4244-5640-6/09 ©2009 IEEE, IEDM09-517-520, 21.5.1-21.5.4;

*Energy Efficiency Comparison of Nanowire Heterojunction TFET and Si MOSFET at Lg=13 nm, Including P-TFET and Variation Considerations*, Uygar E. Avci et al., 978-1-4799-2306-9/13 ©2013 IEEE, IEDM13-830-833, 33.4.1-33.3.4;

US Patent Application Publication No. 2014/0015135, Pub. Date Jan. 16, 2014, titled Self-Aligned Via Interconnect Using Relaxed Patterning Exposure, Michael L. Rieger et al.;

*Novel integration process and performances analysis of Low STandby Power (LSTP) 3D Multi-Channel CMOSFET (MCFET) on SOI with Metal/High-K Gate stack*, E. Bernard et al., 978-1-4244-1805-3/08 © 2008, 16-17.

It is desirable to provide a cell design architecture suitable for implementation of cells for a cell library that can provide for finer variations in circuit parameters while reducing the design time and design effort required.

SUMMARY

A method for designing a circuit based on nanowires or on 2D material strips, a resulting cell architecture and an integrated circuit design tool utilizing the cell architecture, are described. Specifications of a particular cell in a computer readable description language can include transistors and interconnects implemented utilizing nanowires or 2D material strips. Thus, a computer implemented cell can comprise a specification of a circuit including a first transistor and a second transistor. The first transistor can include a first set of nanowires or 2D material strips arranged in parallel to form a channel structure, and a gate conductor disposed across the first set of nanowires or 2D material strips. The second transistor can include a second set of nanowires or 2D material strips arranged in parallel to form a channel structure, and a gate conductor disposed across the first set of nanowires or 2D material strips. The number of nanowires or of 2D material strips in the first set can be different from the number of nanowires or of 2D material strips in the second set, so that the drive power of the individual transistors, and other circuit performance characteristics, can be set with finer granularity.

Also, the configuration of the nanowires or of the 2D material strips can be arranged in stacks and layers. The number of stacks and the number of layers used for implementation of the parallel nanowires or of parallel 2D material strips of a given transistor can be adjusted as suits a particular need.

A cell library is described taking advantage of this granularity, which can include a set of cells that implements a common circuit, such as an inverter, a NAND gate or other common logic cell. The cells implementing the common circuit can differ in the number of parallel nanowires used in the implementation of a particular transistor in the common circuit. Also, the cells in the set of cells can differ in the number of parallel nanowires used in the implementation of a particular interconnect in the common circuit. These variations in the number of parallel nanowires can provide for finer gradations in drive power or other characteristics of the transistors, and correspondingly different performance characteristics for the cell.

A computer system adapted to process a computer implemented representation of a circuit design, comprising a processor and memory coupled to the processor, the memory storing instructions executable by the processor, including instructions to select cells from a cell library. The cell library includes entries for a plurality of cells, entries in the cell library including specifications of particular cells in a computer executable language. At least one entry in the cell library can comprise a specification of physical structures and timing parameters of a circuit including a first transistor, a second transistor, and an interconnect connecting a terminal of the first transistor to a terminal of the second transistor, the interconnect comprising one or more nanowires or 2D material strips arranged in parallel.

Entries in a cell library are described which comprise a specification of physical structures and timing parameters of a plurality of transistors, at least some of the transistors in the plurality having channels comprising respective sets of one or more nanowires or 2D material strips, and wherein the channel of one of the transistors in the plurality has a different number of nanowires or 2D material strips than a channel of another transistor in the plurality.

Entries in a cell library are described which comprise a specification of physical structures and timing parameters of an array of circuit cells, such as unit cells in a macrocell defining a memory array, the circuit cells including one or more transistors and a cell interconnect terminal; and a conductor configured to connect interconnect terminals of a plurality of the circuit cells in the array, the conductor comprising one or more nanowires or 2D material strips arranged in parallel.

Entries in a cell library are described which comprise a specification of a cell including a plurality of transistors and an interconnect; wherein a transistor in the plurality has a channel comprising one or more nanowires or 2D material strips arranged in parallel, and the interconnect comprises one or more nanowires or 2D material strips arranged in parallel and connected to terminals of more than one of the transistors in the plurality of transistors.

A design method is described, which comprises converting a finFET circuit with a particular transistor having a channel comprising a plurality of fins configured in parallel, into a converted circuit including nanowires or 2D material strips, the converted circuit replacing the particular transistor with a converted transistor having a channel comprising a plurality of stacks of nanowires or of 2D material strips arranged in parallel.

Computer program products are described including a memory having stored thereon computer readable parameters specifying structural features of a physical implementation of a circuit, the specification being executable by a computer running a placement process to control physical placement of the circuit with other circuits or components for circuits comprising nanowires or 2D material strips as described herein.

Integrated circuits are described which can include circuits comprising nanowires or 2D material strips as described herein.

Other aspects and advantages of the present technology can be seen on review of the figures, the detailed description, and the claims which follow.

BRIEF DESCRIPTION OF THE DRAWINGS

FIGS. 2A and 2B illustrate complementary nanowire blocks in which stacks of nanowires can be connected in parallel.

FIGS. 3A and 3B illustrate complementary nanowire blocks in which stacks of nanowires can have different heights.

FIGS. 10A and 10B illustrate a schematic symbol and a transistor level schematic for a two-input NAND gate.

FIG. 11 is a simplified layout diagram showing a top view of a two-input NAND gate implemented with nanowires and nanowire interconnects using vertical nanowires.

FIG. 11A is a legend applicable to FIGS. 11 through 14.

FIG. 15A is a legend applicable to FIGS. 15 through 18.

FIG. 29 is a simplified layout diagram showing a top view of two SRAM cells, utilizing conductors including a plurality of doped horizontal nanowires configured as bit lines.

FIG. 29A is a legend applicable to FIG. 29.

DETAILED DESCRIPTION

Figures 1A, 1B:
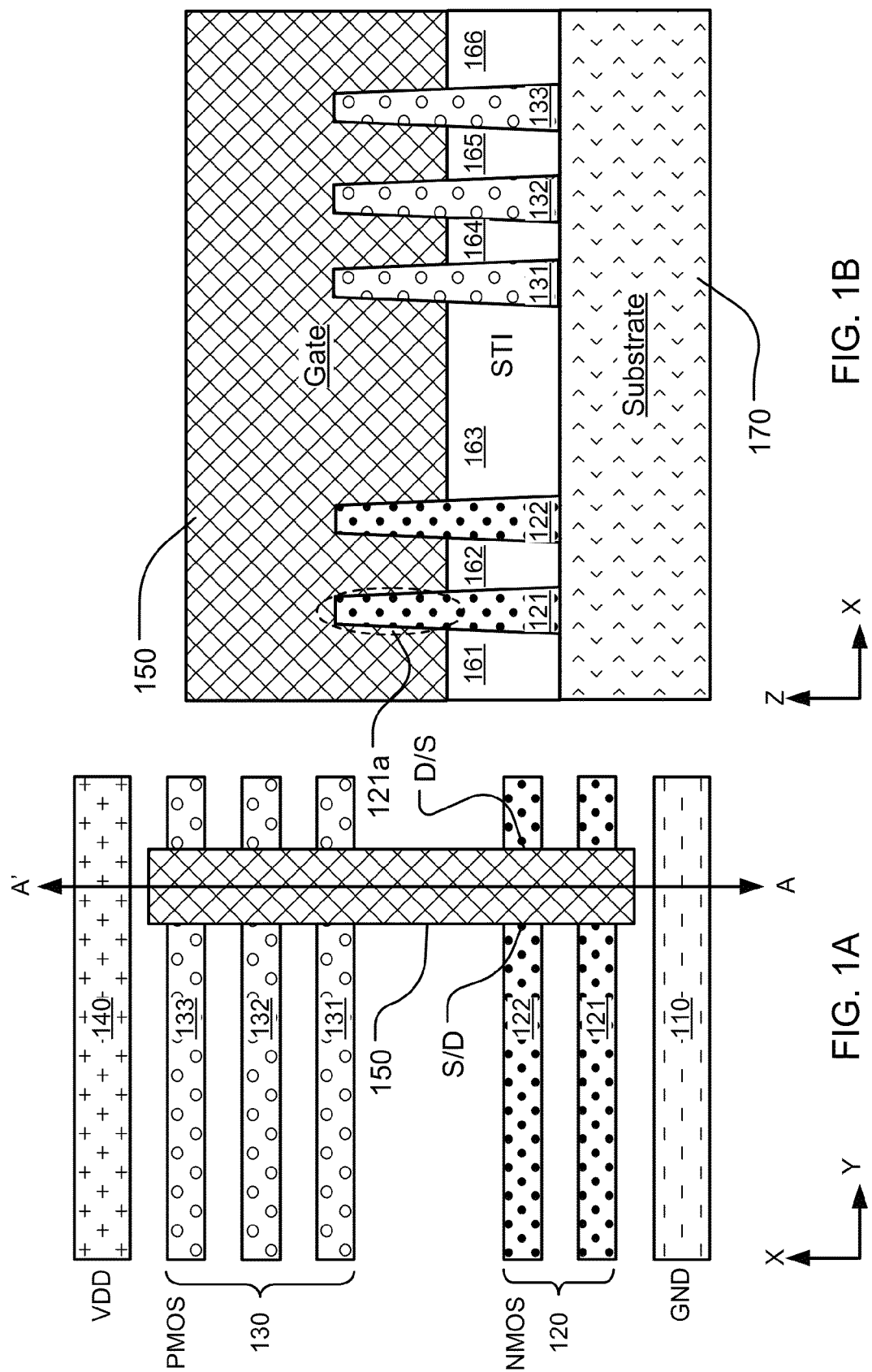
FIGS. 1A and 1B illustrate complementary finFET blocks in which finFET transistors can be arranged to implement cells.

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIGS. 1A and 1B illustrate complementary finFET blocks in which finFET transistors can be arranged to implement cells. The cells can be in a flexible finFET cell library. FIG. 1A shows a top view of a finFET structure in an X-Y plane. FIG. 1B shows a cross-sectional view of the structure shown in FIG. 1A taken at A-A' in a Z-X plane, where Z is in a direction perpendicular to the X-Y plane.

FIG. 1A illustrates a pattern of finFET blocks, suitable for implementation of cells using complementary p-channel and n-channel transistors, known as CMOS transistors. The pattern includes a PMOS block 130, and an NMOS block 120. The PMOS block and the NMOS block can be separated from each other by an isolation structure (not shown). The PMOS block 130 includes area allocated for a set of fins, including fins 131-133. The number of fins in the set of fins for which area is allocated in any given PMOS block can vary according to the needs of a particular implementation. The fins can be implemented on an insulating layer, or protrude from an underlying semiconductor substrate.

The NMOS block 120 includes a set of fins, including fins 121 and 122, the members of which are laid out in parallel on the semiconductor substrate. An upper portion of a fin (e.g. 121a) can be surrounded by a gate conductor (e.g. 150, FIG. 1B) and carry an electric current. The number of fins in the set of fins for which area is allocated in any given NMOS block can vary according to the needs of a particular implementation. As with the PMOS block, the fins in the NMOS block can be implemented on an insulating layer, or protrude from an underlying semiconductor substrate.

A patterned gate conductor layer overlies the fins, and includes gate conductors (e.g. 150) orthogonal to the fins in the plurality of finFET blocks. Although only one gate conductor is shown, the number of gate conductors can be selected as suits a particular implementation. The PMOS block 130 includes gate conductors, including gate conductor 150, which are elements of the patterned gate conductor layer, and are disposed over and orthogonal to the set of fins in the NMOS block 120 and PMOS block 130. In alternative embodiments, the gate conductor 150 can be implemented using separate gate conductors in each block, which can be connected using patterned metal layers in overlying layers.

In one embodiment, a patterned conductor layer (e.g. metal-0) can be laid out with the patterned gate conductor layer that includes the gate conductors (e.g. 150). Metal-0 conductors can be power conductors used to connect selected fins to power rail 140 and ground rail 110. In alternative structures, VDD and GND power conductors can be implemented using higher layer (e.g. metal-1 or metal-2) conductors, and can be connected in turn to power rail 140 and ground rail 110.

A power conductor, or a power rail, as used herein is a conductor in a patterned conductor layer that is used primarily to deliver power supply voltages, commonly referred to as VDD or GND, to the elements of a circuit. The VDD voltage and the GND voltage for a given block may be the same as or different from the VDD voltage and the GND voltage for another block, or for other circuits on the same integrated circuit.

FIG. 1A shows a plurality of fins (e.g. 121, 122, 131, 132 and 133), a power rail (e.g. 140), and a ground rail (e.g. 110) arranged in parallel, and gate conductors (e.g. 150) arranged orthogonal to and overlying the fins. As shown in FIG. 1A, on either side of a gate conductor (e.g. 150), source and drain regions (e.g. S/D, D/S) are implemented in the fins. The finFET transistors that result have channel regions between source and drain regions in the fins, and a gate overlying the fins. The finFET transistors can be n-channel transistors in the NMOS block 120 or p-channel transistors in the PMOS block 130.

FIG. 1B shows, in cross-section, the plurality of fins (e.g. 121, 122, 131, 132 and 133) arranged in parallel on a semiconductor substrate 170, so that they extend into and out of page in FIG. 1B. The individual fins are separated by shallow trench isolation (STI) structures (e.g. 161-166). The gate conductor (e.g. 150), which can be implemented using metal or polysilicon, for example, extends across the fins.

Two or more fins crossed by a same gate conductor (e.g. 150) can be connected in parallel by connecting respective sources and connecting respective drains, resulting in an equivalent transistor with increased transistor strength. For instance, two individual n-channel fins 121 and 122 can be connected in parallel, resulting in an equivalent n-channel finFET transistor with about twice as much transistor strength as each of two corresponding single fin n-channel finFET transistors. Likewise, three individual p-channel fins 131, 132 and 133 can be connected in parallel, resulting in an equivalent p-channel finFET transistor with about three times as much transistor strength as each of three corresponding single fin p-channel finFET transistors. However, gradation of the transistor strength in finFET transistors is limited by the structures of the individual fins.

FIGS. 2A and 2B illustrate complementary nanowire blocks in which nanowires can be connected in parallel to form transistors. FIG. 2A shows a top view of a structure including stacks of nanowires in an X-Y plane. FIG. 2B shows a cross-sectional view of the structure shown in FIG. 2A taken at B-B' in a Z-X plane, where Z is in a direction perpendicular to the X-Y plane. In the illustrated example, two stacks of nanowires configured for n-channel operation can replace the corresponding n-channel fins, and three stacks of nanowires configured for p-channel operation can replace the corresponding p-channel fins from the structure of FIG. 1A.

The term "nanowire" as used herein is a length of material, for example silicon, which has a minimum cross-sectional dimension of less than 10 nm, and which is sheathed by insulating material (which could be air). The term "nanowire" itself, as used herein, does not imply any particular doping profile. Thus, as used herein, a "nanowire" is a nanowire containing a longitudinal segment or segments having a conductivity, and if appropriate for the particular material of the nanowire, a doping concentration, suitable for operation as a channel of a transistor, a source of a transistor, a drain of a transistor or as an interconnect.

A "2D material strip" as used herein is a length of material that includes fibers or strips that consist essentially of one or more layers of doped or undoped "2D materials," such as graphene, phosphine ($PH_3$) or $MoS_2$ (molybdenum disulfide). A 2D material can be considered to be a material which tends to form strong bonds, such as covalent bonds, in planes with relatively weaker bonds, such as Van der Waals bonds, between the planes like graphene. Strips of 2D materials can be configured in ribbon form (single or multi-layer), nanotube form and woven form, for example.

The term "nanowire or 2D material strip interconnect" as used herein is a segment of nanowire or 2D material strip, or set of nanowires or 2D material strips, which extends from one out-of-plane turn to another.

The term "nanowire or 2D material strip interconnect" as used herein can be oriented either horizontally or vertically relative to a surface of a substrate. For a horizontal nanowire or 2D material strip, the out-of-plane turns can be a horizontal-to-vertical turn from one material to another, or in the same material, such as a turn at a via connection to the horizontal nanowire or 2D material strip. For a vertical nanowire or 2D material strip, the out-of-plane turns can be a vertical-to-horizontal turn, such as a connection from the vertical nanowire to a horizontal conductor on the layer above or below. Note that the conductor on the far side of the turn can be a metal contact, in which case the turn occurs at a "contact." Alternatively, it can be more nanowires or 2D material strips, in which case the "turn" does not necessarily constitute an actual "contact."

As used herein, a "nanowire transistor" includes a gate conductor over a set of nanowires (which cannot be an empty set, and may have a single member) connected in parallel, and two current path terminals on the nanowires in the set, and on either side of the gate conductor. The two current path terminals are referred to as a source terminal and a drain terminal, or more generally as source/drain terminals. As used herein, a current path in a nanowire used in a nanowire transistor is between the two current path terminals, through the channel, and controlled by an electric field that is produced when a voltage is applied between the gate conductor and the source terminal of the nanowire. A drain-to-source current can flow through the current path. A "2D material strip transistor" can be defined in the same way, replacing nanowire in the definition with 2D material strip.

FIG. 2A illustrates a pattern of nanowire blocks, suitable for implementation of cells using complementary PMOS and NMOS transistors, known as CMOS transistors. The pattern includes a PMOS block 230, and an NMOS block 220. The PMOS block and the NMOS block can be separated from each other by an isolation structure (not shown). The PMOS block 230 includes area allocated for a set of stacks of nanowires, including stacks 231-233. The set includes at least one stack of nanowires. The number of stacks of nanowires in the set for which area is allocated in any given PMOS block can vary according to the needs of a particular implementation. The nanowires in the PMOS block can be implemented on an insulating layer.

The NMOS block 220 includes a set of stacks of nanowires, including stacks 221 and 222, the members of which are laid out in parallel on the semiconductor substrate. The number of stacks of nanowires in the set of stacks of nanowires for which area is allocated in any given NMOS block can vary according to the needs of a particular implementation. As with the PMOS block, the stacks of nanowires in the NMOS block can be implemented on an insulating layer.

A patterned gate conductor layer overlies the stacks of nanowires, and includes a gate conductor (e.g. 250) over and orthogonal to the stacks of nanowires in the nanowire blocks.

In one embodiment, a patterned conductor layer (e.g. metal-0) can be laid out with the patterned gate conductor layer that includes the gate conductor (e.g. 250). Metal-0 conductors can be power conductors used to connect selected stacks of nanowires to power rail 240 and ground rail 210. In alternative structures, VDD and GND power conductors can be implemented using higher layer (e.g. metal-1 or metal-2) conductors, and can be connected in turn to power rail 240 and ground rail 210.

A power conductor, or a power rail, as used herein is a conductor in a patterned conductor layer that is used primarily to deliver power supply voltages, commonly referred to as VDD or GND, to the elements of a circuit, including stacks of nanowires as described herein. The VDD voltage and the GND voltage for a given block may be the same as or different from the VDD voltage and the GND voltage for another block, or for other circuits on the same integrated circuit.

FIG. 2A shows stacks of nanowires (e.g. 221, 222, 231, 132 and 233), a power rail (e.g. 240), and a ground rail (e.g. 210) arranged in parallel, and a gate conductor (e.g. 250) arranged orthogonal to and overlying the stacks of nanowires. As shown in FIG. 2A, on either side of a gate conductor (e.g. 250), source and drain regions (e.g. S/D, D/S) are implemented in the stacks of nanowires (e.g. 231). The nanowires that result have channel regions between source and drain regions in the nanowires, and a gate overlying the nanowires. The nanowires can be configured for implementation of an n-channel transistor in the NMOS block 220. The nanowires can be configured for implementation of a p-channel transistor in the PMOS block 230. A length of a channel region (e.g. L, FIG. 2A) corresponds to a width of a gate conductor (e.g. 250). A minimum cross-sectional dimension of a nanowire (e.g. D, FIG. 2B) can be less than or equal to the length of a channel region in the longitudinal dimension of the nanowire.

FIG. 2B shows stacks of nanowires (e.g. 221, 222, 231, 232 and 233) arranged in parallel on a semiconductor substrate 270, so that they extend into and out of page in FIG. 2B. The stacks of nanowires are separated from the semiconductor substrate 270 by an insulator layer 260, which for example can be made of oxide material. The gate conductor (e.g. 250), which can be implemented using metal or polysilicon, for example, extends across the stacks of nanowires.

In one embodiment, current paths of two or more individual nanowires in a stack of nanowires controlled by the same gate conductor can be connected in parallel, by connecting respective source terminals and respective drain terminals of the individual nanowires, resulting in a nanowire transistor with increased transistor strength. For instance, current paths of six individual NMOS nanowires in stack 221 can be connected in parallel, resulting in an NMOS nanowire transistor with about six times as much transistor strength as a transistor comprising a single nanowire. Likewise, current paths of six individual PMOS nanowires in stack 231 can be connected in parallel, resulting in a PMOS nanowire transistor with about six times as much transistor strength as a transistor comprising a single p-type nanowire.

Current paths of nanowires in two or more stacks of nanowires controlled by the same gate conductor can be connected in parallel, resulting in a transistor with increased transistor strength corresponding to transistor strengths of individual nanowires in the two or more stacks. For instance, current paths of six individual NMOS nanowires in stack 221 and current paths of six individual NMOS nanowires in stack 222 can be connected in parallel, resulting in an NMOS nanowire transistor comprising a set of twelve nanowires. Likewise, current paths of six individual PMOS nanowires in each of stacks 231, 232 and 233 can be connected in parallel, resulting in a PMOS nanowire transistor comprising a set of eighteen nanowires.

For instance, an inverter, or a portion of almost any CMOS circuit, can be configured with the two nanowire transistors shown in FIG. 2A. In particular, a first set of nanowires in the PMOS block 230 disposed horizontally relative to the surface of the substrate can be connected in parallel between a first terminal 291 and a second terminal 292, where the first terminal is connected to the power (VDD) rail 240, in this example or other node for other circuit types. A second set of nanowires in the NMOS block 220 disposed horizontally relative to the surface of the substrate and connected in parallel between the second terminal 292 and a third terminal 293, where the third terminal is connected to the ground (VSS) rail 210, in this example or other node for other circuit types. The gate conductor 250 crosses the nanowires in the first set between the first and second terminals, and crosses the nanowires in the second set between the second and third terminals. An input signal can be applied to the gate conductor 250, and an output can be connected to the second terminal (292). The first set of nanowires includes a first number of nanowires, the second set of nanowires includes a second number of nanowires, and the second number can be different than the first number. The first number of nanowires and the second number of nanowires can be selected according to design specification.

By selecting the number of nanowires in one or more stacks of nanowires to connect in parallel, finer gradation in transistor strength selection can be provided that is not available in finFET transistors as described in connection with FIG. 1. Such finer gradation improves balance of NMOS and PMOS transistors required for different circuit types.

Alternate implementations of the nanowire circuit structures discussed herein, in general, and more specifically of the structures shown in FIGS. 2A and 2B, can use 2D material strips in place of the nanowires.

FIGS. 3A and 3B illustrate complementary nanowire blocks in which stacks of nanowires can have different numbers of layers, each layer corresponding to a single nanowire, where the number of layers can be referred to as the height of a stack. So, nanowire structures can be configured in selected numbers of stacks, in which the stacks have selected numbers of layers. FIG. 3A shows a layout including stacks of nanowires in an X-Y plane. FIG. 3B shows a cross-section of the structure shown in FIG. 3A taken at C-C' in a Z-X plane, where Z is in a direction perpendicular to the X-Y plane. Like elements in FIGS. 3A and 3B are commonly referred to with like reference numerals in FIGS. 2A and 2B. The height of a stack of nanowires refers to the number of nanowires in a stack, as illustrated in the Z-direction in FIG. 3B.

FIG. 3A illustrates a pattern of nanowire blocks, suitable for implementation of complementary NMOS and PMOS transistors in cells. The pattern includes a PMOS block 230, and an NMOS block 320 each having three stacks of nanowires, but having different numbers of nanowires per stack. The PMOS block and the NMOS block can be separated from each other by an isolation structure (not shown). The PMOS block 230 is as described in connection with FIGS. 2A and 2B with the same reference numerals.

The NMOS block 320 includes a set of stacks of horizontal nanowires, including stacks 321, 322 and 323, the members of which are laid out in parallel on the semiconductor substrate. The number of stacks of nanowires in the set of stacks of nanowires for which area is allocated in any given NMOS block can vary according to the needs of a particular implementation. Such needs can include a range of transistor strength requirements to be satisfied in a cell library or the particular manufacturing constraints of a particular design.

FIG. 3B shows that stacks of nanowires in the NMOS block 320 (e.g. 321, 322, 323) are arranged in parallel on a semiconductor substrate 270, so that they extend into and out of page in FIG. 3B. For instance, each of the three stacks of nanowires in the NMOS block 320 has a height of four nanowires. In comparison, each of the two stacks of nanowires in the NMOS block 220 as shown in FIG. 2B has a height of six nanowires. Accordingly, the transistor strength for a transistor including the three stacks of four nanowires in the NMOS block 320 of FIG. 3B, can be nominally the same as the transistor strength for a transistor including two stacks of six nanowires as shown in the NMOS block 220 in FIG. 2B.

By changing the number of stacks and the height of the stacks of nanowires, finer gradation in transistor strength selection and balance of NMOS and PMOS transistors required for different circuit types can be achieved.

Alternate implementations of the nanowire circuit structures discussed herein, in general, and more specifically of the structures shown in FIGS. 3A and 3B, can use 2D material strips in place of the nanowires.

Figures 4A, 4B:
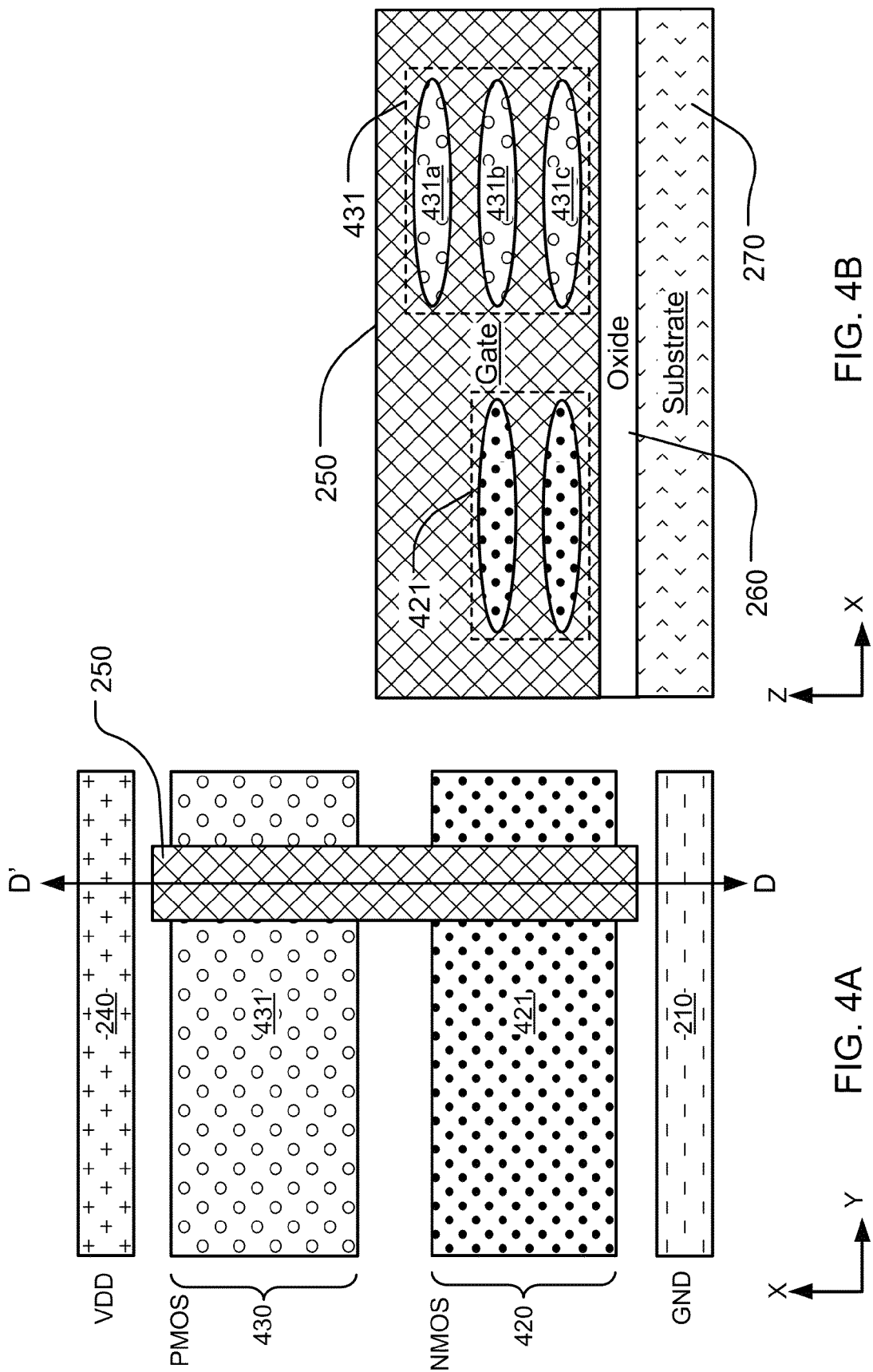
FIGS. 4A and 4B illustrate complementary nanowire blocks in which stacks of nanowires can have different widths.

FIGS. 4A and 4B illustrate complementary nanowire blocks in which nanowires in the stacks of nanowires can have different widths, such as widths that are more than twice their height (i.e. thickness) which, in this layout, is the minimum cross-sectional dimension of the nanowire. FIG. 4A shows a layout of nanowire stacks in an X-Y plane. FIG. 4B shows a cross-section of the structure shown in FIG. 4A taken at D-D' in a Z-X plane, where Z is in a direction perpendicular to the X-Y plane. Like elements in FIGS. 4A and 4B are commonly referred to with like reference numerals in FIGS. 2A and 2B.

As illustrated in the example of FIGS. 4A and 4B, the NMOS block 420 includes a set of nanowires that includes a single stack 421 of wide nanowires, and the PMOS block 430 includes a set of nanowires that includes a single stack 431 of wide nanowires. In comparison, each stack as illustrated in FIGS. 2A, 2B, 3A and 3B has narrow nanowires, where the widths can be the minimum manufacturable widths of a stack of nanowires.

The stack 421 of wide nanowires in the NMOS block 420 can replace more than one stack of narrow nanowires, such as three stacks of two narrow nanowires. This can result in equivalent transistors, so long at the height and width of the wide nanowires in stack 421 are sufficient to match the current carrying capacity of the narrow nanowires. Likewise, the stack 431 of wide nanowires in the PMOS block 430 with three wide nanowires 431a, 431b, 431c in the lower layers which are three-times wider than high can replace nine narrow nanowires disposed in three stacks.

According to the needs of a particular implementation, the NMOS block 420 can include more than one stack having the width of the stack 421 or widths different than the width of the stack 421. Likewise, the PMOS block 430 can include more than one stack having the width of the stack 431 or widths different than the width of the stack 431.

By changing the width of a stack of nanowires, the height of the stack of nanowires can be reduced. For instance, a stack of two nanowires where each of the nanowires has a width equivalent to three nanowires having the minimum width (e.g. 421, FIG. 4B) can provide the same transistor strength as a stack of six nanowires where each of the nanowires has the minimum width (e.g. 221, FIG. 2B). Accordingly, the height of six nanowires in the stack 221 can be reduced to the height of two nanowires in the stack 421, or a reduction of 3× in height, while providing the same transistor strength.

The reduction in height can reduce the aspect ratio for etching trenches when forming the nanowire structures, and relax patterning demands, thus making nanowires easier to manufacture.

Alternate implementations of the nanowire circuit structures discussed herein, in general, and more specifically of the structures shown in FIGS. 4A and 4B, can use 2D material strips in place of the nanowires.

Figures 5A, 5B:
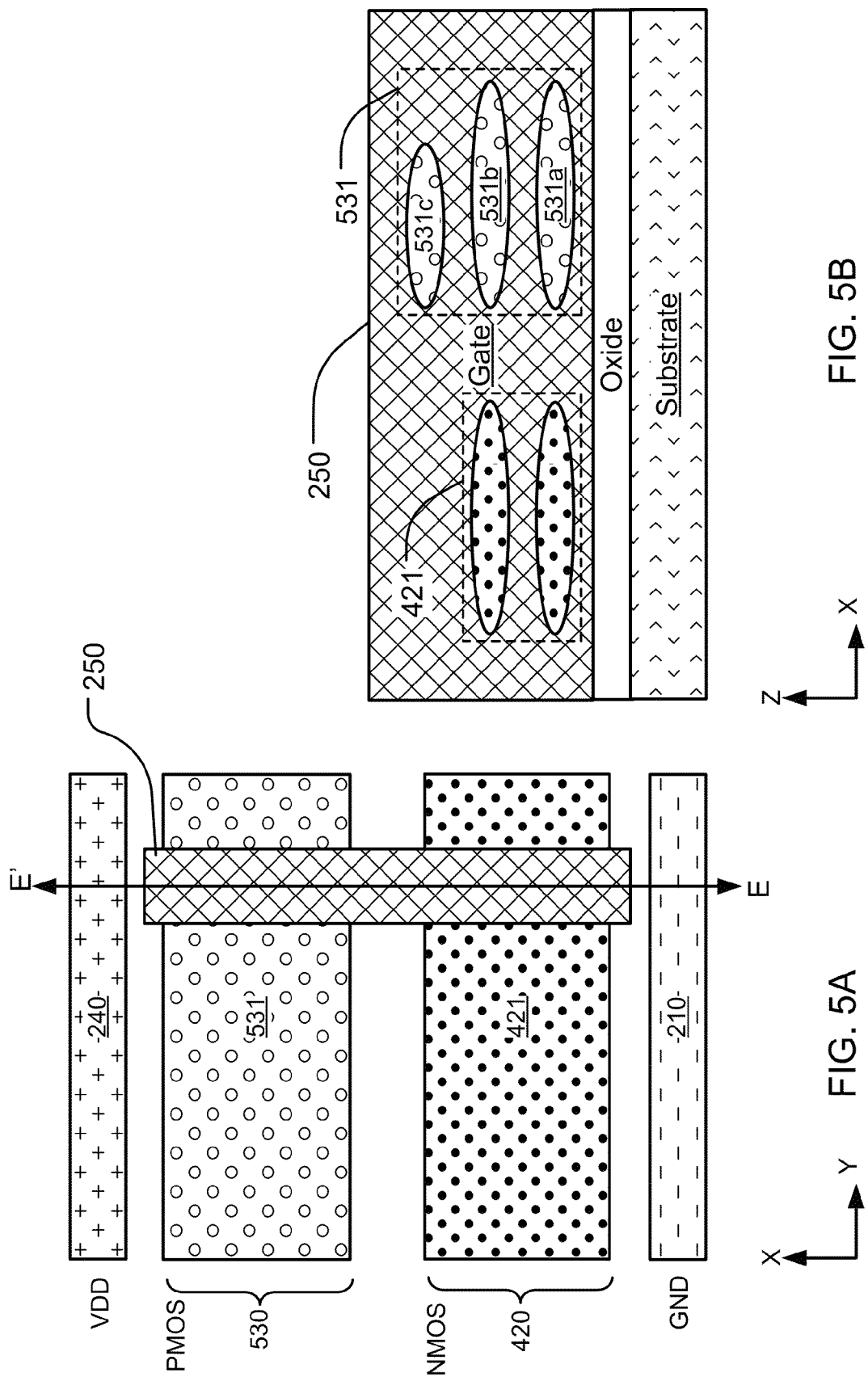
FIGS. 5A and 5B illustrate complementary nanowire blocks in which nanowires within a stack can have different widths.

FIGS. 5A and 5B illustrate complementary nanowire blocks in which nanowires within a stack can have different widths. FIG. 5A shows a layout in an X-Y plane. FIG. 5B shows a cross-section of the structure shown in FIG. 5A taken at E-E' in a Z-X plane, where Z is in a direction perpendicular to the X-Y plane. Like elements in FIGS. 5A and 5B are commonly referred to with like reference numerals in FIGS. 2A, 2B, 4A and 4B.

As illustrated in the example of FIGS. 5A and 5B, the NMOS block 420 includes a set of wide nanowires that includes a stack 421, and the PMOS block 530 includes a set of wide nanowires that includes a stack 531.

The stack 531 in the PMOS block 530 requires a width along the X direction for nanowires 531a and 531b at a cross point of the gate conductor and the nanowires, in the lower layers which has for example the equivalent capacity of three narrow nanowires having the minimum width of a nanowire, and a different width along the X direction for a nanowire 531c in the upper layer, which has for example the equivalent capacity of two narrow nanowires. According to the needs of a particular implementation, each stack of nanowires in each of the NMOS block and PMOS block can include nanowires having different widths.

Alternate implementations of the nanowire circuit structures discussed herein, in general, and more specifically of the structures shown in FIGS. 5A and 5B, can use 2D material strips in place of the nanowires.

Figure 6B:
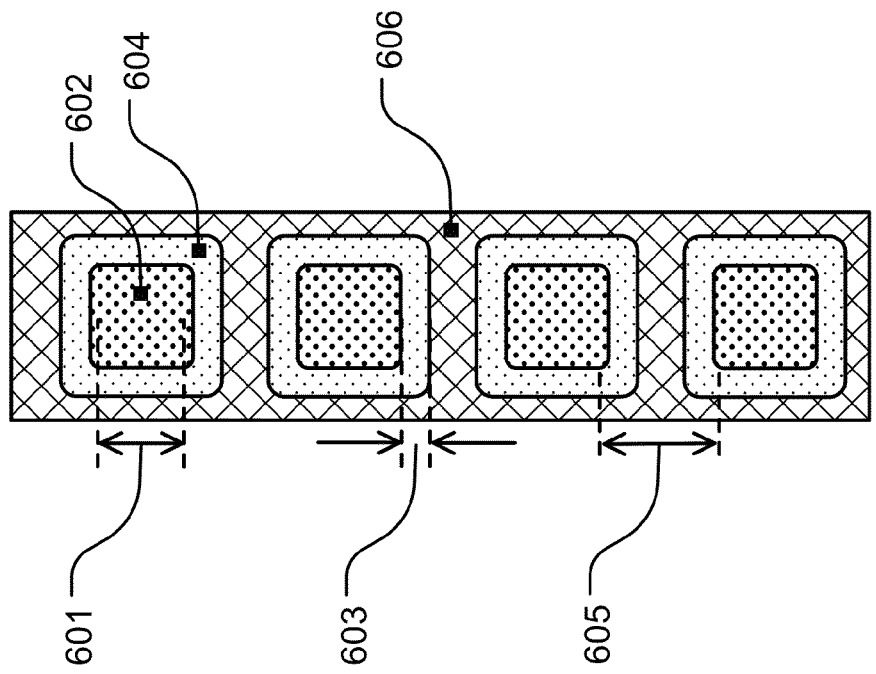
FIG. 6B illustrates a cross-section of a stack of nanowires.
Figure 6A:
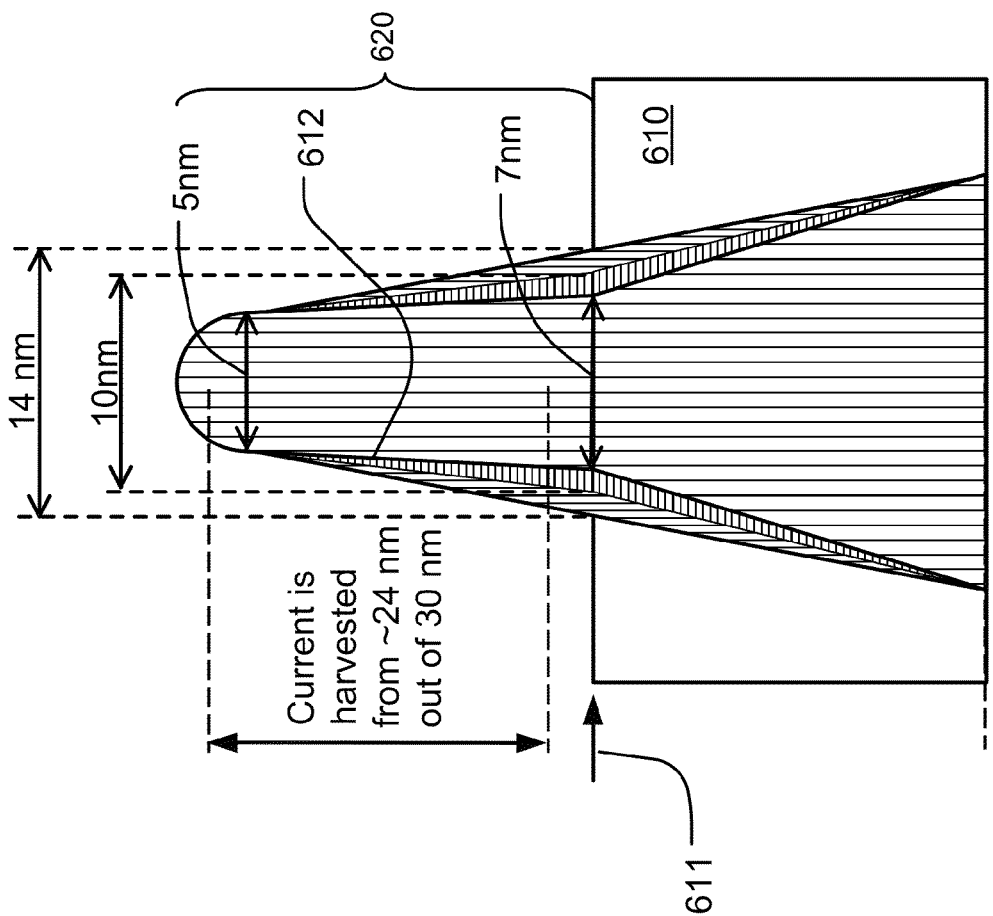
FIG. 6A illustrates cross-sections of fins in finFET structures corresponding to different technology nodes.

FIG. 6A illustrates cross-sections of fins in a finFET structure corresponding to different technology nodes. A fin includes two portions: a lower portion surrounded by an STI structure (e.g. 610) and below an STI surface (e.g. 611), and an upper portion (e.g. 620) above the STI surface, where STI refers to shallow trench isolation. The lower portion of the fin is used to isolate the fin from neighboring materials, and requires higher doping level in "channel-stop" regions below the channel. The lower portion of the fin can be about twice as high as the upper portion of the fin. The upper portion of the fin is a channel, and is surrounded by high-k insulating material (not shown) and by a gate conductor (e.g. 150, FIG. 1B). The top 80% of the channel carries most of an electric current through the channel, while the bottom 20% of the channel carries the rest of the current which is relatively lower and less significant. For instance, if a channel has a height of about 30 nm, then most of the current through the channel can be carried in the upper 24 nm of the channel. An estimate about how many nano-wires are required to substitute a fin can be based on the current requirement for the top 80% of the channel in a fin that carries most of the current through the channel.

Minimum dimensions for different technology nodes are illustrated for the 14 nm node, 10 nm node, 7 nm node, and 5 nm node. One problem with the finFET structures is that, as the technology node becomes smaller, the aspect ratio (i.e., ratio of fin height to fin width) of a fin (e.g. 612) becomes higher and consequently more likely to cause mechanical failures. For instance, for the 5 nm node, sides of a fin can form an angle as small as 10° with the vertical direction. Another problem with the finFET structures is that finer granularity in current strength than the current strength of a single fin is difficult to implement for a given technology.

FIG. 6B illustrates a cross-section of a stack of nanowires. Each nanowire (e.g. 602) in the stack can be sheathed by high-k insulating material (e.g. 604) and an insulating material. Nanowires in the stack can be connected in parallel between two terminals to act as a nanowire interconnect, for example, within a standard cell in a standard cell library. For instance, a nanowire (e.g. 602) can have a minimum dimension (e.g. 601) which is less than 10 nanometers, and the high-k insulating material (e.g. 604) can have a thickness (e.g. 603) between 1 and 2 nanometers.

A stack of nanowires connected in parallel between two terminals and configured as a channel of a transistor, that can carry the same current strength as a finFET can be as much as 3 times higher than the equivalent fin in the finFET, because of the thickness of overhead materials between nanowires (e.g. 605) in the stack, including the thickness of the high-k insulating material (e.g. 603) and surrounding gate materials in a gate conductor 606. In the illustrated example, the stack of nanowires is crossed by the gate conductor 606, which can result in a transistor structure. In alternatives, the conductor 606 can be replaced by insulating materials, so that the stack of nanowires act as a passive interconnect conductor having a conductance which is a function of the number of nanowires connected in parallel.

Figure 7:
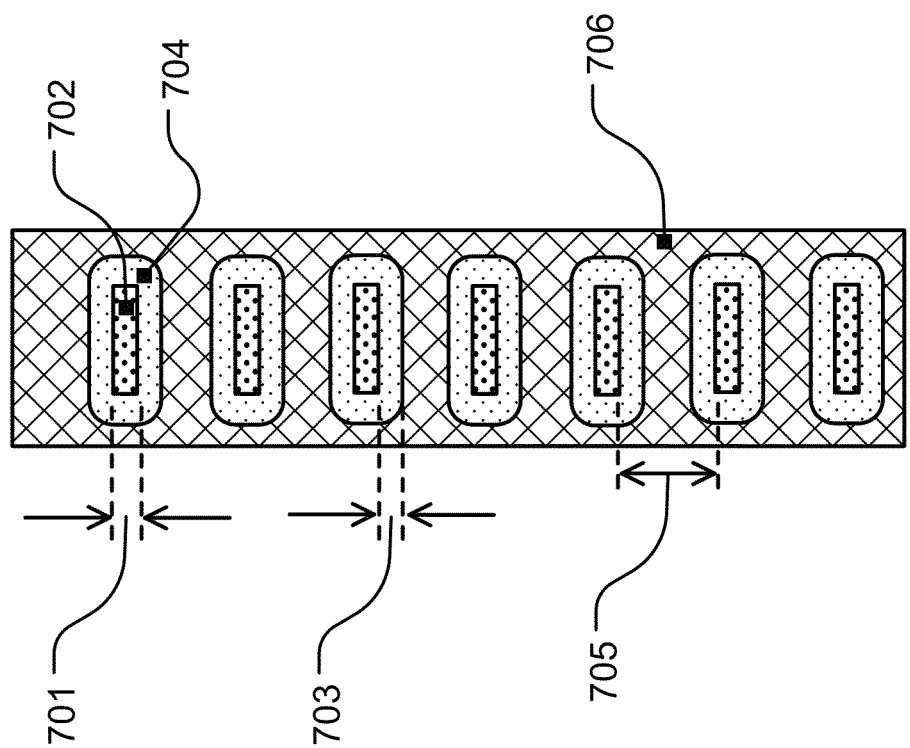
FIG. 7 illustrates a cross-section of a stack of channels of two-dimensional (2D) materials.

FIG. 7 illustrates a cross-section of a stack of 2D material strips, such as a single layer or two layers, of doped or undoped two-dimensional (2D) material. Each 2D material strip (e.g. 702) in the stack is sheathed by high-k insulating material (e.g. 704), and a gate (e.g. 706) crosses the sheathed 2D material strips. 2D material strips in the stack can be connected in parallel between two terminals to act as local interconnects, for example, within a cell in a standard cell library. For instance, a 2D material strip (e.g. 702) can have a minimum dimension (e.g. 701) which is about 1 nanometer or less, and the high-k insulating material (e.g. 704) can have a thickness (e.g. 703) of about 1 nanometer.

A stack of channels connected in parallel between two terminals that can carry the same current strength as a finFET can be much higher, such as about 10 times higher or more, than the fin for equivalent drive power, because of the thickness of overhead materials between 2D material strips (e.g. 705) in the stack, including the thickness of the high-k insulating material (e.g. 703). Likewise, a stack of nanowires utilized as an interconnect can require additional height.

However, for local interconnects, such as within a cell in a standard cell library, larger cross-sections of the local interconnects correspond to longer delays through the local interconnects, due to parasitic capacitance. Nanowires or 2D materials for the interconnects can reduce the parasitic capacitance by a factor on the order of 10, for example, and consequently the number of nanowires in a stack can be reduced by that factor to account for the reduced drive requirement for lower capacitance conductors.

Figure 8:
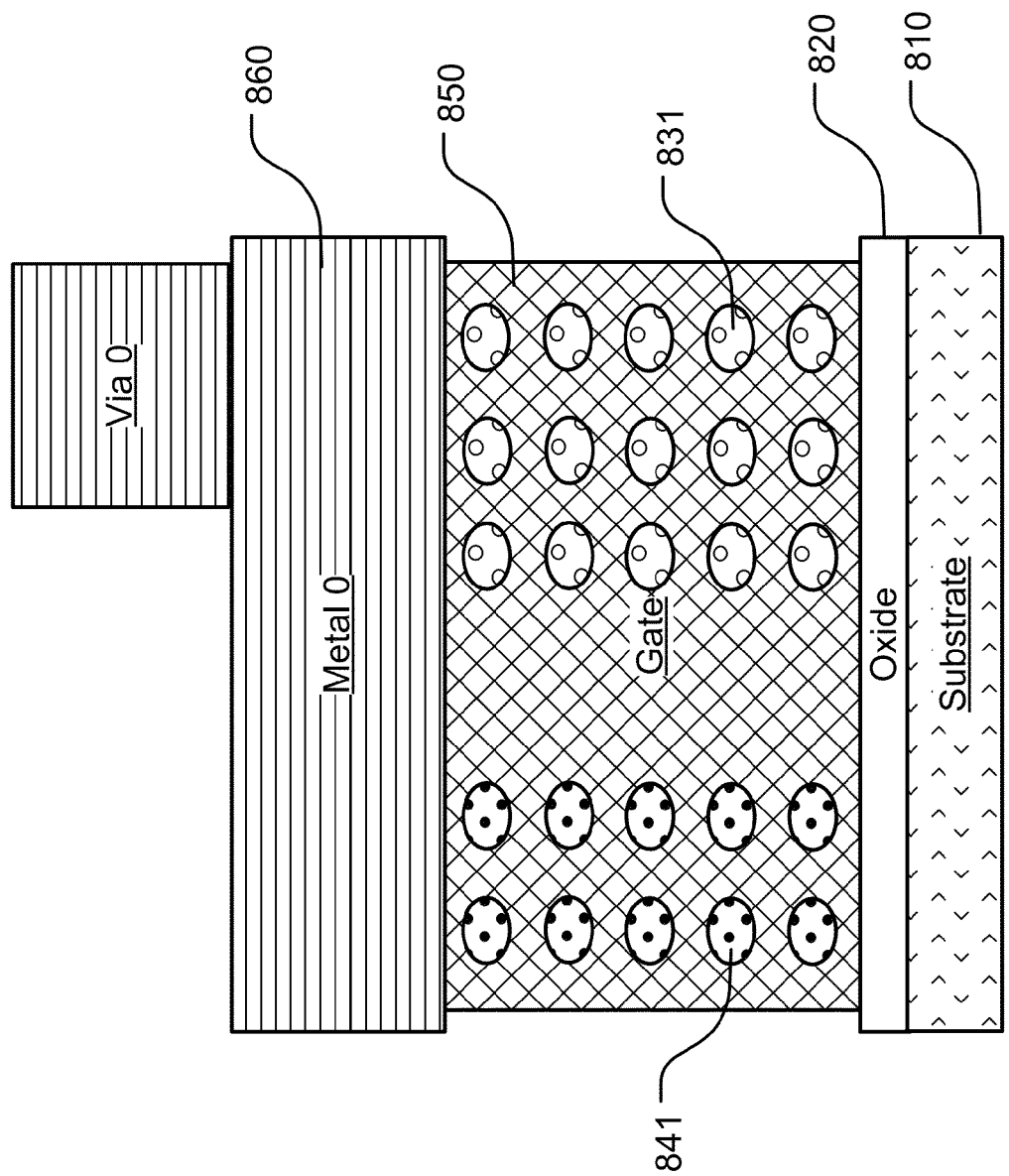
FIG. 8 illustrates patterned conductors in a metal layer used as local interconnects.

FIG. 8 illustrates for example a CMOS pair of nanowire transistors, including a shared gate conductor 850, and having patterned conductors in a metal layer used for local interconnects. Stacks of nanowires (e.g. 831, 841) are arranged in parallel on a semiconductor substrate 810, so that they extend into and out of page in FIG. 8. The stacks of nanowires are separated from the semiconductor substrate 810 by an insulator layer 820, which for example can be made of oxide material. A gate conductor (e.g. 850), which can be implemented using metal or polysilicon, for example, extends across the stacks of nanowire transistors. Patterned conductors in a metal layer used for local interconnects (e.g. 860) are disposed over an area where stacks of nanowires (e.g. 831, 841) are disposed. The figure shows that the thickness of the patterned metal interconnect can be relatively high.

Figure 9:
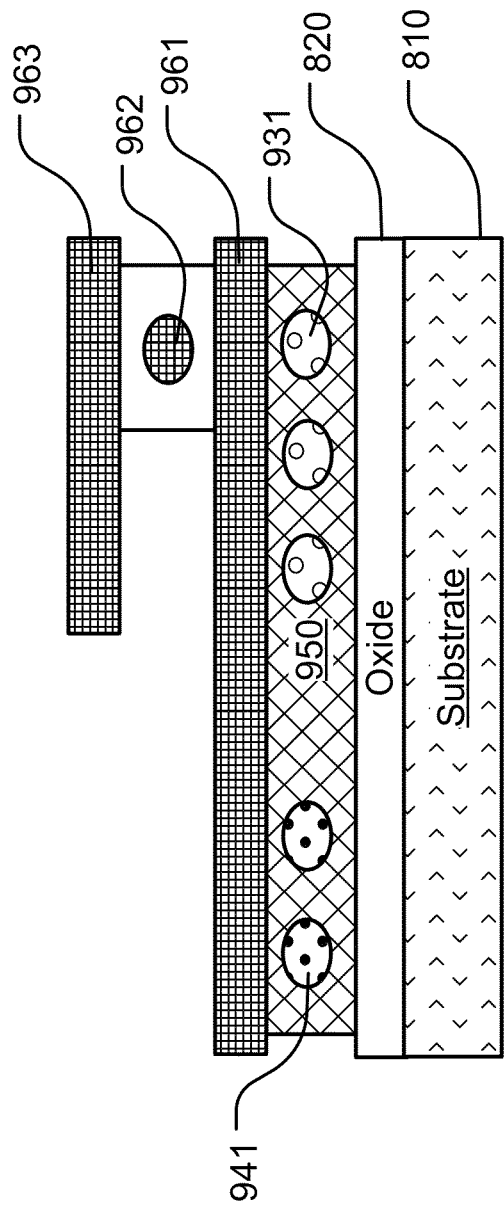
FIG. 9 illustrates patterned conductors including nanowires used as local interconnects.

FIG. 9 illustrates patterned conductors including nanowires used for local interconnects. Stacks of nanowires (e.g. 931, 941) are arranged in parallel on a semiconductor substrate 810, so that they extend into and out of page in FIG. 9. The stacks of nanowires are separated from the semiconductor substrate 810 by an insulator layer 820, which for example can be made of oxide material. A gate conductor (e.g. 950), which can be implemented using metal or polysilicon, for example, extends across the stacks of nanowire transistors.

A first set of nanowires (e.g. 961) is arranged as an interconnect in a first direction over an area where stacks of nanowires (e.g. 931, 941) are disposed. A second set of nanowires (e.g. 962) is arranged as an interconnect in a second direction orthogonal to the first direction into the page and over the first set of nanowires in the patterned conductors. A third set of nanowires (e.g. 963) is arranged as an interconnect in the first direction over the second set of nanowires in the patterned conductors. Because the capacitances of the nanowire interconnects are low relative to the capacitances of the patterned metal interconnects shown in FIG. 8, the drive power of the transistors in the circuit can be reduced. Thus, for example, the circuit of FIG. 8 includes 10 n-channel nanowires and 15 p-channel nanowires, while the circuit shown in FIG. 9 can include only two n-channel nanowires and only three p-channel nanowires disposed as channels for the CMOS transistors. These smaller CMOS transistors can have sufficient drive strength to accomplish the mission function (e.g. inverter) when the capacitance of the local interconnects is small.

Alternate implementations of the nanowire circuit structures discussed herein, in general, and more specifically of the structures shown in FIGS. 8 and 9, can use 2D material strips in place of the nanowires.

FIGS. 10A and 10B illustrate a schematic symbol and a transistor level schematic for a two-input NAND gate which can be implemented using nanowire structures as described herein.

FIG. 10A shows a NAND gate 600 with two inputs A and B and an output Q. The logic function of a NAND gate is that when both inputs are at logic high, the output is at logic low, and when at least one of the inputs is at logic low, the output is at logic high.

FIG. 10B shows a transistor level schematic for a two-input NAND gate 630 with two inputs A and B and an output Q. A cell implementing a NAND gate can have the particular circuit configuration shown. A cell library can include more than one cell that implements the same particular circuit configuration, differing in the number of nanowires used in implementation of a particular transistor or interconnect in the circuit, or of particular transistors or interconnects in the circuit.

The NAND gate includes two PMOS transistors 631 and 632 connected in parallel, and two NMOS transistors 633 and 634 connected in series. A transistor includes three terminals: a drain, a source and a gate. Input A is connected to gates of the PMOS transistor 631 and the NMOS transistor 633. Input B is connected to gates of the PMOS transistor 632 and the NMOS transistor 634. When a transistor is turned on by a voltage on the gate, a current flows between the drain and the source, reducing the voltage difference between the drain and source. Sources of the PMOS transistors 631 and 632 are connected to the supply voltage (e.g. VDD), while drains of the PMOS transistors 631 and 632 are connected to the output Q. Drain of the NMOS transistor 633 is connected to the output Q, while source of the NMOS transistor 634 is connected to the ground voltage (e.g. Vss).

If a low voltage corresponding to logic low is applied to either of the inputs A or B, then at least one of the NMOS transistors 633 and 634 is turned off so that the ground voltage (e.g. Vss) is disconnected from the output Q, while at least one of the PMOS transistors 631 and 632 is turned on so that the supply voltage (e.g. VDD) is connected to the output Q. Consequently the output Q is at logic high in response to a low voltage applied to at least one of the inputs A and B.

Alternate implementations of the nanowire circuit structures discussed herein, in general, and more specifically of the structures shown in FIGS. 10A and 10B, can use 2D material strips in place of the nanowires.

FIG. 11 is a simplified layout diagram showing a top view of a two-input NAND gate implemented with vertical nanowire transistors and horizontal and vertical nanowire interconnects. FIG. 11A is a legend applicable to FIGS. 11 through 14.

The two-input NAND gate is an example of a cell implemented with nanowire transistors and nanowire interconnects that can be specified by a computer readable circuit description language, and used as an entry in a cell library. The entry can be part of a cell library used in electronic design synthesis. For instance, the other entries in the cell library can specify cells and macrocells, including buffers, inverters, AND, NAND, OR, NOR, XOR, XNOR, adders, subtractors, multiplexers, decoders, flipflops, counters, shift registers, and cells with more complex logical functions. The entries can specify a plurality of cells have a common circuit configuration, and are implemented with nanowires, and nanowire interconnects can have a variety of drive strengths, and inverting and non-inverting outputs of the same logical functions.

The two-input NAND gate can be disposed on a substrate (e.g. 810, FIG. 12) having a surface. As illustrated in the example of FIG. 11, a transistor 731 including a first set of nanowires disposed vertically relative to the surface of the substrate can implement the PMOS transistor 631 in the two-input NAND gate 630 (FIG. 10B), and a transistor 732 including a second set of nanowires disposed vertically relative to the surface of the substrate can implement the PMOS transistor 632 in the two-input NAND gate 630. Likewise, a transistor 733 including a third set of nanowires disposed vertically relative to the surface of the substrate can implement the NMOS transistor 633 in the two-input NAND gate 630, and a transistor 734 including a fourth set of nanowires disposed vertically relative to the surface of the substrate can implement the NMOS transistor 634 in the two-input NAND gate 630.

Components in the layout of the two-input NAND gate include patterned conductor layers that include a first metal layer (metal-0 or M0), a second metal layer (metal-1 or M1), and a third metal layer (metal-2 or M2). The metal-0 layer is beneath the metal-1 layer, and the metal-1 layer is beneath the metal-2 layer. Nanowires are beneath the metal-0 layer, and source regions for the transistors are beneath the nanowires. The first gate conductor 771 and the second gate conductor 772 cross the sets of nanowires between the first metal layer and the source regions for the nanowires. Although three patterned conductor layers are shown, more than three patterned conductor layers can be utilized.

Nanowires in a set of nanowires used as a channel structure in a transistor are connected in parallel between two terminals. In particular, nanowires in transistor 731 are connected in parallel between terminals connected to the source region 721 and a metal-0 PMOS drain conductor 741 in the metal-0 layer, and nanowires in transistor 732 are connected in parallel between terminals connected to the source region 722 and the metal-0 PMOS drain conductor 741. A metal-1 conductor (e.g. 751, FIG. 13) connects the metal-0 PMOS drain conductor 741 to a metal-2 connector 760.

Nanowires in transistor 733 are connected in parallel between terminals connected to the source region 723 and a metal-0 NMOS drain conductor 743 in the metal-0 layer, and nanowires in transistor 734 are connected in parallel between terminals connected to the source region 724 and a metal-0 drain conductor 744. A metal-1 conductor (e.g. 753, FIGS. 12 and 13) connects the metal-0 PMOS drain conductor 743 to the metal-2 connector 760. Parallel connection of the nanowires is further described in connection with FIG. 13.

A first gate conductor 771 crosses the nanowires in the first set of nanowires in the transistor 731, and crosses the nanowires in the third set of nanowires in the transistor 733, between their respective two terminals. The first gate conductor 771 is connected to a metal-1 connector 773, at which a signal is applied for the input A. The metal-1 connector 773 can be connected to the first gate conductor 771 at a location on the first gate conductor 771 between the first set of nanowires in the transistor 731 and the third set of nanowires in the transistor 733.

A second gate conductor 772 crosses the nanowires in the second set of nanowires in the transistor 732, and crosses the nanowires in the fourth set of nanowires in the transistor 734, between their respective two terminals. The second gate conductor 772 is connected to a metal-1 connector 774, at which a signal is applied for the input B. The metal-1 connector 774 can be connected to the second gate conductor 772 at a location on the second gate conductor 772 between the second set of nanowires in the transistor 732 and the fourth set of nanowires in the transistor 734. The first gate conductor 771 and the second gate conductor 772 are further described in connection with FIG. 13.

A metal-0 conductor 710 in the metal-0 layer is connected to a VDD power conductor 711 in the metal-1 layer, connected to the source region 721 of the PMOS transistor 731 via nanowire interconnect 712, and connected to the source region 722 of the PMOS transistor 732 via nanowire interconnects 713. A metal-0 conductor 790 in the metal-0 layer is connected to a VSS power conductor 791 in the metal-1 layer, and connected to the source region 724 of the NMOS transistor 734 via nanowire interconnect 792.

Although three vertical nanowires are shown for each set, the first, second, third and fourth sets of nanowires can each have a number of nanowires the same as or different than other sets, depending on the need to balance NMOS and PMOS transistors or transistor strengths required by design specification. Although nanowires in a set are shown in a row of three nanowires, a set of nanowires can include multiple rows of nanowires, and each row can have a different number of nanowires. In other embodiments, nanowires of varying widths can be utilized in the various sets of nanowires.

As illustrated in the example of FIG. 11, a set of nanowires configured as a nanowire interconnect 780 is disposed vertically relative to the surface of the substrate. The set of nanowires is connected in parallel between first and second terminals. The first terminal can be one of the source region 723 of the transistor 733 and the metal-0 drain conductor 744 of the transistor 734, while the second terminal can be another of the source region 723 and the metal-0 drain conductor 744.

The nanowire interconnect 780 is further described in connection with FIG. 12. The nanowire interconnect 780 can implement the connection 680 between the NMOS transistors 633 and 634 in the circuit configuration of a two-input NAND gate 630 as illustrated in FIG. 10B.

Although one set of nanowires configured as a vertical nanowire interconnect is shown in the example of FIG. 11, more sets of nanowires can be configured as vertical nanowire interconnects. For instance, a first set of nanowires configured as a first nanowire interconnect can be disposed vertically relative to the surface of the substrate and connected in parallel between first and second terminals, and a second set of nanowires configured as a second interconnect can be disposed vertically relative to the surface of the substrate and connected in parallel between a third terminal and a fourth terminal. The first set of nanowires can include a first number of nanowires, and the second set of nanowires can include a second number of nanowires, and the second number can be different than the first number.

Figure 12:
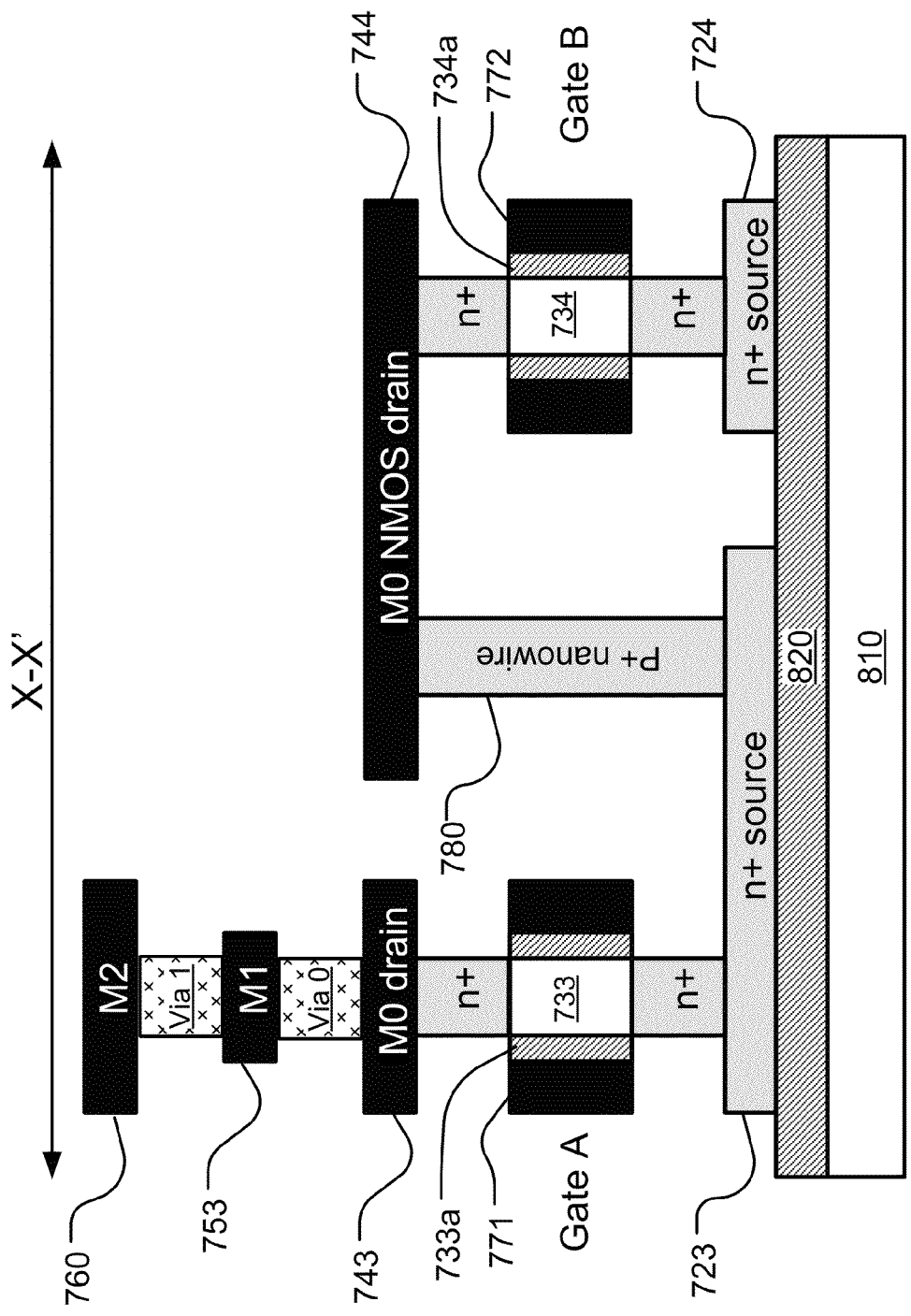
FIG. 12 is a layout diagram showing a cross-sectional view of the two-input NAND gate in FIG. 11 taken at X-X'.

FIG. 12 is a diagram showing a cross-sectional view of the two-input NAND gate in FIG. 11 taken at X-X'. Elements in the two-input NAND gate are shown disposed on an insulator layer (e.g. 820) on a substrate (e.g. 810). Areas between the elements are filled with dielectric material such as silicon oxide, silicon nitride, low-k dielectric ((having a relative permeability less than that of silicon dioxide, or less than 3.9, e.g. SiOC), or with combinations of materials.

Nanowires in transistor 733 are connected in parallel between terminals connected to the source region 723 and the metal-0 NMOS drain conductor 743 in the metal-0 layer. A metal-1 conductor (e.g. 753) connects the metal-0 PMOS drain conductor 743 to the metal-2 connector 760 through Via 1 and Via 0. Nanowires in transistor 734 are connected in parallel between terminals connected to the source region 724 and the metal-0 drain conductor 744.

Nanowires in transistor 733 are sheathed by insulating material (e.g. 733a), such as silicon dioxide or a high-k insulating material (having a relative permeability greater than that of silicon dioxide, or greater than 3.9). The first gate conductor 771 crosses the nanowires in transistor 733 between the source region 723 and the metal-0 NMOS drain conductor 743. Nanowires in transistor 734 are sheathed by insulating material (e.g. 734a), such as high-k insulating material. The second gate conductor 772 crosses the nanowires in transistor 734 between the source region 724 and the metal-0 NMOS drain conductor 744.

Figure 13:
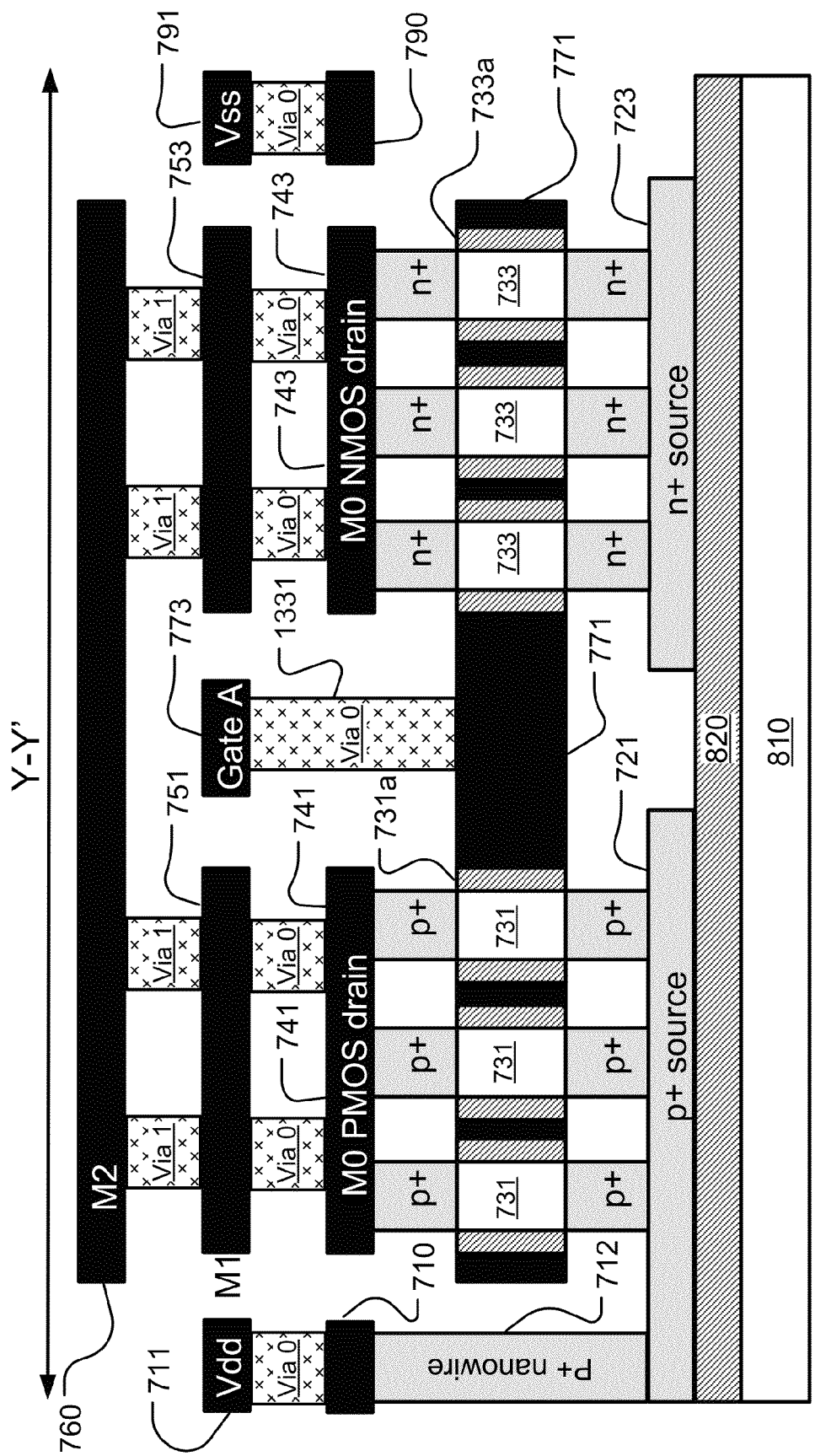
FIG. 13 is a layout diagram showing a cross-sectional view of the two-input NAND gate in FIG. 11 taken at Y-Y'.

FIG. 13 is a diagram showing a cross-sectional view of the two-input NAND gate in FIG. 11 taken at Y-Y'. Elements in the two-input NAND gate are shown disposed on an insulator layer (e.g. 820) on a substrate (e.g. 810). Areas between the elements are filled with dielectric material such as oxide (SiO$_2$), nitride (SiN), or low-k dielectric (SiOC).

Nanowires in transistor 731 are connected in parallel between terminals connected to the source region 721 and the metal-0 NMOS drain conductor 741 in the metal-0 layer. A metal-1 conductor (e.g. 751) connects the metal-0 PMOS drain conductor 741 to the metal-2 connector 760 through Via 1 and Via 0. Nanowires in transistor 731 are sheathed by insulating material (e.g. 731a), such as high-k insulating material. The first gate conductor 771 crosses the nanowires in transistor 731 between the source region 721 and the metal-0 NMOS drain conductor 741.

Nanowires in transistor 733 are connected in parallel between terminals connected to the source region 723 and the metal-0 NMOS drain conductor 743 in the metal-0 layer. A metal-1 conductor (e.g. 753) connects the metal-0 PMOS drain conductor 743 to the metal-2 connector 760 through Via 1 and Via 0. Nanowires in transistor 733 are sheathed by insulating material (e.g. 733*a*), such as high-k insulating material. The first gate conductor 771 crosses the nanowires in transistor 733 between the source region 723 and the metal-0 NMOS drain conductor 743.

The first gate conductor 771 is connected to a metal-1 connector 773, at which a signal is applied for the input A. The first gate conductor 771 is connected to the metal-1 connector 773 through a via 1331.

The metal-0 conductor 710 in the metal-0 layer is connected to the VDD power conductor 711 in the metal-1 layer, and connected to the source region 721 of the PMOS transistor 731 via nanowire interconnect 712. The metal-0 conductor 790 in the metal-0 layer is connected to the VSS power conductor 791 in the metal-1 layer, and connected to the source region 724 of the NMOS transistor 734 via nanowire interconnect 792 (not shown).

Figure 14:
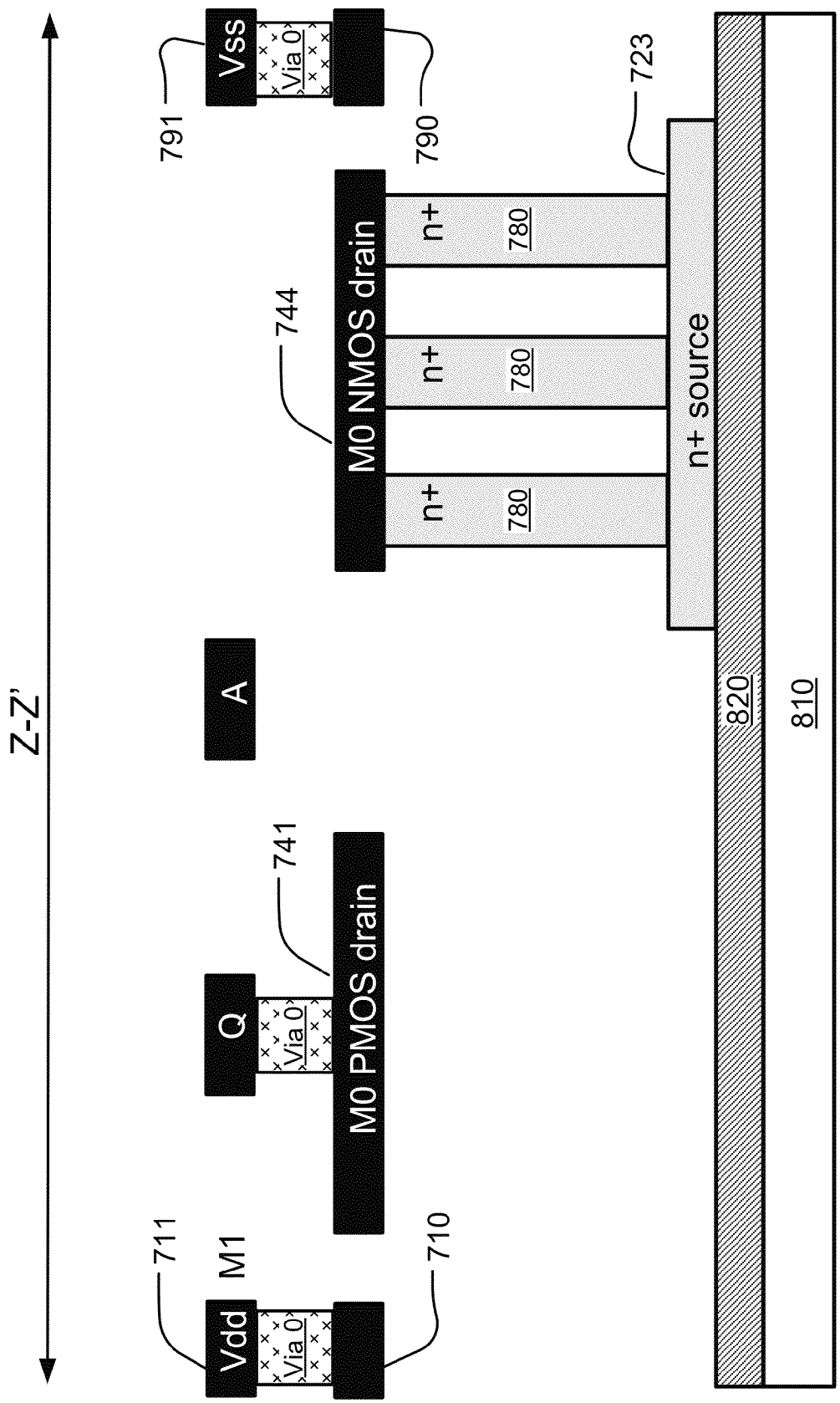
FIG. 14 is a layout diagram showing a cross-sectional view of the two-input NAND gate in FIG. 11 taken at Z-Z'.

FIG. 14 is a diagram showing a cross-sectional view of the two-input NAND gate in FIG. 11 taken at Z-Z'. Elements in the two-input NAND gate are shown disposed on an insulator layer (e.g. 820) on a substrate (e.g. 810). Areas between the elements are filled with dielectric material such as oxide (SiO$_2$), nitride (SiN), or low-k dielectric (SiOC).

The VDD power conductor 711 in the metal-1 layer, and the VSS power conductor 791 in the metal-1 layer are as described in connection to FIG. 13.

A set of nanowires configured as the nanowire interconnect 780 is disposed vertically relative to the surface of the substrate. The set of nanowires is connected in parallel between the source region 723 of the transistor 733 and the metal-0 NMOS drain conductor 744 of the transistor 734.

The output Q is connected to the metal-0 PMOS drain conductor 741 in the metal-0 layer, which in turn is connected to nanowires in the transistor 731 (FIG. 13). The input A is connected to the metal-1 connector 773 (FIG. 13), which in turn is connected to the first gate conductor 771.

Figure 15:
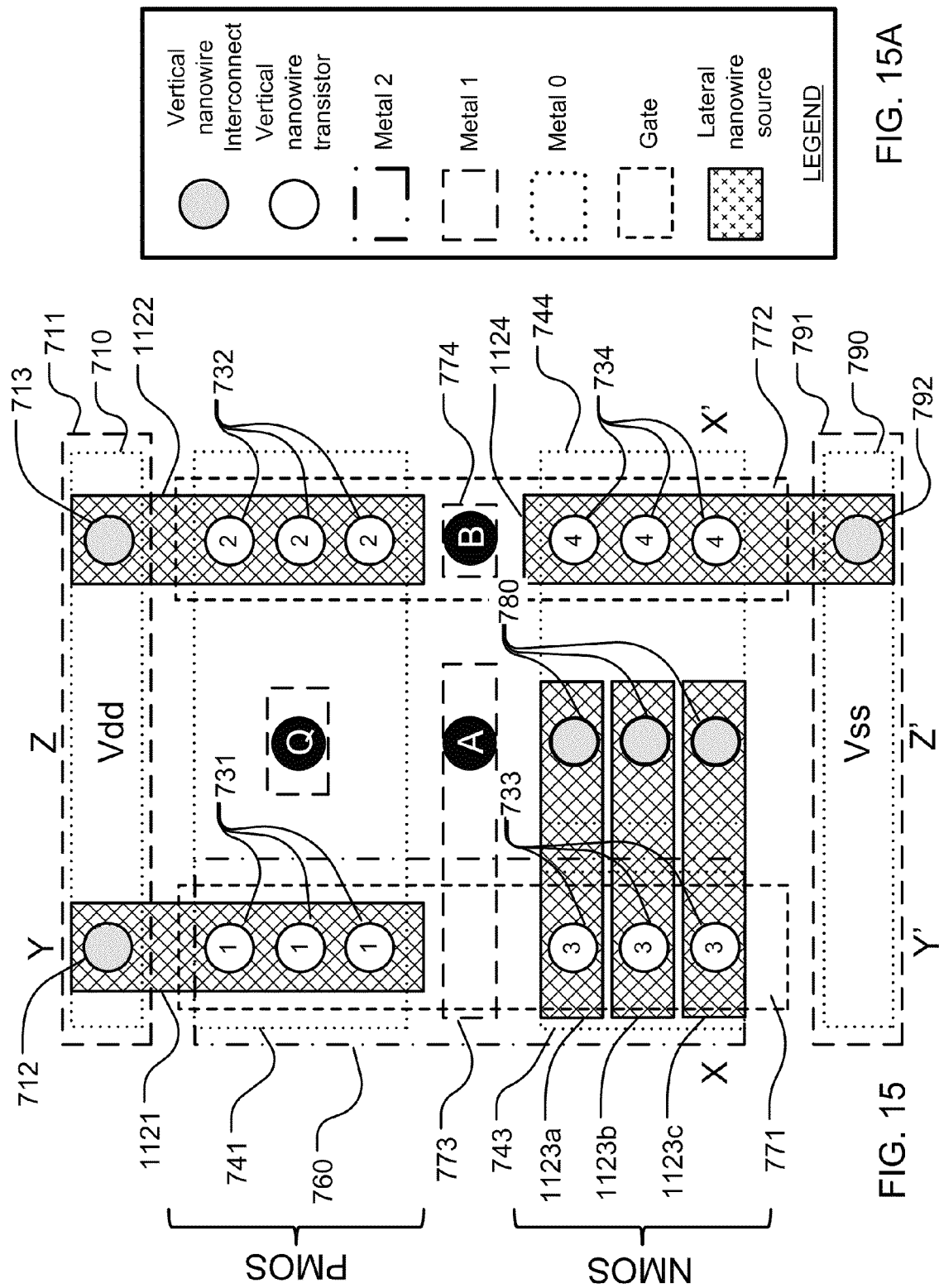
FIG. 15 is a simplified layout diagram showing a top view of a two-input NAND gate implemented with horizontal and vertical nanowires.

FIG. 15 is a simplified layout diagram showing a top view of a two-input NAND gate implemented with horizontal nanowire interconnects and vertical nanowire transistors, representative of circuits, including CMOS logic circuits, that can be specified by entries in a cell library with both horizontal nanowire interconnects and vertical nanowire transistors. FIG. 15A is a legend applicable to FIGS. 15 through 18. Like elements in FIGS. 15-18 are commonly referred to with like reference numerals in FIGS. 11-14.

Like elements in FIGS. 15-18 that are described in FIGS. 11-14 include the substrate (e.g. 810), sets of nanowires connected in parallel as transistors (e.g. 731-734), a set of nanowires connected in parallel as a nanowire interconnect (e.g. 780), metal layers (e.g. M0, M1, M2) and various conductors in the metal layers, source regions for the transistors, gate conductors crossing the sets of nanowires (e.g. 771, 772), inputs A and B, output Q, a VDD power conductor (e.g. 711), and a VSS power conductor (e.g. 791). Description about the like elements is not repeated for FIGS. 15-18.

A first set of nanowires (e.g. 1121) can be configured as an interconnect disposed horizontally relative to the surface of the substrate, and connected in parallel between a first terminal and a second terminal. A second set of nanowires (e.g. 1122) can be configured as an interconnect disposed horizontally relative to the surface of the substrate, and connected in parallel between a third terminal and a fourth terminal. The first set of nanowires includes a first number of nanowires, the second set of nanowires includes a second number of nanowires, and the second number can be different than the first number. A set of nanowires can have one or more nanowires.

As illustrated in the example of FIG. 15, horizontal nanowires are configured to connect to the drain ends or source ends of the nanowires in the set of nanowires of transistors in the two-input NAND gate. In particular, horizontal nanowire interconnects 1121, 1122 and 1124 are configured to connect to the source ends of the nanowires in transistors 731, 732 and 734. Horizontal nanowire interconnects 1123*a*, 1123*b* and 1123*c* are configured to connect to the source ends of the nanowires in the set of nanowires of the transistor 733.

The metal-0 conductor 710 is connected to the VDD power conductor 711 in the metal-1 layer, connected to the horizontal nanowire interconnect 1121 for the source of the PMOS transistor 731 via vertical nanowire interconnect 712 (beneath the nanowires of transistor 731, see FIG. 17), and connected to the horizontal nanowire interconnect 1122 (beneath the nanowires of transistor 732) for the source of the PMOS transistor 732 via vertical nanowire interconnect 713. The metal-0 conductor 790 in the metal-0 layer is connected to a VSS power conductor 791 in the metal-1 layer, and connected to the nanowire interconnect 1124 for the source of the NMOS transistor 734 via vertical nanowire interconnect 792.

A set of nanowires in a transistor is connected in parallel between two terminals. In particular, nanowires in transistor 731 are connected in parallel between terminals connected to the nanowire interconnect 1121 and a metal-0 PMOS drain conductor 741 in the metal-0 layer, and nanowires in transistor 732 are connected in parallel between terminals connected to the nanowire interconnect 1122 and the metal-0 PMOS drain conductor 741.

Nanowires in transistor 733 are connected in parallel between terminals connected to the nanowire interconnect including nanowires 1123*a*, 1123*b* and 1123*c*, and a metal-0 NMOS drain conductor 743 in the metal-0 layer. Nanowires in transistor 734 are connected in parallel between terminals connected to the nanowire interconnect 1124 and a metal-0 drain conductor 744.

Figure 16:
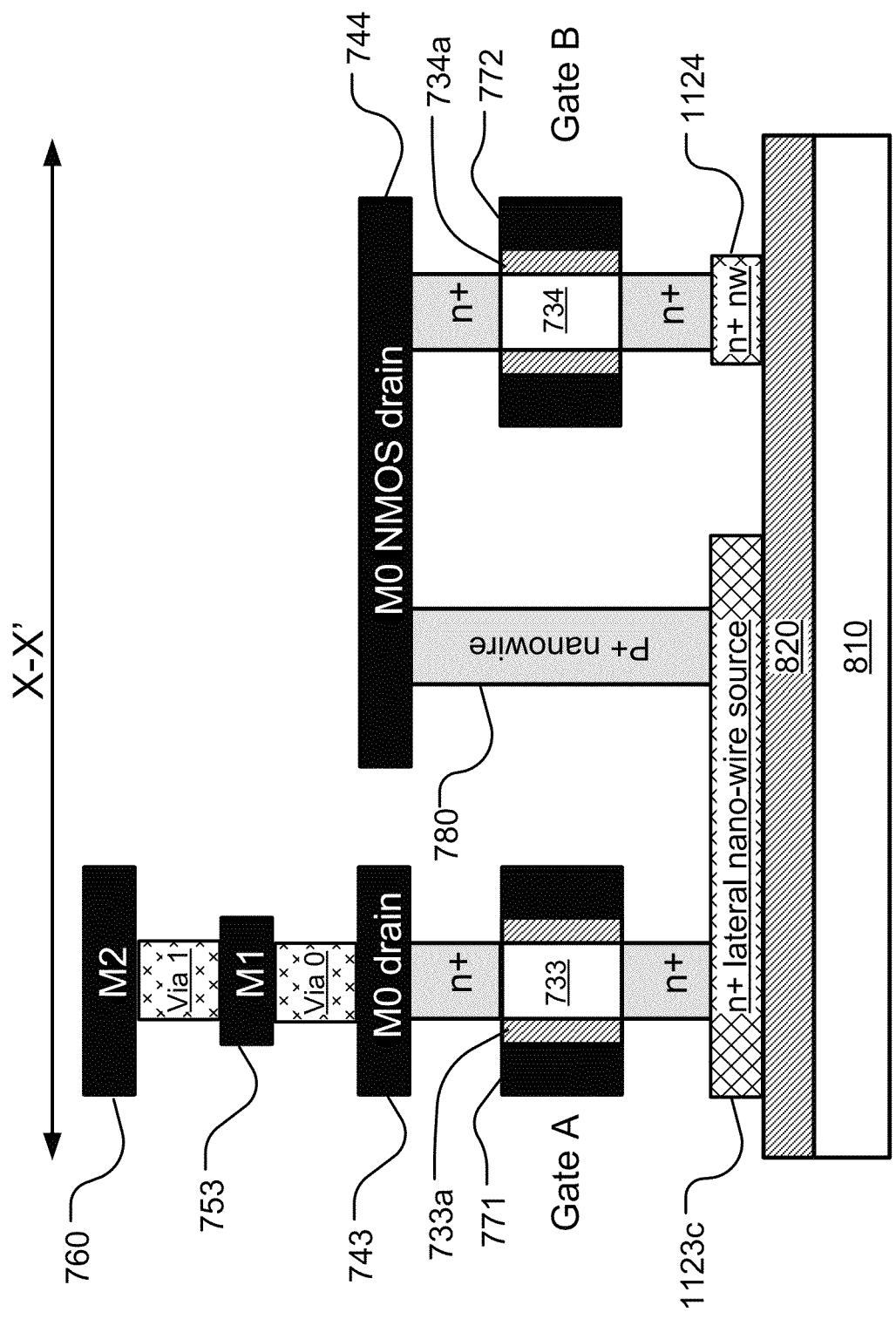
FIG. 16 is a layout diagram showing a cross-sectional view of the two-input NAND gate in FIG. 15 taken at X-X'.

FIG. 16 is a diagram showing a cross-sectional view of the two-input NAND gate in FIG. 15 taken at X-X'. Nanowires in transistor 733 are connected in parallel between terminals connected to the nanowire interconnect 1123*c* for the source of the transistor 733, and the metal-0 NMOS drain conductor 743 in the metal-0 layer. Nanowires in transistor 734 are connected in parallel between terminals connected to the nanowire interconnect 1124 for the source of the transistor 734, and the metal-0 drain conductor 744. Vertical nanowires in the nanowire interconnect 780 are connected in parallel between the nanowire interconnect 1123*c* for the source of the transistor 733, and the metal-0 NMOS drain conductor 744 of the transistor 734.

Figure 17:
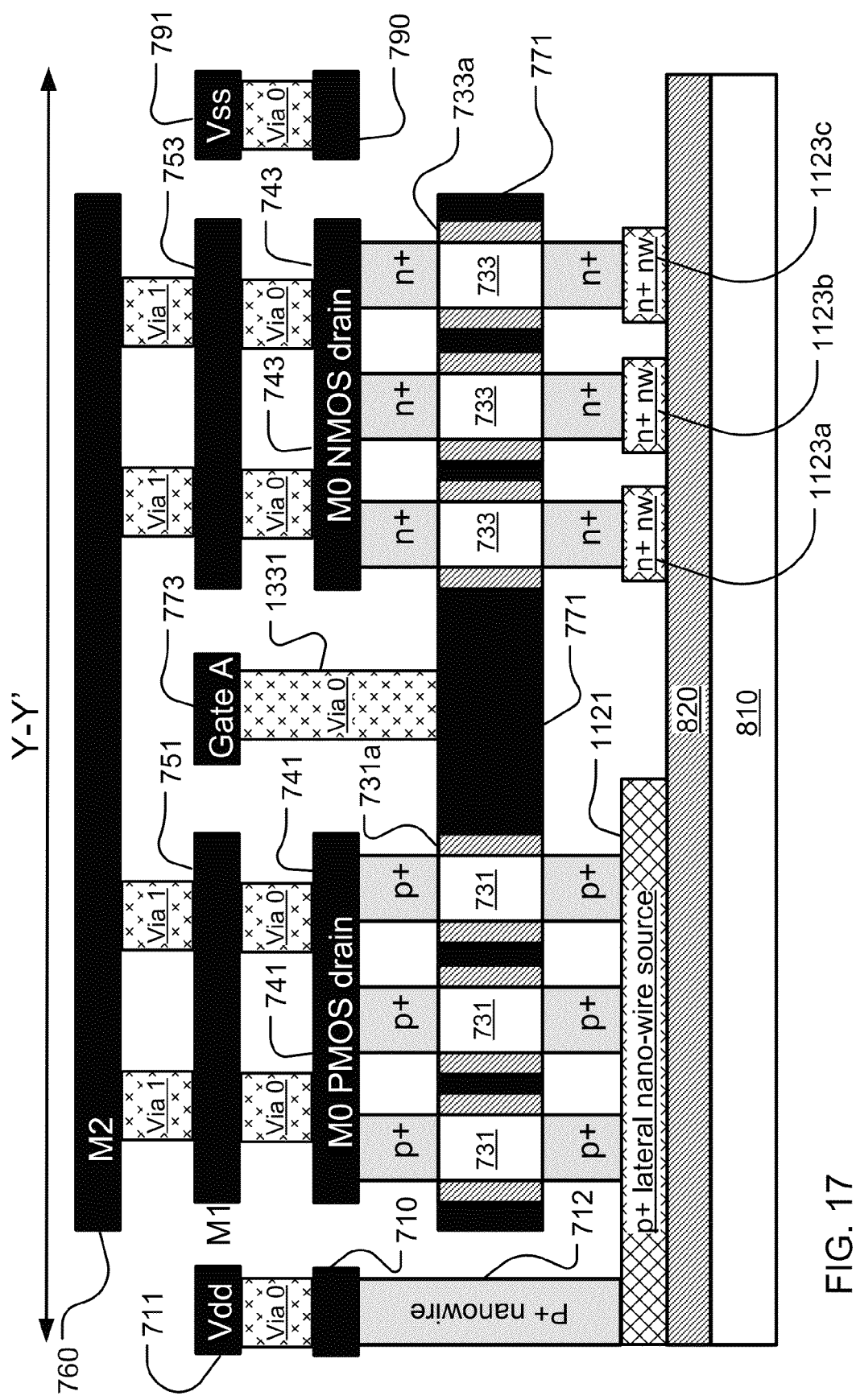
FIG. 17 is a layout diagram showing a cross-sectional view of the two-input NAND gate in FIG. 15 taken at Y-Y'.

FIG. 17 is a diagram showing a cross-sectional view of the two-input NAND gate in FIG. 15 taken at Y-Y'. Nanowires in transistor 731 are connected in parallel between terminals connected to the nanowire interconnect 1121 for the source of the transistor 731, and a metal-0 PMOS drain conductor 741 in the metal-0 layer. Nanowires in transistor 733 are connected in parallel between terminals connected to the nanowire interconnect, including nanowires 1123*a*, 1123*b* and 1123*c* for the source of transistor 733, and a metal-0 NMOS drain conductor 743 in the metal-0 layer.

Figure 18:
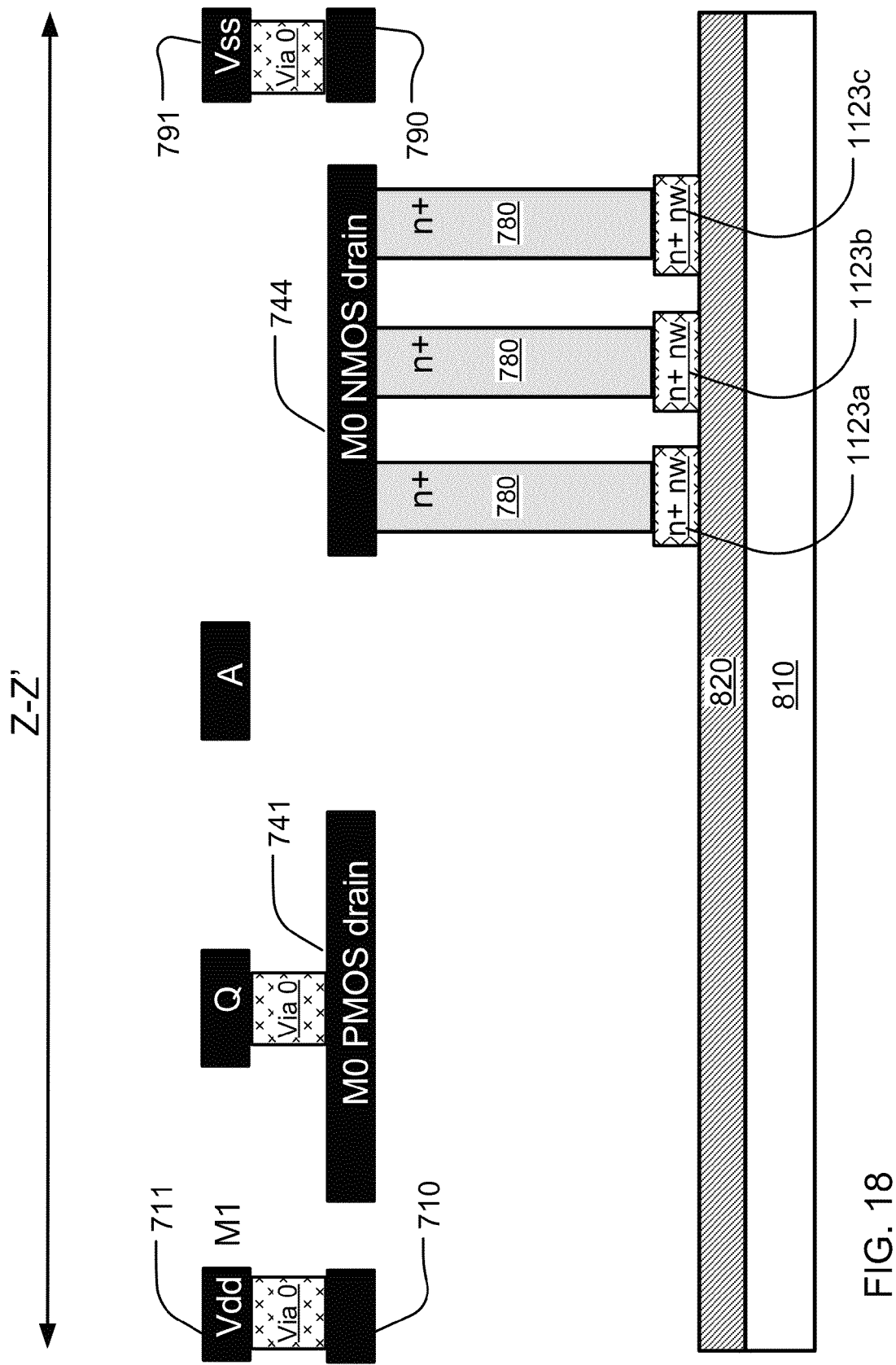
FIG. 18 is a layout diagram showing a cross-sectional view of the two-input NAND gate in FIG. 15 taken at Z-Z'.

FIG. 18 is a diagram showing a cross-sectional view of the two-input NAND gate in FIG. 15 taken at Z-Z'. A set of nanowires configured as the nanowire interconnect 780 is disposed vertically relative to the surface of the substrate. The set of nanowires is connected in parallel between the nanowires 1123*a*, 1123*b* and 1123*c* for the source of transistor 733, and the metal-0 NMOS drain conductor 744 of the transistor 734.

Alternate implementations of the nanowire circuit structures discussed herein, in general, and more specifically of the structures shown in FIGS. 11 through 18, can use 2D material strips in place of the nanowires.

Figure 19:
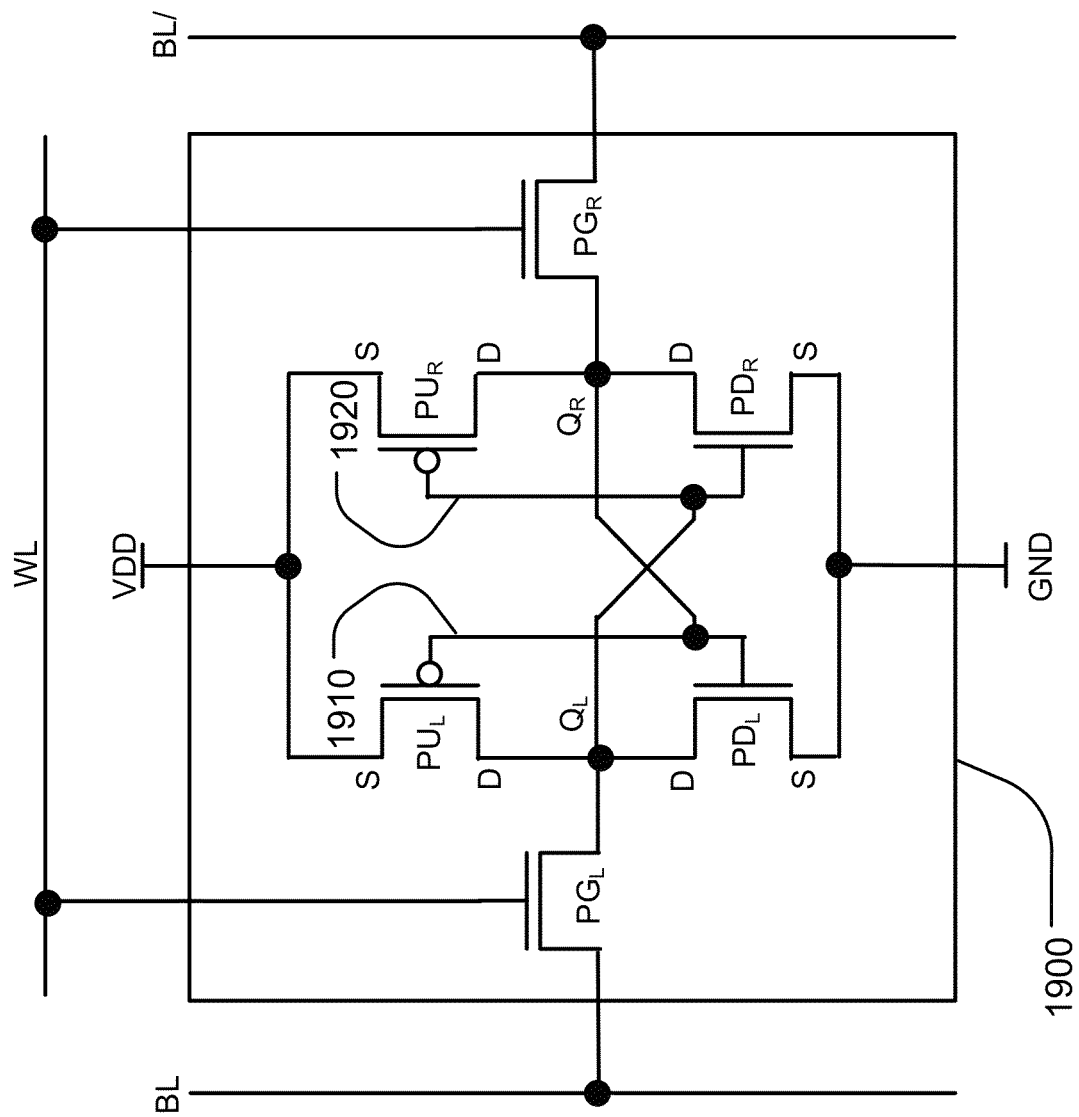
FIG. 19 illustrates a transistor level schematic for an SRAM cell.

FIG. 19 illustrates a transistor level schematic for an SRAM (static random access memory) cell. An SRAM cell as referred to in the present specification is a memory cell that does not need to be periodically refreshed to retain stored data.

As illustrated in the example of FIG. 19, an SRAM cell 1900 uses a pair of cross-coupled inverters as a storage element to store a single bit of data. The pair includes a first inverter configured with a pull-down transistor $PD_L$ and a pull-up transistor $PU_L$, and a second inverter configured with a pull-down transistor $PD_R$ and a pull-up transistor $PU_R$. The first inverter has an output $Q_L$, which is connected to a gate conductor of the second inverter (e.g. 1920), at which an input signal to the second inverter is applied. The second inverter has an output $Q_R$, which is connected to a gate conductor of the first inverter (e.g. 1910), at which an input signal to the first inverter is applied. The SRAM cell includes pass gates $PG_L$ and $PG_R$ as access devices to provide a switchable data path for data into and out of the SRAM cell. A word line (WL) controls the SRAM cell for reading or writing. Complementary bit lines BL and BL/ provide the data path to the pass gates $PG_L$ and $PG_R$.

Sources of the pull-up transistors $PU_L$ and $PU_R$ are connected to the SRAM cell supply voltage (e.g. VDD), while sources of the pull-down transistors $PD_L$ and $PD_R$ are connected to the SRAM cell ground voltage (e.g. GND). Drains of the pull-up transistor $PU_L$ and pull-down transistor $PD_L$ are connected together and to the output $Q_L$ of the first inverter. The pass gate $PG_L$ is connected between the output $Q_L$ of the first inverter and the bit line BL. A gate terminal of the pass gate $PG_L$ is connected to the word line WL. Drains of the pull-up transistor $PU_R$ and pull-down transistor $PD_R$ are connected together and to the output $Q_R$ of the second inverter. The pass gate $PG_R$ is connected between the output $Q_R$ of the second inverter and the bit line BL/. A gate terminal of the pass gate $PG_R$ is connected to the word line WL.

For the simplified description below about the read and write operations of an SRAM cell, it is assumed that a high data value stored in the SRAM cell corresponds to a state when the output $Q_L$ of the first inverter is at a high data value and the output $Q_R$ of the second inverter is at a low data value. At the beginning of a read or write operation, the word line WL selects the SRAM cell by turning on the pass gates $PG_L$ and $PG_R$. At the end of the read or write operation, the word line WL deselects the SRAM cell by turning off the pass gates $PG_L$ and $PG_R$.

In a write operation, a voltage corresponding to a low data value is applied to one of BL and BL/, while a voltage corresponding to a high data value is applied to another of BL and BL/, to change the state of the storage element. For instance, to write a high data value, a voltage corresponding to a high data value is applied to the bit line BL, while a voltage corresponding to a low data value is applied to the bit line BL/. To write a low data value, a voltage corresponding to a low data value is applied to the bit line BL, while a voltage corresponding to a high data value is applied to the bit line BL/.

When a high data value is stored in the SRAM cell, in the first inverter, the pull-down transistor $PD_L$ is turned off and the pull-up transistor $PU_L$ is turned on so that output $Q_L$ exhibits a high data value while, in the second inverter, the pull-down transistor $PD_R$ is turned on and the pull-up transistor $PU_R$ is turned off so that output $Q_R$ exhibits a low data value. When a low data value is stored in the SRAM cell, in the first inverter, the pull-down transistor $PD_L$ is turned on and the pull-up transistor $PU_L$ is turned off so that output $Q_L$ exhibits a low data value while, in the second inverter, the pull-down transistor $PD_R$ is turned off and the pull-up transistor $PU_R$ is turned on so that output $Q_R$ exhibits a high data value.

In a read operation, a voltage corresponding to a high data value is applied to the bit lines BL and BL/, and the SRAM cell is selected by the word line WL. If a high data value is stored in the SRAM cell, current flows through the pass gate $PG_R$ and the pull-down transistor $PD_R$ to ground, and through the pull-up transistor $PU_L$ and the pass gate $PG_L$ to the bit line BL. If a low data value is stored in the SRAM cell, current flows through the pull-down transistor $PD_R$ and the pass gate $PG_R$ to the bit line BL/, and through the pass gate $PG_L$ and the pull-down transistor $PD_L$ to ground.

Figures 20, 20A:
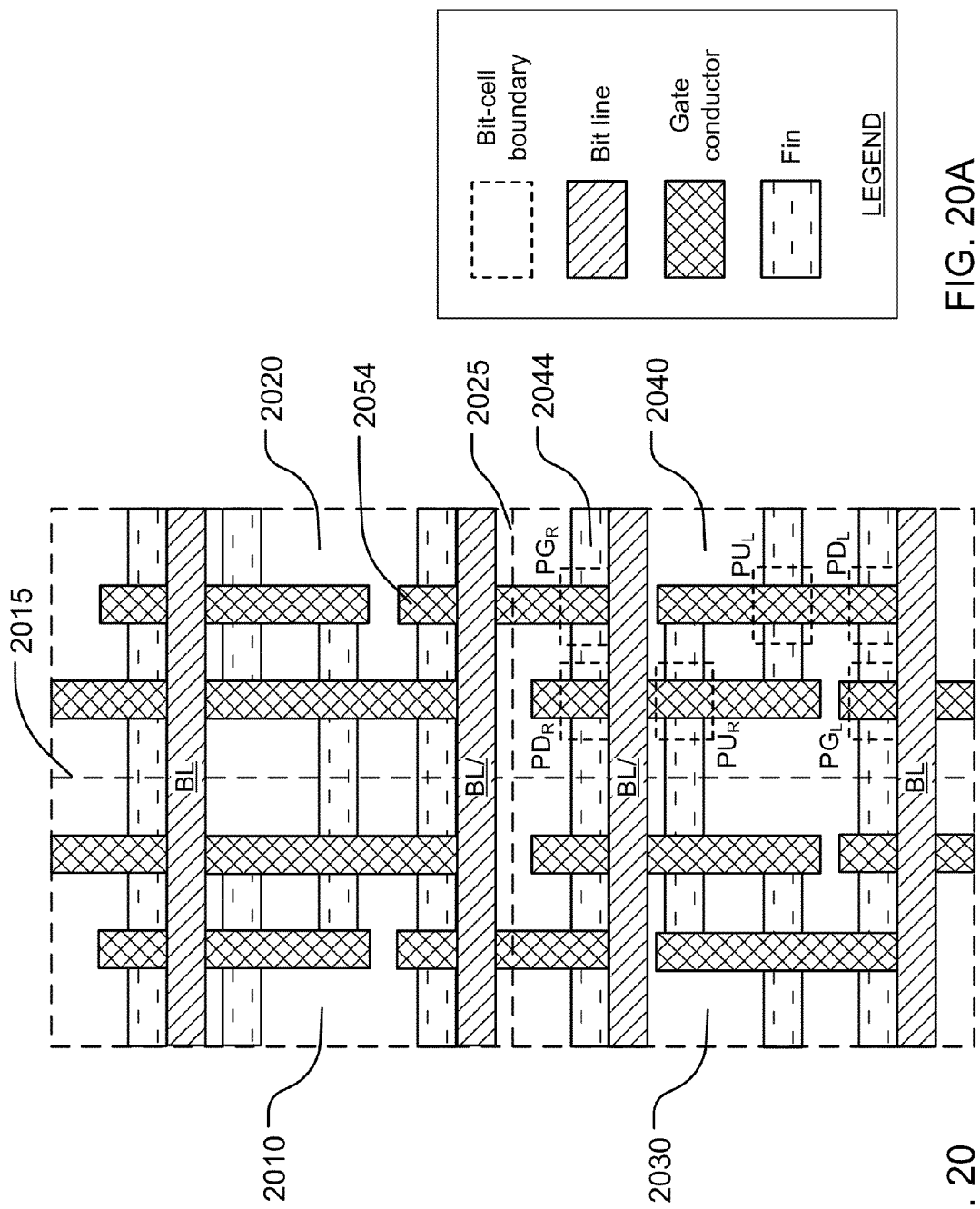
FIG. 20 is a simplified layout diagram showing a top view of four SRAM cells, utilizing fins as the channel structure for transistors.
FIG. 20A is a legend applicable to FIGS. 20, 21 and 21A.

FIG. 20 is a simplified layout diagram showing a top view of four SRAM cells, utilizing fins as the channel structure for transistors. FIG. 20A is a legend applicable to FIGS. 20, 21 and 21A.

Each of the four SRAM cells stores a single bit of data. Each of the four SRAM cells implements the pull-down transistor $PD_L$ and the pull-up transistor $PU_L$ in the first inverter, the pull-down transistor $PD_R$ and the pull-up transistor $PU_R$ in the second inverter, and the pass gates $PG_L$ and $PG_R$, as described for SRAM cell 1900 in FIG. 19. With respect to a vertical line (e.g. 2015), SRAM cells 2010 and 2020 are laid out in a mirror image, and SRAM cells 2030 and 2040 are laid out in a mirror image. With respect to a horizontal line (e.g. 2025), SRAM cells 2010 and 2030 are laid out in a mirror image, and SRAM cells 2020 and 2040 are laid out in a mirror image.

Transistors $PD_L$, $PU_L$, $PD_R$, $PU_R$, $PG_L$, and $PG_R$ are implemented as finFET transistors including gate conductors (e.g. 2054) crossing fins in finFET structures, within respective bit-cell boundaries. Fins in finFET structures can be shared between adjacent SRAM cells laid out in a horizontal direction (e.g. 2030 and 2040). Gate conductors (e.g. 2054) can be shared between adjacent SRAM cells laid out in a vertical direction (e.g. 2020 and 2040). Complementary bit lines BL and BL/ can extend across adjacent SRAM cells laid out in a horizontal direction (e.g. 2010 and 2020, 2030 and 2040). The word line WL, the SRAM cell supply voltage (e.g. VDD), and the SRAM cell ground voltage (not shown) are connected to each of the four SRAM cells.

Figure 21:
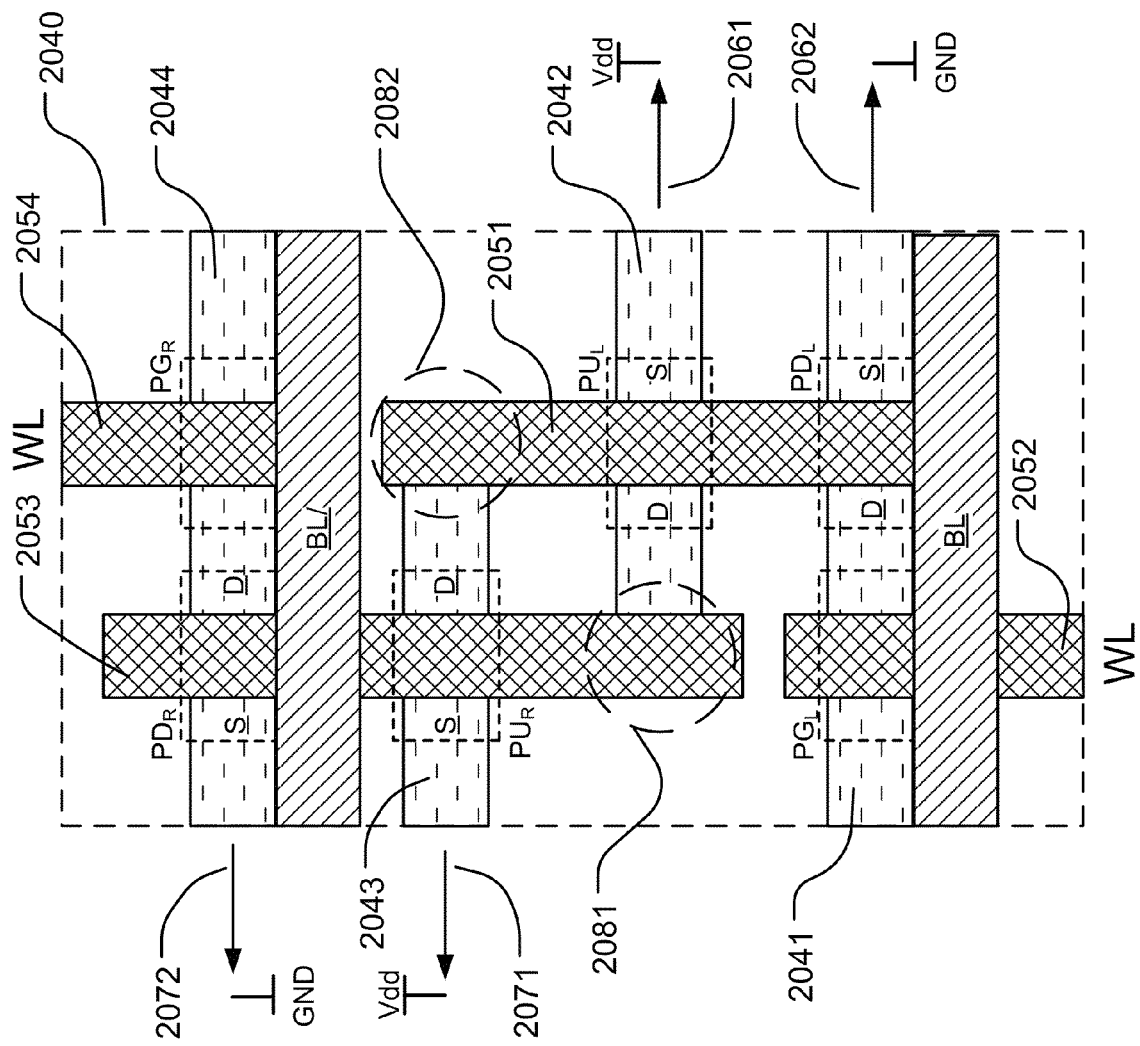
FIG. 21 is an enlarged view of one of the four SRAM cells illustrated in FIG. 20.

FIG. 21 is an enlarged view of the SRAM cell 2040 illustrated in FIG. 20, showing more details. For the first inverter, the pull-up transistor $PU_L$ is laid out using a fin 2042 and a gate conductor 2051. The pull-up transistor $PU_L$ has a source terminal coupled to the SRAM cell supply voltage (e.g. VDD) via a connection 2061 including metal conductors in one or more metal layers. The pull-down transistor $PD_L$ is laid out using a fin 2041 and the gate conductor 2051. The pull-down transistor $PD_L$ has a source terminal coupled to the SRAM cell ground voltage (e.g. GND) via a connection 2062 including metal conductors in one or more metal layers. The pass gate $PG_L$ is laid out using the fin 2041 and a gate conductor 2052. A gate terminal of the pass gate $PG_L$ is connected to the word line WL. Drains of the pull-up transistor $PU_L$ and the pull-down transistor $PD_L$ are coupled together via a connection (not shown) that can include metal conductors in one or more metal layers. The pass gate $PG_L$ provides a path between drains of the pull-up transistor $PU_L$ and the pull-down transistor $PD_L$, and the bit line BL through a BL pick-up point (not shown).

For the second inverter, the pull-up transistor $PU_R$ is laid out using a fin 2043 and a gate conductor 2053. The pull-up transistor $PU_R$ has a source terminal coupled to the SRAM cell supply voltage (e.g. VDD) via a connection 2071 including metal conductors in one or more metal layers. The pull-down transistor $PD_R$ is laid out using a fin 2044 and the gate conductor 2053. The pull-down transistor $PD_R$ has a source terminal coupled to the SRAM cell ground voltage (e.g. GND) via a connection 2072 including metal conductors in one or more metal layers. The pass gate $PG_R$ is laid out using the fin 2044 and a gate conductor 2054. A gate terminal of the pass gate $PG_R$ is connected to the word line WL. Drains of the pull-up transistor $PU_R$ and the pull-down transistor $PD_R$ are coupled together via a connection (not shown) that can include metal conductors in one or more metal layers. The pass gate $PG_R$ provides a path between drains of the pull-up transistor $PU_R$ and the pull-down transistor $PD_R$, and the bit line BL/ through a BL/ pick-up point (not shown).

At location 2081, gate conductor 2053 of the second inverter is coupled to the drain of the pull-up transistor $PU_L$ in the first inverter and, at location 2082, gate conductor 2051 of the first inverter is coupled to the drain of the pull-up transistor $PU_R$ in the second inverter, such that the first inverter and the second inverter are cross-coupled.

The stability of an SRAM cell can be characterized by parameters such as the static noise margin (SNM), the write noise margin (WNM), and the read noise margin (RNM) of the SRAM cell. The static noise margin is sensitive to and dependent on the ratio of the width of the pull-down transistors ($W_{PD}$) to the width of the pass gates ($W_{PG}$). The ratio is referred to as $\beta = W_{PD}/W_{PG}$. The write noise margin is sensitive to and dependent on the ratio of the width of the pass gates ($W_{PG}$) to the width of the pull-up transistors ($W_{PU}$). The ratio is referred to as $\gamma = W_{PG}/W_{PU}$. The read noise margin is sensitive to and dependent on the ratio of the width of the pull-down transistors ($W_{PD}$) to the width of the pull-up transistors ($W_{PU}$). The ratio is referred to as $\alpha = W_{PD}/W_{PU}$. For a fixed SRAM cell area, optimizing those parameters can determine the overall characteristics of the SRAM cell.

However, the width of the pull-down transistors ($W_{PD}$), the width of the pass gates ($W_{PG}$), and the width of the pull-up transistors ($W_{PU}$) are determined by the number and the width of fins in finFET structures used to implement the transistors. For a given technology, the width of a fin is quantized so that $\beta$ values are practically confined to $\beta=1$ and $\beta=2$, making finer granularity difficult to implement.

Characteristics of individual transistors in an SRAM cell utilizing FinFETs, such as SNM, WNM and RNM, can be adjusted by increasing or decreasing the number of identical fins utilized in parallel as the channel structure for a given transistor. For instance, the write noise margin and the read noise margin (of an SRAM can be adjusted by doubling the width of fins in the pass gates and pull-down transistors of an SRAM cell, respectively. Similarly, in a "$\beta=1$" SRAM cell, transistors can be laid out using a single fin for each transistor. In a "$\beta=2$" SRAM cell, a pull-down transistor can be laid out using two identical fins connected in parallel for each pull-down transistor while a pass gate connected to the pull-down transistor is laid out using a single fin, to adjust the static noise margin. This provides some granularity of design in the development of an SRAM cell. However, many circuit parameters, such as SNM, WNM and RNM, can benefit from finer tuning of circuit structures.

Figure 21A:
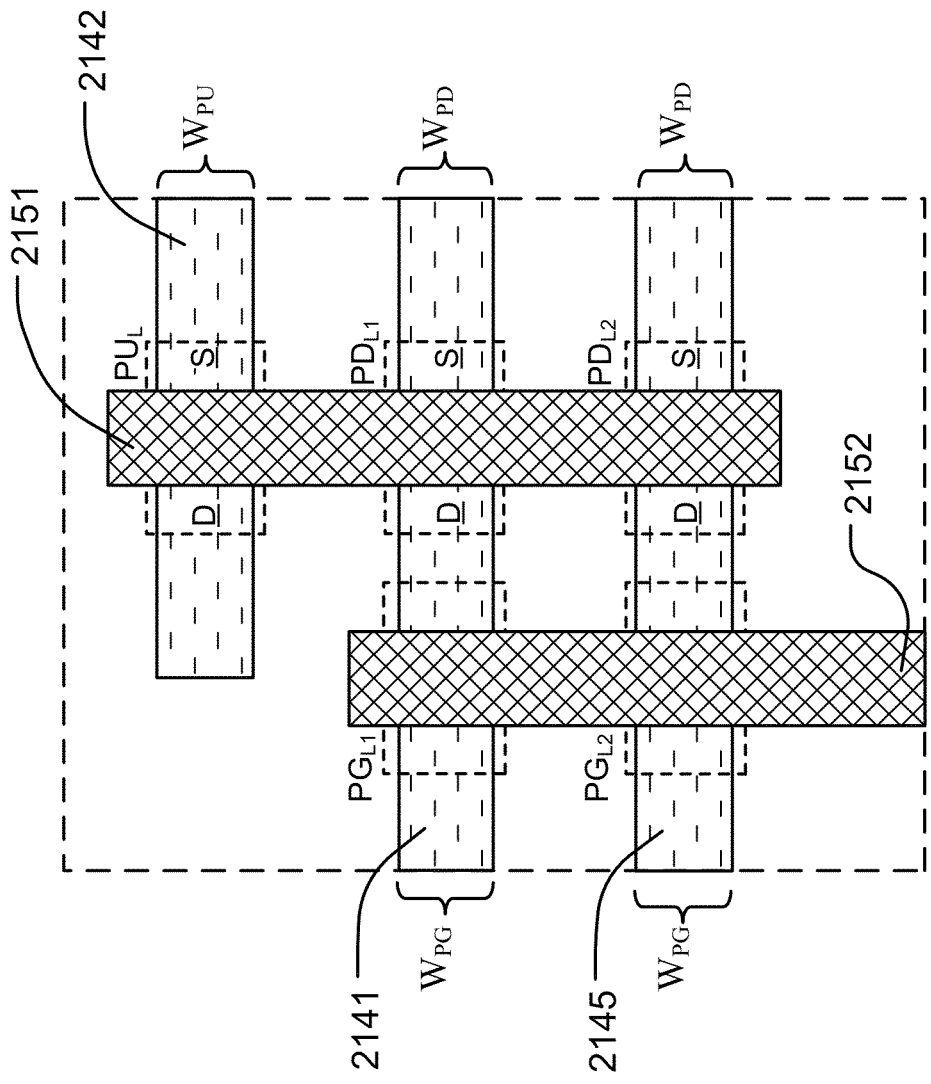
FIG. 21A is a simplified layout diagram showing a top view of an SRAM cell with $\gamma=2$ and $\alpha=2$.

FIG. 21A is a simplified layout diagram showing a top view of an SRAM cell with $\gamma=2$ and $\alpha=2$. A pull-up transistor $PU_L$ is laid out using a fin 2142 and a gate conductor 2151. A first pull-down transistor $PD_{L1}$ is laid out using a fin 2141 and the gate conductor 2151. A second pull-down transistor $PD_{L2}$ is laid out using a fin 2145 and the gate conductor 2151. A first pass gate $PG_{L1}$ is laid out using the fin 2141 and a gate conductor 2152. A second pass gate $PG_{L2}$ is laid out using the fin 2145 and the gate conductor 2152. Assuming the widths $W_{PU}$, $W_{PD}$, and $W_{PG}$ of the fins have the same minimum cross-sectional dimension, consequently $\gamma = W_{PG}/W_{PU} = 2$ and $\alpha = W_{PD}/W_{PU} = 2$.

Figures 22, 22A:
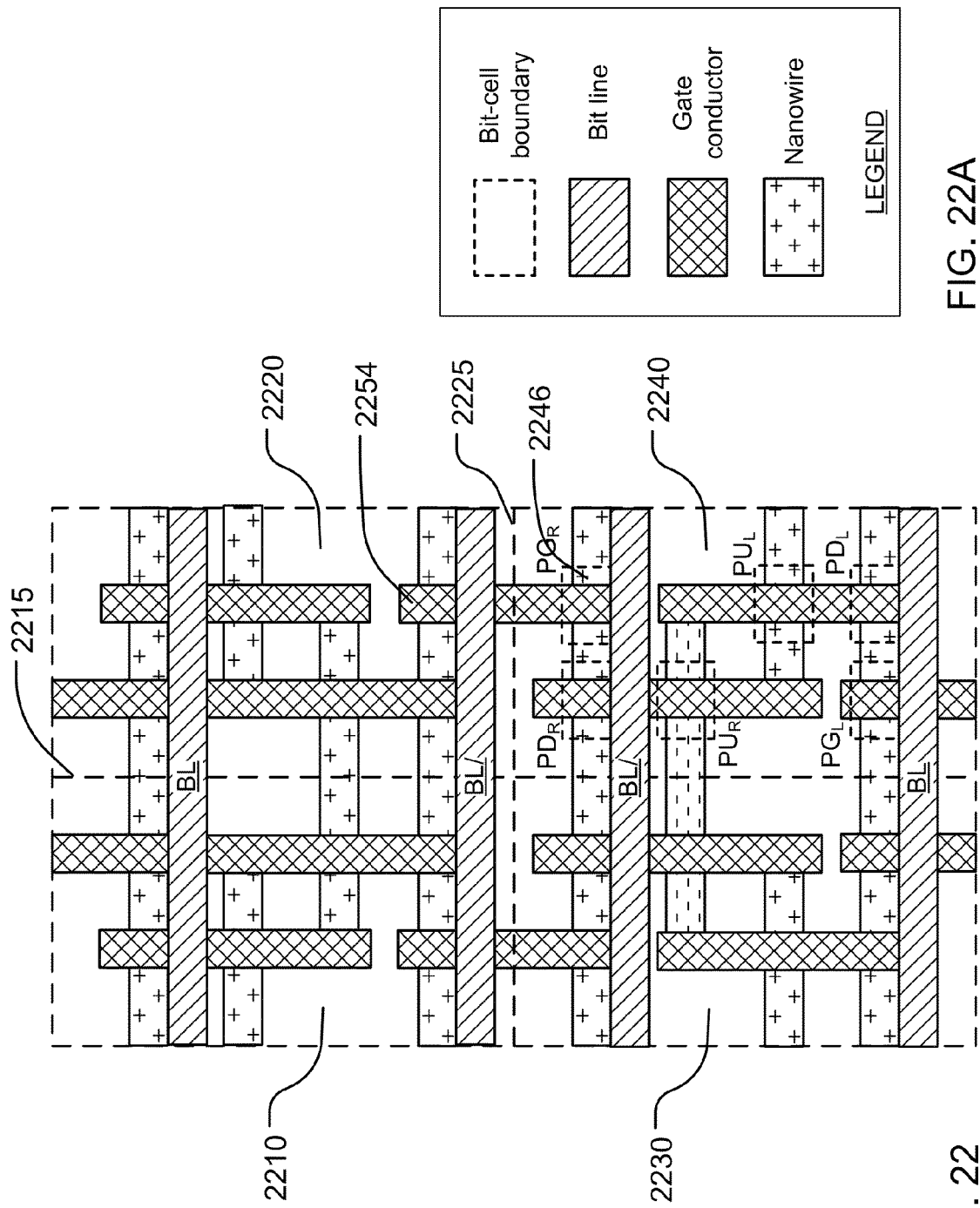
FIG. 22 is a simplified layout diagram showing a top view of four SRAM cells, utilizing nanowires as the channel structure for transistors.
FIG. 22A is a legend applicable to FIGS. 22 and 23.

FIG. 22 is a simplified layout diagram showing a top view of four SRAM cells, utilizing sets of nanowires as the channel structure for transistors. FIG. 22A is a legend applicable to FIGS. 22 and 23.

Each of the four SRAM cells stores a single bit of data. Each of the four SRAM cells implements the pull-down transistor $PD_L$ and the pull-up transistor $PU_L$ in the first inverter, the pull-down transistor $PD_R$ and the pull-up transistor $PU_R$ in the second inverter, and the pass gates $PG_L$ and $PG_R$, as described for SRAM cell 1900 in FIG. 19. With respect to a vertical line (e.g. 2215), SRAM cells 2210 and 2220 are laid out in a mirror image, and SRAM cells 2230 and 2240 are laid out in a mirror image. With respect to a horizontal line (e.g. 2225), SRAM cells 2210 and 2230 are laid out in a mirror image, and SRAM cells 2220 and 2240 are laid out in a mirror image.

Transistors $PD_L$, $PU_L$, $PD_R$, $PU_R$, $PG_L$, and $PG_R$ are implemented as nanowire transistors including gate conductors (e.g. 2254) crossing sets of nanowires (e.g. 2246), within respective bit-cell boundaries. Sets of nanowires (e.g. 2246) can be shared between adjacent SRAM cells laid out in a horizontal direction (e.g. 2230 and 2240). Gate conductors (e.g. 2254) can be shared between adjacent SRAM cells laid out in a vertical direction (e.g. 2220 and 2240). Complementary bit lines BL and BL/ can extend across adjacent SRAM cells laid out in a horizontal direction (e.g. 2210 and 2220, 2230 and 2240). The word line WL, the SRAM cell supply voltage (e.g. VDD), and the SRAM cell ground voltage (not shown) are connected to each of the four SRAM cells.

Figure 23:
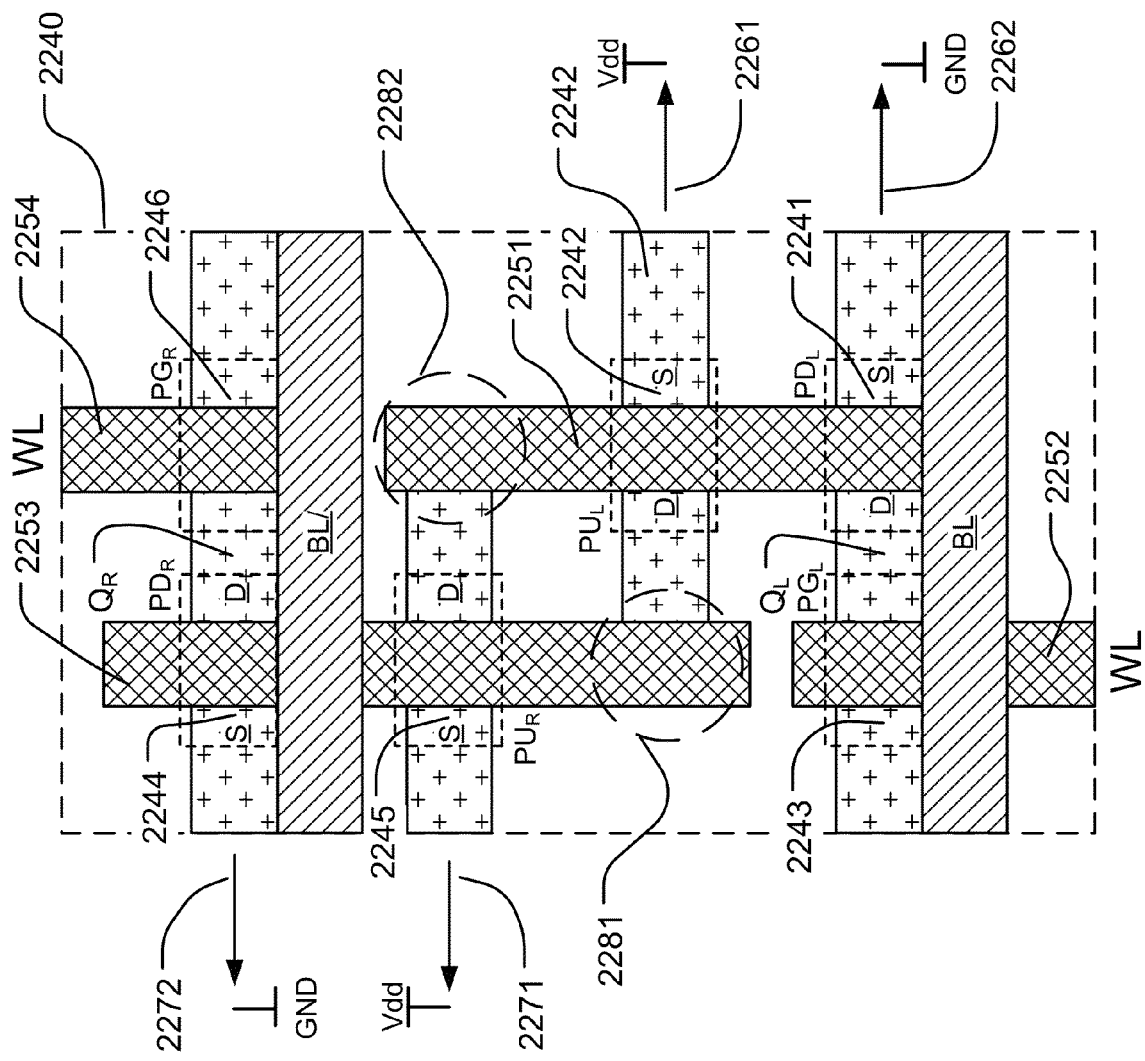
FIG. 23 is an enlarged view of one of the four SRAM cells illustrated in FIG. 22.

FIG. 23 is an enlarged view of the SRAM cell 2240 illustrated in FIG. 22, showing more details. For the first inverter, the pull-down transistor $PD_L$ includes a first set of nanowires 2241 disposed horizontally relative to the surface of the substrate, and connected in parallel between a source terminal (e.g. S of $PD_L$) which in turn is connected to the SRAM cell ground voltage (e.g. GND) via a connection 2262 including metal conductors in one or more metal layers, and a drain terminal (e.g. D of $PD_L$) which in turn is connected to the output $Q_L$ of the first inverter.

The pull-up transistor $PU_L$ includes a second set of nanowires 2242 disposed horizontally relative to the surface of the substrate, and connected in parallel between a drain terminal (e.g. D of $PU_L$) which in turn is connected to the output $Q_L$ of the first inverter, and a source terminal (e.g. S of $PU_L$) which in turn is connected to the SRAM cell supply voltage (e.g. VDD) via a connection 2261 including metal conductors in one or more metal layers. Drains of the pull-up transistor $PU_L$ and the pull-down transistor $PD_L$ are coupled together via a connection (not shown) than can include metal conductors in one or more metal layers.

The pass gate $PG_L$ includes a third set of nanowires 2243 disposed horizontally relative to the surface of the substrate, and connected in parallel between a first terminal which in turn is connected to the output $Q_L$ of the first inverter, and a second terminal which in turn is connected to the bit line BL through a BL pick-up point (not shown).

A first gate conductor 2251 crosses the nanowire or nanowires in the first set of nanowires between source and drain terminals of the pull-down transistor $PD_L$, and crossing the nanowire or nanowires in the second set of nanowires between the source and drain terminals of the pull-up transistor $PU_L$. A second gate conductor 2252 crosses the nanowire or nanowires in the third set of nanowires between terminals of the pass gate $PG_L$.

For the second inverter, the pull-down transistor $PD_R$ includes a fourth set of nanowires 2244 disposed horizontally relative to the surface of the substrate, and connected in parallel between a source terminal (e.g. S of $PD_R$) which in turn is connected to the SRAM cell ground voltage (e.g. GND) via a connection 2272 including metal conductors in one or more metal layers, and a drain terminal (e.g. D of $PD_R$) which in turn is connected to the output $Q_R$ of the second inverter.

The pull-up transistor $PU_R$ includes a fifth set of nanowires 2245 disposed horizontally relative to the surface of the substrate, and connected in parallel between a drain terminal (e.g. D of $PU_R$) which in turn is connected to the output $Q_R$ of the second inverter, and a source terminal (e.g. S of $PU_R$) which in turn is connected to the SRAM cell supply voltage (e.g. VDD) via a connection 2271 including metal conductors in one or more metal layers. Drains of the pull-up transistor $PU_R$ and the pull-down transistor $PD_R$ are coupled together via a connection (not shown) than can include metal conductors in one or more metal layers.

The pass gate $PG_R$ includes a sixth set of nanowires 2246 disposed horizontally relative to the surface of the substrate, and connected in parallel between a first terminal which in turn is connected to the output $Q_R$ of the second inverter, and a second terminal which in turn is connected to the bit line BL/ through a BL/ pick-up point (not shown).

A third gate conductor 2253 crosses the nanowire or nanowires in the fourth set of nanowires between source and drain terminals of the pull-down transistor $PD_R$, and crossing the nanowire or nanowires in the fifth set of nanowires between the source and drain terminals of the pull-up transistor $PU_R$. A fourth gate conductor 2254 crosses the nanowire or nanowires in the sixth set of nanowires between terminals of the pass gate $PG_R$.

At location 2281, the third gate conductor 2253 of the second inverter is coupled to the drain of the pull-up transistor $PU_L$ in the first inverter, and at location 2282, the first gate conductor 2251 of the first inverter is coupled to the drain of the pull-up transistor $PU_R$ in the second inverter, such that the first inverter and the second inverter are cross-coupled.

Figure 24:
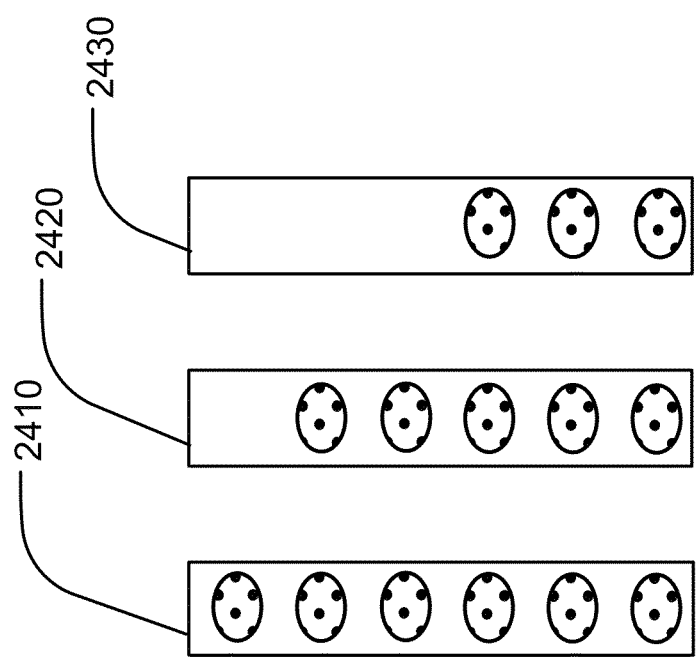
FIG. 24 illustrates sets of nanowires having different example numbers of nanowires.

FIG. 24 illustrates sets of nanowires having different example numbers of nanowires, that can be used in SRAM cells that utilize nanowires as the channel structure for transistors, as described in connection with FIGS. 22 and 23. For instance, sets 2410, 2420 and 2430 have 6, 5 and 3 nanowires, respectively.

For instance, for fine-tuning the read noise margin, the first set of nanowires as used in the pull-down transistor $PD_L$ can include a first number of nanowires, and the second set of nanowires as used in the pull-up transistor $PU_L$ can include a second number of nanowires, where the second number can be different than the first number. The fourth set of nanowires as used in the pull-down transistor $PD_R$ can include a first number of nanowires, and the fifth set of nanowires as used in the pull-up transistor $PU_R$ can include a second number of nanowires, where the second number can be different than the first number.

For instance, for fine tuning the static noise margin, the first set of nanowires as used in the pull-down transistor $PD_L$ can include a first number of nanowires, and the third set of nanowires as used in the pass gate $PG_L$ can include a second number of nanowires, where the second number can be different than the first number. The fourth set of nanowires as used in the pull-down transistor $PD_R$ can include a first number of nanowires, and the sixth set of nanowires as used in the pass gate $PG_R$ can include a second number of nanowires, where the second number can be different than the first number.

For instance, for fine tuning the write noise margin, the second set of nanowires as used in the pull-up transistor $PU_L$ can include a first number of nanowires, and the third set of nanowires as used in the pass gate $PG_L$ can include a second number of nanowires, where the second number can be different than the first number. The fifth set of nanowires as used in the pull-up transistor $PU_R$ can include a first number of nanowires, and the fifth set of nanowires as used in the pass gate $PG_R$ can include a second number of nanowires, where the second number can be different than the first number.

Nanowires in the first, second, third, fourth, fifth and sixth sets have a height and a width orthogonal to a longitudinal axis of the nanowire, at a cross point of the corresponding gate conductor and the nanowire, and the width is equal to or greater than two times the height.

High performance SRAM cells can be configured by increasing the number of nanowires in stacks of nanowires in the same area as high density SRAM cells configured with fewer number of nanowires in each stack of nanowires.

Figures 25, 25A:
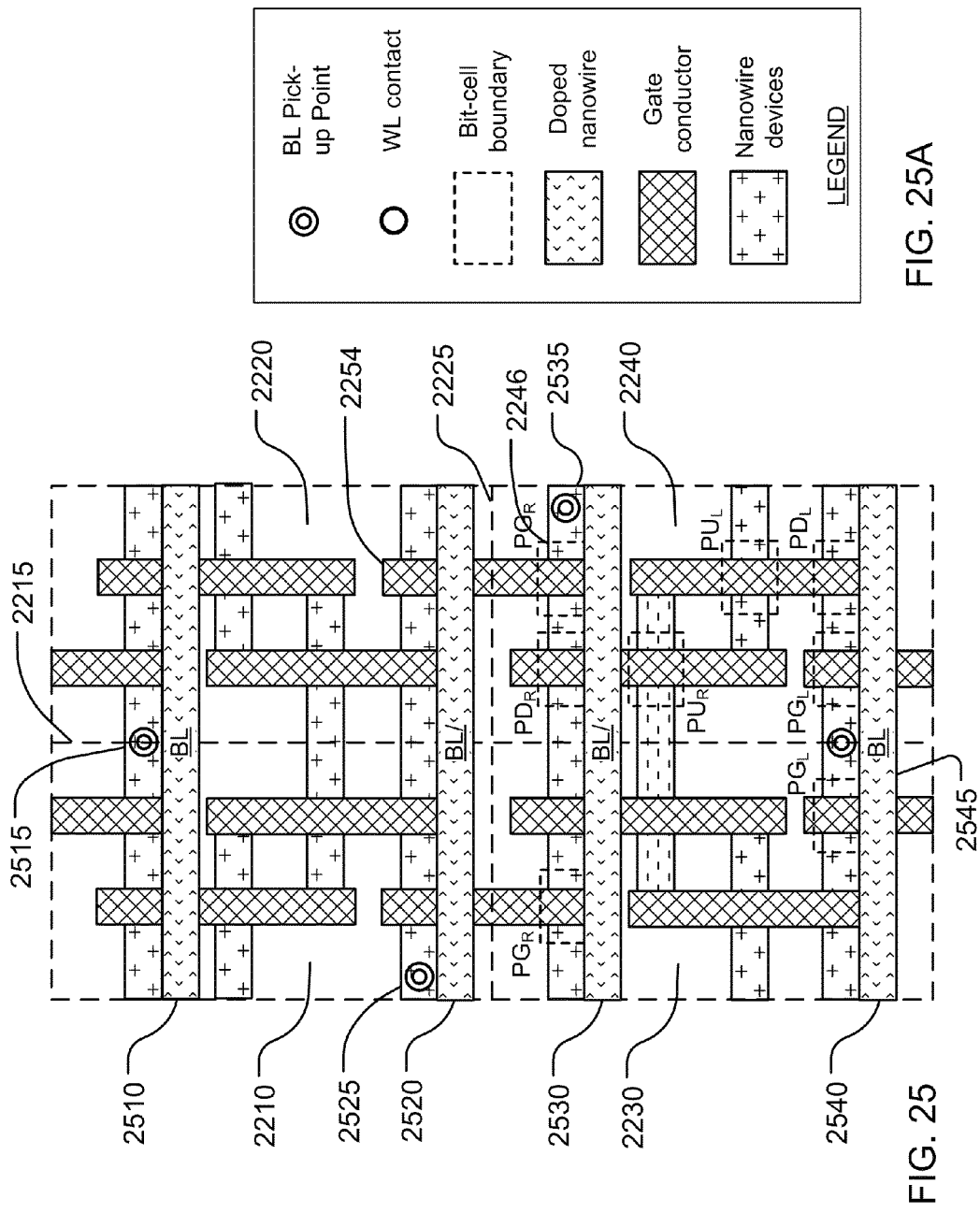
FIG. 25 is a simplified layout diagram showing a top view of four SRAM cells, utilizing conductors including a plurality of nanowires configured as bit lines.
FIG. 25A is a legend applicable to FIGS. 25, 26 and 27.

FIG. 25 is a simplified layout diagram showing a top view of four SRAM cells, utilizing conductors including a plurality of nanowires configured as bit lines. FIG. 25A is a legend applicable to FIGS. 25, 26 and 27. Like elements in FIG. 25 are commonly referred to with like reference numerals in FIG. 22.

Like elements in FIG. 25 that are described in FIG. 22 include the pull-down transistor $PD_L$ and the pull-up transistor $PU_L$ in the first inverter, the pull-down transistor $PD_R$ and the pull-up transistor $PU_R$ in the second inverter, and the pass gates $PG_L$ and $PG_R$, in each of the four SRAM cells. Like elements also include sets of nanowires (e.g. 2246) configured as the channel structure for transistors, and gate conductors (e.g. 2254) crossing the sets of nanowires. The word line WL, the SRAM cell supply voltage (e.g. VDD), and the SRAM cell ground voltage (not shown) are connected to each of the four SRAM cells. Description about the like elements is not repeated for FIG. 25.

A conductor including a plurality of nanowires configured in parallel can connect interconnect terminals of the SRAM cells. The plurality of nanowires can include segments disposed horizontally relative to the surface of the substrate. The plurality of nanowires can include nanowires disposed in a stack having a number of layers. The plurality of nanowires can include nanowires disposed in a plurality of stacks.

Nanowires in the conductor can be heavily doped. Nanowires in the plurality of nanowires include a nanowire having a minimum dimension which is less than 10 nanometers.

The conductor can be configured as complementary bit lines BL and BL/ (e.g. 2510, 2520, 2530, 2540) as illustrated in the example of FIG. 25. In particular, a pair of complementary bit lines BL and BL/ (e.g. 2510 and 2520) can extend across adjacent SRAM cells laid out in a horizontal direction (e.g. 2210 and 2220, 2230 and 2240). For a conductor configured as a bit line BL or BL/, the number of layers in a stack and the number of stacks in a plurality of stacks can be determined by the current carrying requirement of the bit line.

Interconnect terminals of SRAM cells can include a BL pick-up point (e.g. 2545) as indicated by a double circle, through which a bit line BL is connected to the pass gate $PG_L$ in the SRAM cells 2230 and 2240, and a BL/ pick-up point (e.g. 2535) through which a bit line BL/ is connected to the pass gate $PG_R$ in the SRAM cell 2240 and a horizontally adjacent SRAM cell to the right (not shown). Although in the example of FIG. 25, for clarity, the BL pick-up points and BL/ pick-up points are shown as not covered by respective bit lines BL and BL/, in actual layout, bit lines BL and BL/ can be disposed over the BL pick-up points and BL/ pick-up points.

Likewise, interconnect terminals of SRAM cells can include a BL pick-up point (e.g. 2515) through which a bit line BL is connected to the pass gate $PG_L$ in the SRAM cells 2210 and 2220, and a BL/ pick-up point (e.g. 2525) through which a bit line BL/ is connected to the pass gate $PG_R$ in the SRAM cell 2210 and a horizontally adjacent SRAM cell to the left (not shown).

Figure 26:
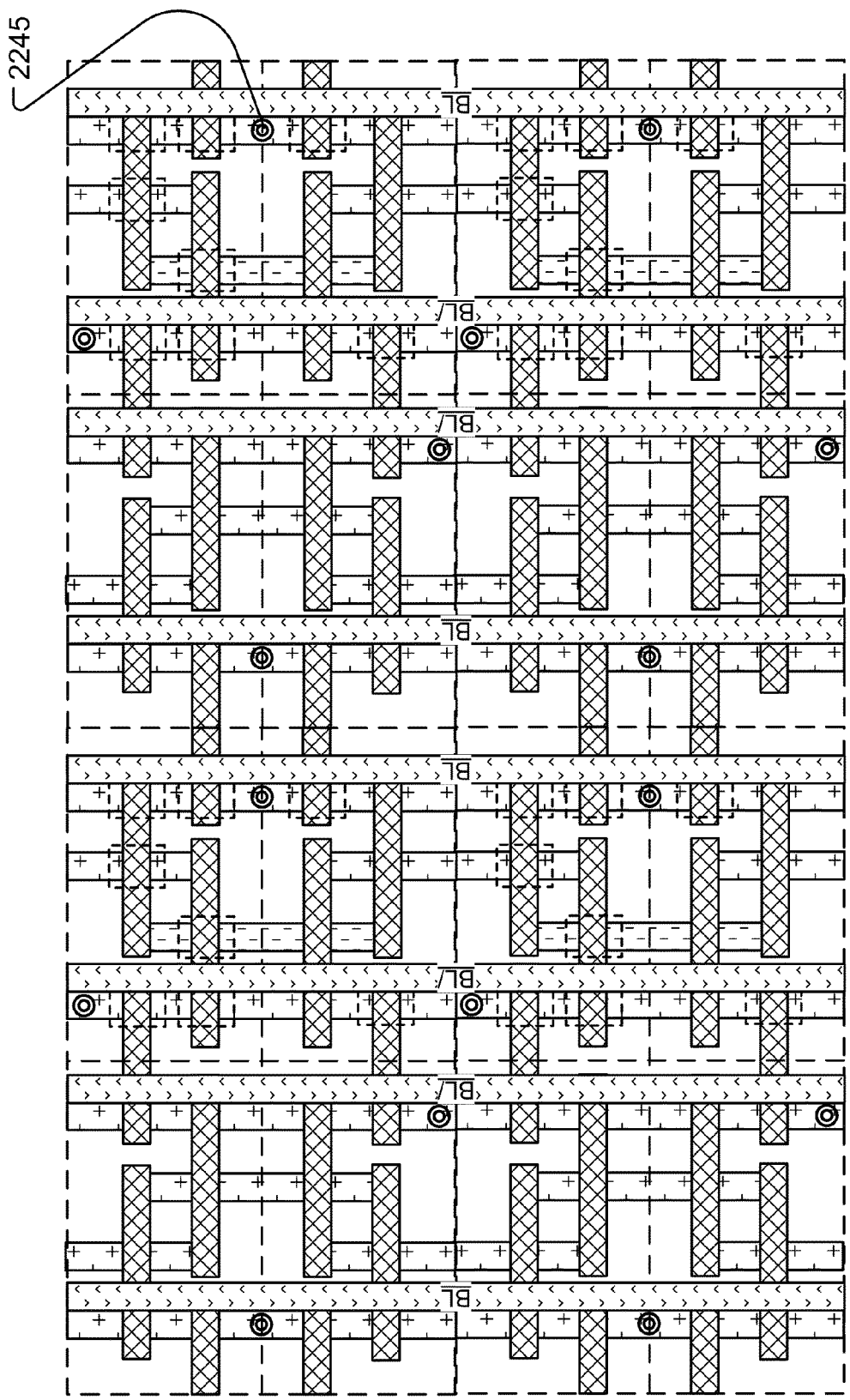
FIG. 26 is a simplified layout diagram showing a top view of sixteen SRAM cells, utilizing conductors including a plurality of nanowires configured as bit lines.

FIG. 26 is a simplified layout diagram showing a top view of sixteen SRAM cells, utilizing conductors including a plurality of nanowires configured as bit lines. The orientation of the SRAM cells in FIG. 26 is rotated 90 degrees from the SRAM cells in FIG. 25. As shown in the example of FIG. 26, bit lines BL and BL/ extend across adjacent SRAM cells in a vertical direction, and each pick-up point (e.g. 2545, FIG. 25) connects a bit line (e.g. BL) to a pass gate above (e.g. $PG_L$ in transistor 2240) and another pass gate below the pick-up point (e.g. $PG_L$ in SRAM cell 2230, FIG. 22). Although in the example of FIG. 26, for clarity, the BL pick-up points and BL/ pick-up points are shown as not covered by respective bit lines BL and BL/, in actual layout, bit lines BL and BL/ can be disposed over the BL pick-up points and BL/ pick-up points.

Figure 27:
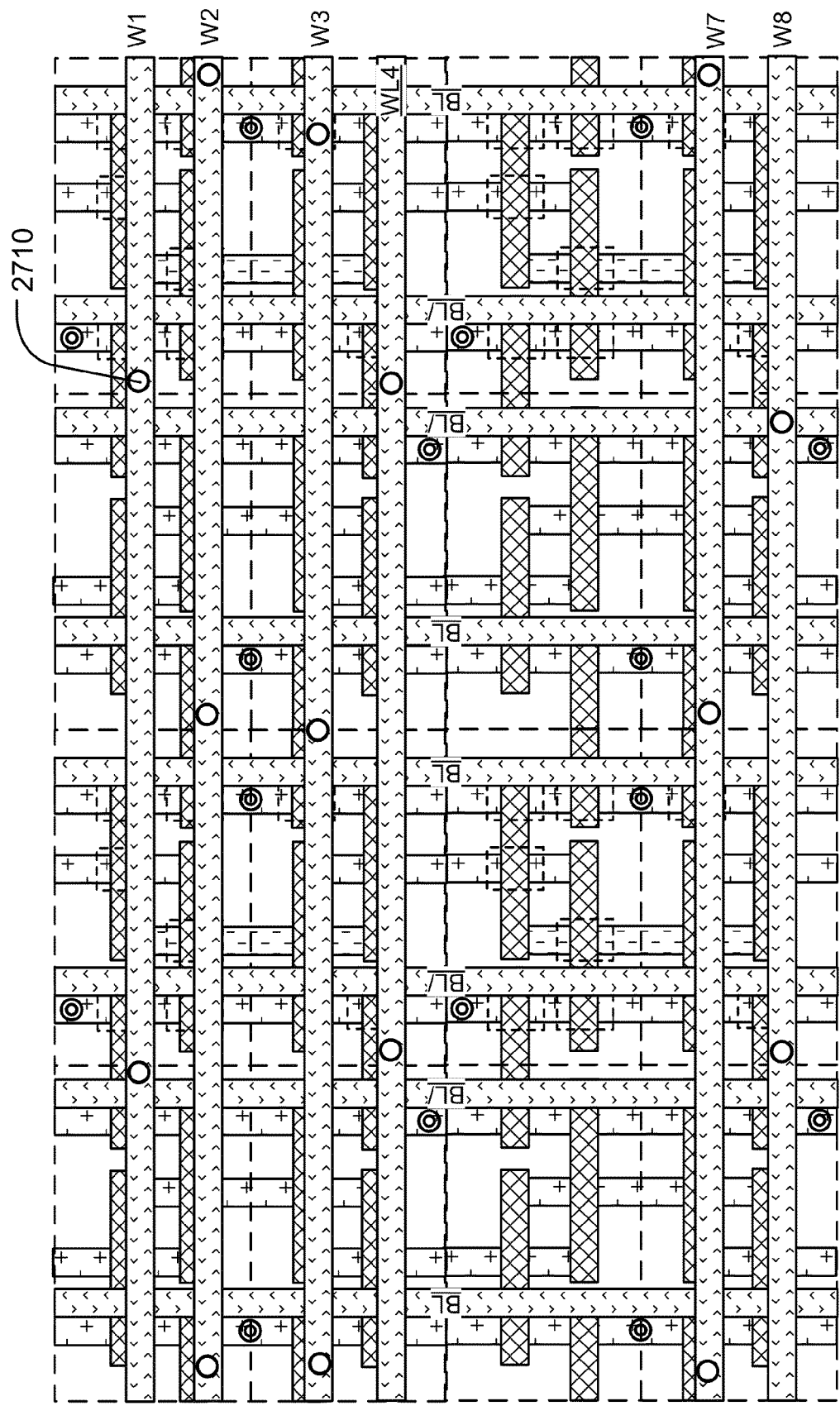
FIG. 27 is a simplified layout diagram showing a top view of sixteen SRAM cells, utilizing conductors including a plurality of nanowires configured as word lines.

FIG. 27 is a simplified layout diagram showing a top view of sixteen SRAM cells, utilizing conductors including a plurality of nanowires configured as word lines. The orientation of the SRAM cells in FIG. 27 is rotated 90 degrees from the SRAM cells in FIG. 25. As shown in the example of FIG. 27, word lines WL1, WL2, WL3, WL4, WL7 and WL8 extend across adjacent SRAM cells in a horizontal direction. WL5 and WL6 are not shown to expose the structure under the word lines. A contact (e.g. 2710), as indicated by a single circle on a word line, connects a word line (e.g. WL1) to a gate conductor (e.g. 2254, FIG. 22) which in turn is connected to the gate of a pass gate (e.g. $PG_R$, in SRAM cell 2240, FIG. 22).

Figure 28A:
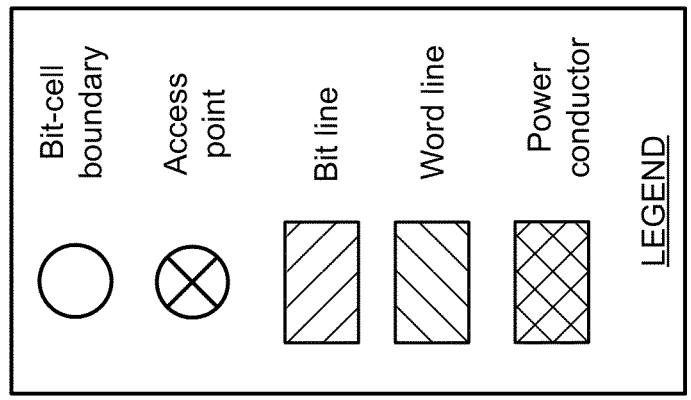
FIG. 28A is a legend applicable to FIG. 28.
Figure 28:
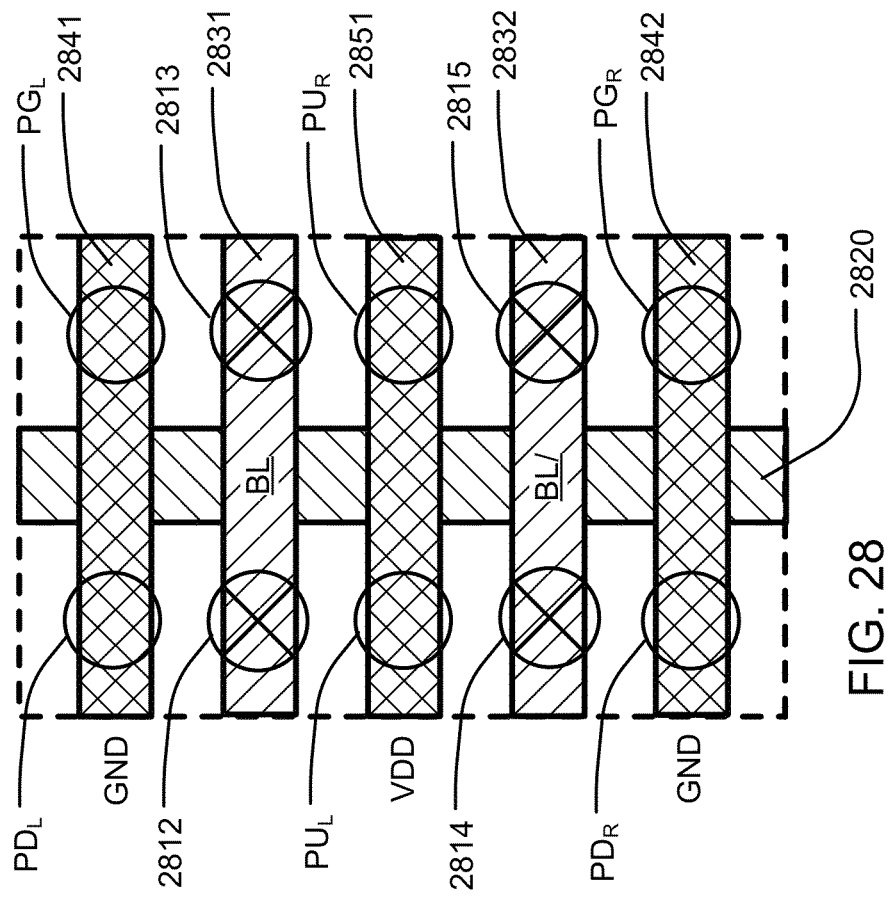
FIG. 28 is a simplified layout diagram showing a top view of an SRAM cell, utilizing vertical field effect transistors (VFETs).

FIG. 28 is a simplified layout diagram showing a top view of an SRAM cell 2800, utilizing vertical field effect transistors (VFETs). FIG. 28A is a legend applicable to FIGS. 28 and 29.

The SRAM cell stores a single bit of data. The SRAM cell includes the pull-down transistor $PD_L$ and the pull-up transistor $PU_L$ in the first inverter, the pull-down transistor $PD_R$ and the pull-up transistor $PU_R$ in the second inverter, and the pass gates $PG_L$ and $PG_R$, as described for SRAM cell 100 in FIG. 19. Transistors $PD_L$, $PU_L$, $PD_R$, $PU_R$, $PG_L$, and $PG_R$ are implemented as VFETs.

As illustrated in the example of FIG. 28, the SRAM cell is laid out in 5 tracks, from top to bottom, for a ground voltage conductor 2841, a bit line BL 2831, a supply voltage conductor 2851, a bit line BL/ 2832, and a ground voltage conductor 2842. The ground voltage conductors 2841 and 2842 are connected to transistors $PD_L$ and $PD_R$, while the supply voltage conductor 2851 is connected to transistors $PU_L$ and $PD_R$.

Access points for connecting bit lines BL and BL/ to drains of transistors through pass gates use separate tracks in addition to tracks used by the ground voltage and supply voltage conductors. Each of the access points can include a set of vertical nanowires. For instance, an access point at location 2815 connects the bit line BL/ 2832 to drains of the transistors $PD_R$ and $PU_R$ through the pass gate $PG_R$. Although only one access point (e.g. at 2815) is used to connect a bit line (e.g. BL/) in a track, the track is wasted in the sense that no vertical transistors can be disposed in the same track. Consequently, access points connected to bit lines BL and BL/ prevent 4 vertical transistors to be disposed at locations 2812, 2813, 2814 and 2815, increasing the area of an SRAM cell.

In a vertical direction perpendicular to the plane in which the top view of the layout is shown, transistors $PD_L$, $PU_L$, $PD_R$, $PU_R$, $PG_L$, and $PG_R$ implemented as VFETs are disposed between a surface and a bottom. Bit lines BL and BL/ (e.g. 2831 and 2832), ground voltage conductors (e.g. 2841, 2842), and supply voltage conductors (e.g. 2851) are disposed at the surface.

For the first inverter, bit line BL (e.g. 2831) is connected to a first terminal of the pass gate $PG_L$, drains of the transistors $PU_L$ and $PD_L$ are connected to a second terminal of the pass gate $PG_L$ at the bottom, source of the transistor $PD_L$ is connected to a ground voltage conductor (e.g. 2841), source of the transistor $PU_L$ is connected to a supply voltage conductor (e.g. 2851).

For the second inverter, bit line BL/ (e.g. 2832) is connected to a first terminal of the pass gate $PG_R$, source of the transistor $PD_R$ is connected to a ground voltage conductor (e.g. 2842), source of the transistor $PU_R$ is connected to a supply voltage conductor (e.g. 2851), and drains of the transistors $PU_R$ and $PD_R$ are connected to a second terminal of the pass gate $PG_R$ at the bottom. A word line 2820 is connected to gates of the pass gates $PG_L$ and $PG_R$.

FIG. 29 is a simplified layout diagram showing a top view of two SRAM cells, utilizing conductors including a plurality of doped horizontal nanowires configured as bit lines. FIG. 29A is a legend applicable to FIG. 29. Description is provided below for the SRAM cell 2991, as it is representative of SRAM cells in an SRAM array, including the SRAM cell 2992.

As illustrated in the example of FIG. 29, each of the two SRAM cells (e.g. 2991, 2992) is laid out in 3 tracks, in comparison to the SRAM cell as illustrated in FIG. 28, which is laid out in 5 tracks. Consequently, the SRAM cell as illustrated in FIG. 29 can save about 40% in cell area, as the 2 tracks for access points shown in FIG. 28 are not needed. The reduction of 40% in cell area can lead to shorter bit lines, and smaller and faster SRAM arrays.

Each of the two SRAM cells stores a single bit of data. Each of the two SRAM cells includes the pull-down transistor $PD_L$ and the pull-up transistor $PU_L$ in the first inverter, the pull-down transistor $PD_R$ and the pull-up transistor $PU_R$ in the second inverter, and the pass gates $PG_L$ and $PG_R$, as described for SRAM cell 1900 in FIG. 19. Transistors $PD_L$, $PU_L$, $PD_R$, $PU_R$, $PG_L$, and $PG_R$ are implemented as VFETs.

In a vertical direction perpendicular to the plane in which the top view of the layout is shown, transistors $PD_L$, $PU_L$, $PD_R$, $PU_R$, $PG_L$, and $PG_R$ implemented as VFETs are disposed between a surface and a bottom. Ground voltage conductors (e.g. 2941, 2942) and supply voltage conductors (e.g. 2951) are disposed at the surface.

Conductors including a plurality of doped horizontal nanowires are configured as complementary bit lines BL and BL/ at the bottom below the transistors. Nanowires in the plurality of doped horizontal nanowires include a nanowire having a minimum dimension which is less than 10 nanometers. Bit lines BL and BL/ can extend across adjacent SRAM cells (e.g. 2991, 2992) laid out in a direction parallel to word lines (e.g. 2920) or orthogonal to supply voltage conductors and ground voltage conductors (e.g. 2941, 2942, 2951). For a conductor configured as a bit line BL or BL/, the number of layers in a stack and the number of stacks in a plurality of stacks can be determined by the current carrying requirement of the bit line.

For the first inverter, bit line BL (e.g. 2931) is connected to a first terminal of the pass gate $PG_L$, drains of the transistors $PU_L$ and $PD_L$ are connected to a second terminal of the pass gate $PG_L$ at the bottom, source of the transistor $PD_L$ is connected to a ground voltage conductor (e.g. 2941), and source of the transistor $PU_L$ is connected to a supply voltage conductor (e.g. 2951).

For the second inverter, bit line BL/ (e.g. 2932) is connected to a first terminal of the pass gate $PG_R$, drains of the transistors $PU_R$ and $PD_R$ are connected to a second terminal of the pass gate $PG_R$ at the bottom, source of the transistor $PD_R$ is connected to a ground voltage conductor (e.g. 2942), and source of the transistor $PU_R$ is connected to a supply voltage conductor (e.g. 2951). A word line 2920 is connected to gates of the pass gates $PG_L$ and $PG_R$.

Alternate implementations of the nanowire circuit structures discussed herein in general, and more specifically of the structures shown in FIGS. 22 through 29, can use 2D material strips in place of the nanowires.

Figure 30:
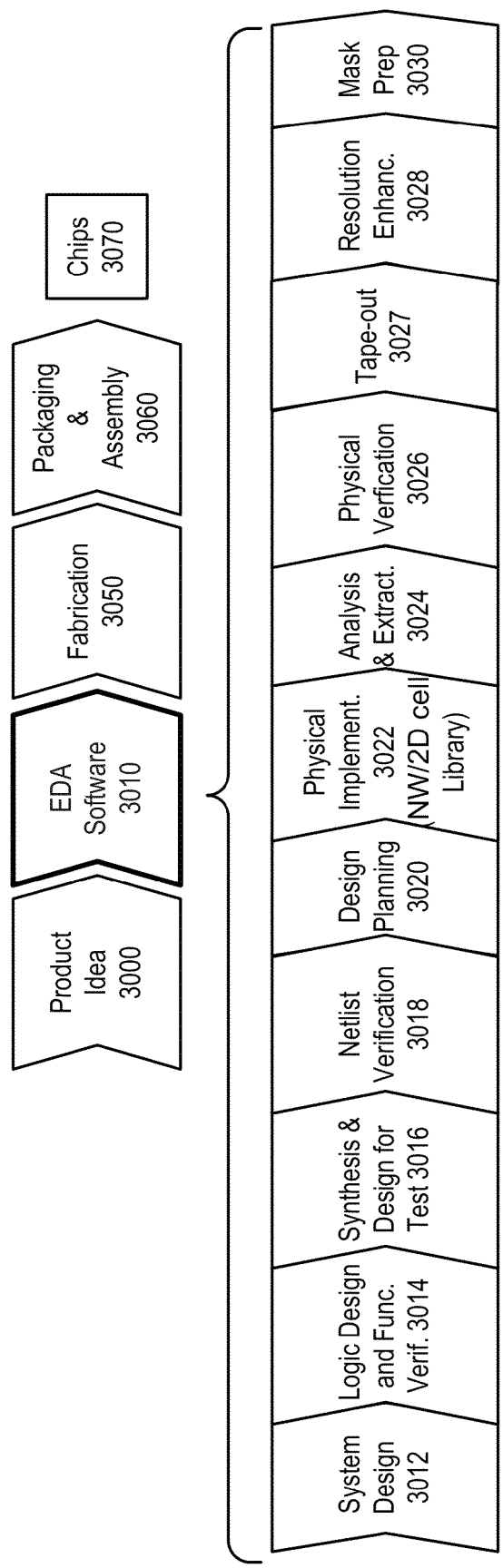
FIG. 30 shows a simplified representation of an illustrative integrated circuit design flow.

FIG. 30 shows a simplified representation of an illustrative integrated circuit design flow. As with all flowcharts herein, it will be appreciated that many of the steps of FIG. 30 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied.

At a high level, the process of FIG. 30 starts with the product idea (block 3000) and is realized in an EDA (Electronic Design Automation) software design process (block 3010). When the design is finalized, the fabrication process (block 3050) and packaging and assembly processes (block 3060) occur, ultimately resulting in finished integrated circuit chips (result 3070).

The EDA software design process (block 3010) is actually composed of a number of steps 3012-3030, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (block 3010) will now be provided.

System design (block 3012): The designers describe the functionality that they want to implement; they can perform what-if planning to refine functionality; check costs; etc. Hardware-software architecture selection can occur at this stage. Example EDA software products that have been available from Synopsys, Inc. that could be used at this step include Model Architect, Saber, System Studio, and DesignWare® products.

Logic design and functional verification (block 3014): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products that have been available from Synopsys, Inc. that could be used at this step include VCS, VERA, DesignWare®, Magellan, Formality, ESP and LEDA products.

Synthesis and design for test (block 3016): Here, the VHDL/Verilog is translated to a netlist. The netlist can be optimized for the target technology. Additionally, the design and implementation of tests to permit checking of the finished chip occur. Example EDA software products that have been available from Synopsys, Inc. that could be used at this step include Design Compiler®, Physical Compiler, Test Compiler, Power Complier, FPGA Compiler, TetraMAX, and DesignWare® products. Optimization of design for use of nanowire and 2d material strip cells as described herein can occur in this stage.

Netlist verification (block 3018): At this step, the netlist is checked for compliance with timing constraints and for correspondence with the VHDL/Verilog source code. Example EDA software products that have been available from Synopsys, Inc. that could be used at this step include Formality, PrimeTime, and VCS products.

Design planning (block 3020): Here, an overall floor plan for the chip is constructed and analyzed for timing and top-level routing. Example EDA software products that have been available from Synopsys, Inc. that could be used at this step include Astro and IC Compiler products. Nanowire based, and/or 2D material strip based, cell selection, layout and optimization can occur at this stage.

Physical implementation (block 3022): The placement (positioning of circuit elements) and routing (connection of the same) occurs at this step. Example EDA software products that have been available from Synopsys, Inc. that could be used at this step include AstroRail, Primetime, and Star RC/XT products. Nanowire based, and/or 2D material strip based, cell layout, mapping and interconnect arrangements can be implemented or optimized at this stage, using for example nanowire cells based on nanowire cell layouts and structures described herein.

Analysis and extraction (block 3024): At this step, the circuit function is verified at a transistor level; this in turn permits what-if refinement. Example EDA software products that have been available from Synopsys, Inc. that could be used at this stage include Custom Designer, AstroRail, PrimeRail, Primetime, and Star RC/XT products.

Physical verification (block 3026): At this stage various checking functions are performed to ensure correctness for: manufacturing, electrical issues, lithographic issues, and circuitry. Example EDA software products that have been available from Synopsys, Inc. that could be used at this stage include the Hercules product.

Tape-out (block 3027): This stage provides the "tape-out" data for production of masks for lithographic use to produce finished chips. Example EDA software products that have been available from Synopsys, Inc. that could be used at this stage include the CATS® family of products.

Resolution enhancement (block 3028): This stage involves geometric manipulations of the layout to improve manufacturability of the design. Example EDA software products that have been available from Synopsys, Inc. that could be used at this stage include Proteus/Progen, ProteusAF, and PSMGen products.

Mask preparation (block 3030): This stage includes both mask data preparation and the writing of the masks themselves. Example EDA software products that have been available from Synopsys, Inc. that could be used at this stage include CATS® family of products.

Embodiments of the nanowire based, and/or 2D material strip based, technologies described herein can be used during one or more of the above-described stages, including for example one or more of stages 3016 through 3022 and 3030. Also, nanowire cell and 2D material strip cell technology provide flexibility that enables the implementation of engineering change orders ECOs, including modification of the cell sizes during design verification stages.

Figure 31:
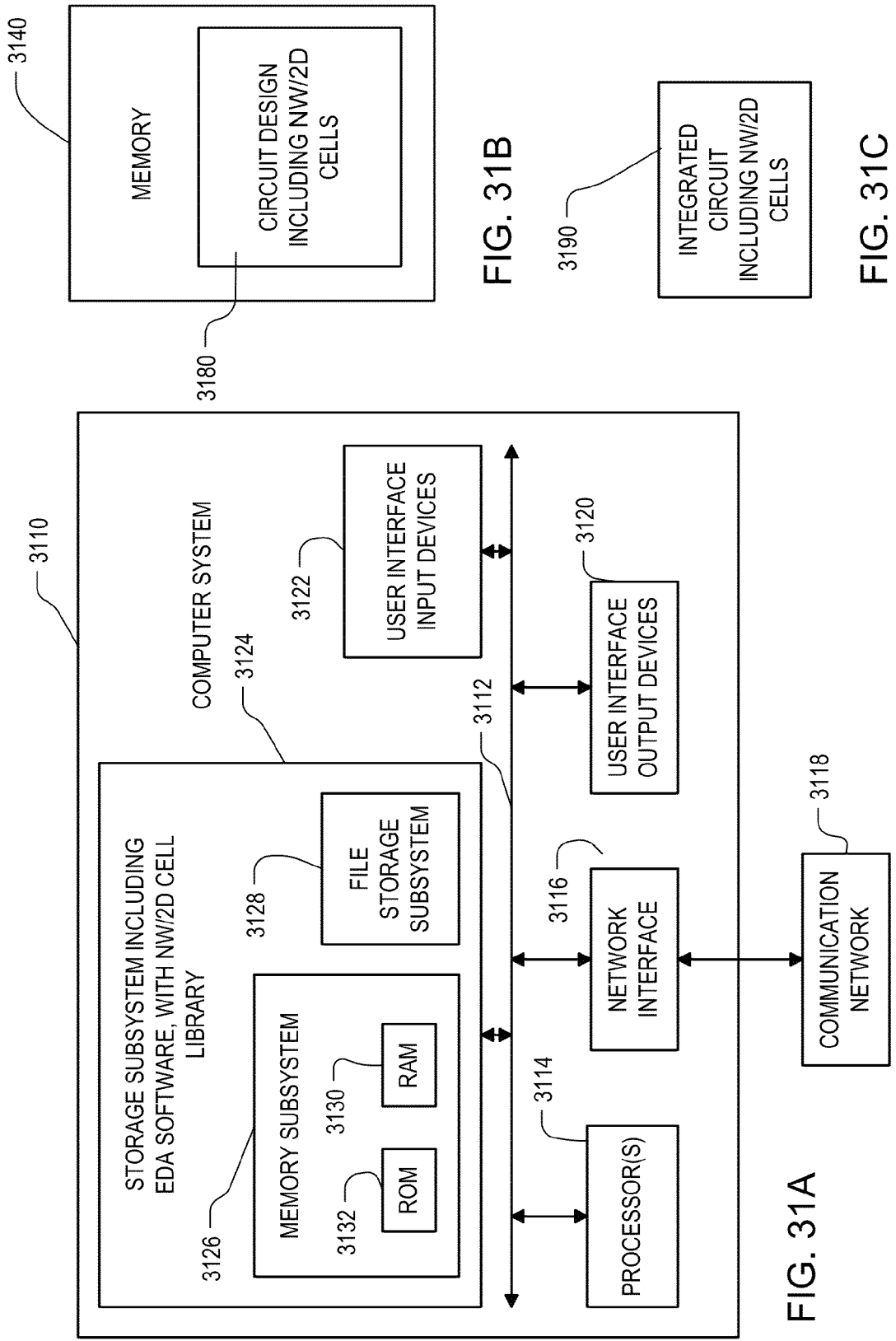
FIGS. 31A, 31B and 31C are simplified block diagrams of a computer system suitable for use with embodiments of the technology, as well as circuit design and circuit embodiments of the technology.

FIGS. 31A, 31B and 31C are simplified block diagrams of a computer system suitable for use with embodiments of the technology, as well as circuit design and circuit embodiments of the technology. Computer system 3110 typically includes at least one processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110. Network interface subsystem 3116 provides an interface to outside networks, including an interface to communication network 3118, and is coupled via communication network 3118 to corresponding interface devices in other computer systems. Communication network 3118 may comprise many interconnected computer systems and communication links. These communication links may be wireline links, optical links, wireless links, or any other mechanisms for communication of information. While, in one embodiment, communication network 3118 is the Internet, communication network 3118 may be any suitable computer network.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 3110 to the user or to another machine or computer system.

Storage subsystem 3124 stores the basic programming and data constructs that provide the functionality of some or all of the EDA tools described herein, including the nanowire cell library in which at least one cell specifies a circuit implementation utilizing parallel sets of vertical and/or horizontal nanowires and/or 2D material strips as described herein, and tools applied for development of cells for the library and for physical and logical design using the library. These software modules are generally executed by processor 3114.

Memory subsystem 3126 typically includes a number of memories including a main random access memory (RAM) 3130 for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128.

Bus subsystem 3112 provides a mechanism for letting the various components and subsystems of computer system 3110 communicate with each other as intended. Although bus subsystem 3112 is shown schematically as a single bus, alternative embodiments of the bus subsystem may use multiple busses.

Computer system 3110 itself can be of varying types including a personal computer, a portable computer, a workstation, a computer terminal, a network computer, a television, a mainframe, or any other data processing system or user device. Due to the ever-changing nature of computers and networks, the description of computer system 3110 depicted in FIG. 31A is intended only as a specific example for purposes of illustrating the preferred embodiments. Many other configurations of computer system 3110 are possible having more or less components than the computer system depicted in FIG. 31A.

FIG. 31B shows a memory 3140 such as a non-transitory, computer readable data storage medium associated with file storage subsystem 3128, and/or with network interface subsystem 3116, and can include a data structure specifying a circuit design that includes cells from the nanowire and/or 2D material strip cell library, or other nanowire cell-based or 2D material strip-based cells. In other embodiments, the memory 3140 stores a cell library that includes cells implemented using a flexible nanowire and/or 2D material strip cell structure. The memory 3140 can be a hard disk, a floppy disk, a CD-ROM, an optical medium, removable media cartridge, or other medium that stores computer readable data in a volatile or non-volatile form. The memory 3140 is shown storing a circuit design 3180, including for example a description of geometric features of a circuit implementing a cell or macrocell, that includes one or more nanowire block cells created with the nanowire technology described herein.

FIG. 31C is a block representing an integrated circuit 3190 created with the described technology that includes one or more nanowire cells, one or more 2D material strip cells, and/or cells selected from a nanowire cell library.

Figure 32:
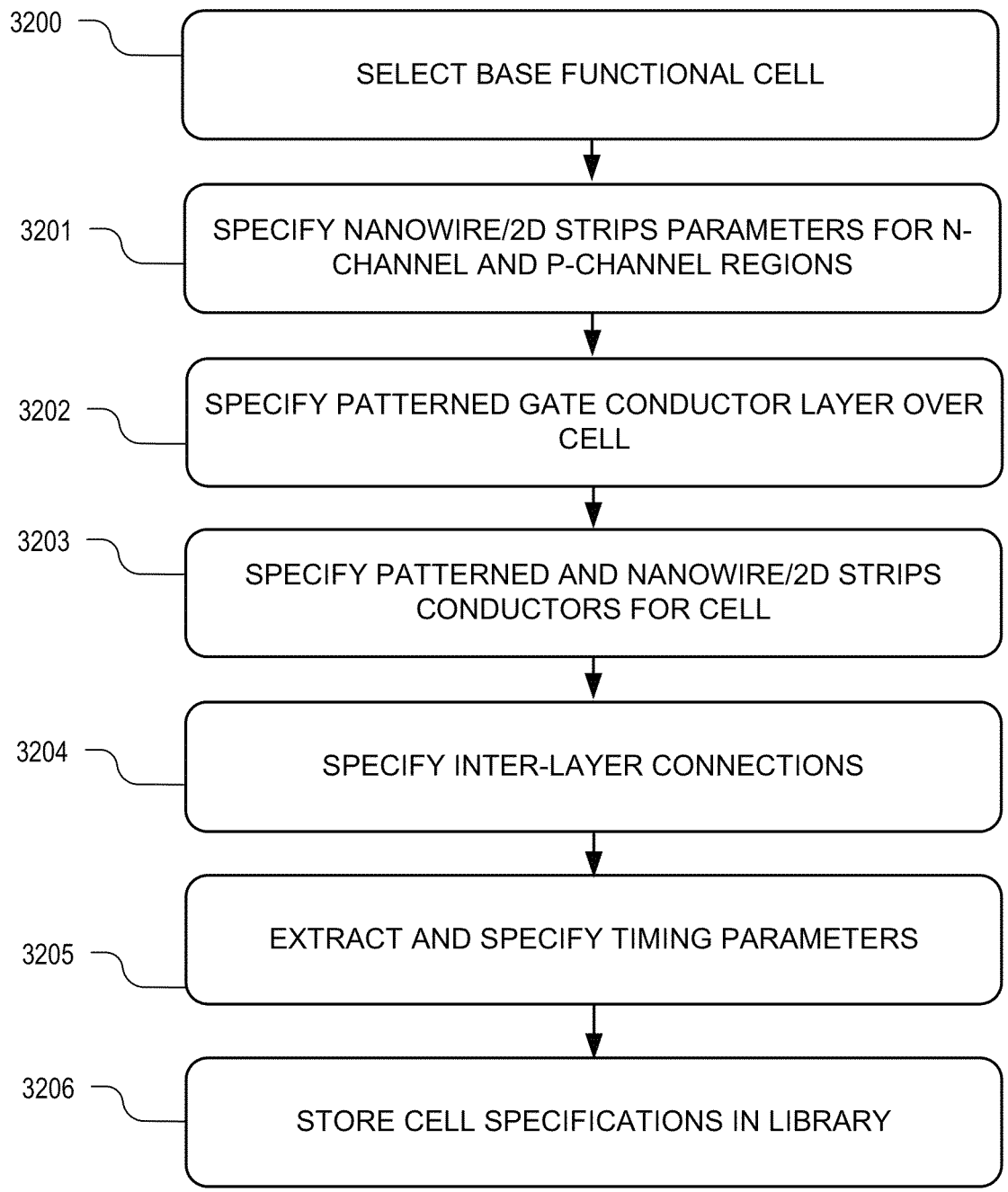
FIG. 32 is a simplified flow diagram of a process for designing a nanowire cell for a cell library.

FIG. 32 is a simplified flow diagram of a process for designing a nanowire or 2D material cell for a cell library. The method may be performed, for example, by an interactive software tool that is used by a cell designer to create a library of cells. The order of the steps can be modified as suits a particular design. According to the simplified flow diagram, a base cell to be included in a cell library is selected (3200). Such a base cell can be an inverter as described above, a flip-flop, logic gates, logic blocks or other cell structures. A base cell may consist of a configuration like that of FIG. 3A-3B or 4A-4B in which the number of rows of p-channel nanowires or 2D material strips, the number of layers of p-channel nanowires or 2D material strips, the number of rows of n-channel nanowires or 2D material strips, and the number of layers of n-channel nanowires or 2D material strips are selectable parameters, within a set of parameters available according to a target manufacturing process or target manufacturing processes.

In other examples, the user may specify a cell characteristic, such as conductance of the transistors in the on state, or drive ability of the cell. The design tool could use the user specified characteristic to determine cell features including the number of rows and layers of p-channel nanowires or 2D material strips, and the number of rows and layers of n-channel nanowires or 2D material strips. User input may specify or provide input used to determine other features, including gate dimensions for example, and features relating to the shape and location of objects in the cell (e.g., cell boundary, location and width of power conductors, gates, active areas) and so on (3201).

The base cell input can comprise a specification of a finFET cell, and the configuration of the fins and the transistors including the fins in the base cell can be utilized to determine the number of rows of p-channel nanowires or 2D material strips, the number of layers of p-channel nanowires or 2D material strips, the number of rows of n-channel nanowires or 2D material strips, and the number of layers of n-channel nanowires or 2D material strips are selectable parameters, within a set of parameters available according to a target manufacturing process or target manufacturing processes. In this embodiment, the process converts a circuit having a particular transistor having a channel comprising a plurality of fins configured in parallel into a converted circuit, the converted circuit replacing the particular transistor with a converted transistor having a channel comprising a plurality of stacks of nanowires or 2D material strips arranged in parallel, taking advantage of the granularity of circuit tuning provided by the use of nanowires or 2D material strips as described herein.

Then, the patterned gate conductor layer is specified to form gates in rows overlying the sets of nanowires that will be used for transistors in the cell (3202). Then, the patterned conductor layers are specified, to establish appropriate interconnections, preferably including a layer having conductors arranged in columns, and a layer having conductors arranged in rows (3203). The plurality of patterned conductor layers includes power conductors. Then, the interlayer connections are specified to locate connections among the nanowires or 2D material strips, the gate conductors, nanowire interconnects or 2D material strip interconnects and the conductors, in the one or more patterned conductor layers (3204).

The process of creating the machine readable specifications for an entry in a cell library can include performing extraction processes to define physical characteristics and behaviors of the circuit such as timing parameters like delay, input and output capacitance, gain, area and so on. The extraction processes can be performed using electronic design automation tools like those referred to in connection with FIG. 29 (3205). The specifications produced in this method can comprise layout files implemented in an executable file using Open Architecture System Interchange Standard OASIS format or a Graphic Data System GDS II format file representing the specified geometric shapes of the elements including the nanowires or 2D material strips. The specifications can include timing files in an executable Liberty Timing File format (.lib) or in another computer executable format. Entries for a cell library can be created and stored in computer readable memory using the specification, where the entries include the computer readable specifications.

The specified cells are then stored as entries in a cell library for use in integrated circuit design (3206). The specifications in entries in the cell library are executable by a computer running a placement process to control physical placement of the circuit with other circuits or components.

As such, a machine readable specification of a circuit in the context of this description includes a functional configuration of the elements, such as hierarchical configurations, and configurations matching application programmer interfaces (APIs), necessary for execution by the tools for mapping cells from netlists, tools for placement and routing, tools for optimization and/or other tools involved in the production of an integrated circuits and integrated circuit designs utilizing the circuits.

The process may be repeated to define a large number of circuits used as building blocks in integrated circuits. The specifications of the circuits can be used to generate a cell library that includes a large number of cells implementing different functions and performance specifications. In addition, a cell library can be implemented in which a plurality of entries specify implementations of a common circuit configuration, such as a NAND gate circuit as shown in FIG. 10B. Each of the entries specifying a common NAND gate circuit using nanowires or 2D material strips can differ in the number of nanowires or 2D material strips used for a particular transistor or used for a particular interconnect. For example, the particular transistor 633 in the circuit configuration of FIG. 10B can have a set of nine nanowires in one entry in the cell library, and have a set of 10 nanowires in another entry in the cell library.

Figure 33:
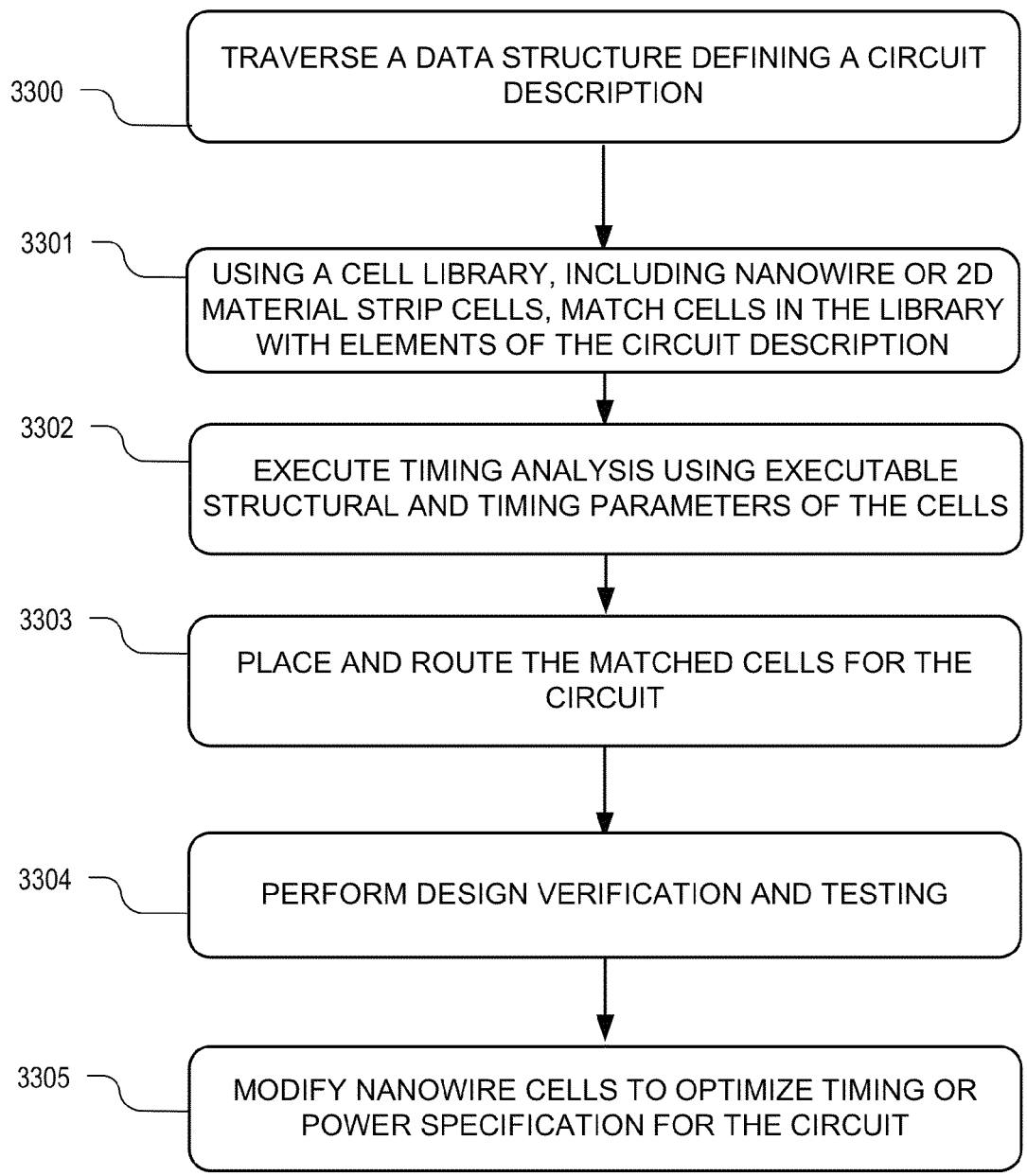
FIG. 33 is a flowchart for a representative design automation process which can be implemented as logic executed by a system like that represented by FIGS. 31A-31C.

FIG. 33 is a flowchart for a representative design automation process which can be implemented as logic executed by a system like that represented by FIGS. 31A, 31B and 31C, including a nanowire or 2D material strip cell library having cells implemented using at least one nanowire cell and/or at least one 2D material strip cell as described herein. According to a first step of the process, a data structure that defines a circuit description, such as a netlist, is traversed in a data processing system (3300). A cell library stored in a database or other computer readable medium coupled with the data processing system, that includes nanowire or 2D material strip cells, as described herein, is accessed by the data processing system, and utilized to match cells in the library with the elements of the circuit description (3301). Timing analysis can be performed using the executable structural and timing specifications in the cell library, based on other components and circuits, and based on estimates about the other components and circuits. (3302). The matched cells are then placed and routed for an integrated circuit layout (3303). Next, design verification and testing is executed (3304). Finally, nanowire cells can be modified to optimize timing or power specifications for the circuit (3305). The modifications of the nanowire or 2D material strip cells can comprise mask changes that result in changes to the conductors in the patterned conductor layers, and in the pattern of interlayer connectors, to change the number of nanowires or 2D material strips utilized in a particular transistor. These changes can be accomplished in some instances without changing the area on the integrated circuit occupied by the cell.

A nanowire or 2D material strip cell architecture described above can be utilized to create a flexible library that comprises a plurality of nanowire or 2D material strip cells meeting different functional specifications.

In general, the creation of a nanowire or 2D material strip cell flexible library is enabled using the architectures described herein. In such library, the standard cells can consist of "soft macros" that could be populated with some flexibility as to the exact location, or the exact number of nanowires used in implementation, of their underlying elements. Unlike planar CMOS structures, where the granularity for modifications or adjustments of the cells is the whole transistor, in nanowire or 2D material strip cell architectures as described herein, the granularity can be a single nanowire or 2D material strip.

A library can be comprised of a plurality of nanowire or 2D material strip cells which exploit subsets of the available nanowire or 2D material strip options in the cells, leaving room for optimization procedures that need not alter the area of the layout consumed by the cell in placement.

The following table provides a heuristic representation of an organization of a nanowire cell library having a plurality of entries. Alternative embodiments can include 2D material strip cells in the library. Some of the information which can be included in the entries in computer readable form is illustrated in the table.

| | |
|---|---|
| NAND-1 | Layout file including transistors T1, T2, . . . and interconnects X1, X2 . . .<br>n-channel T1 having parallel nanowire channel - 3 stacks of 3 layers each,<br>p-channel T2 having parallel nanowire channel - 4 stacks of 3 layers each,<br>n-channel T3 having 6 parallel nanowire channel - 2 stacks of 3 layers each,<br>. . .<br>Interconnect X1 having 16 parallel nanowires<br>Interconnect X2 having 8 parallel nanowires<br>. . .<br>Structure and Timing parameters (e.g. GDS and .lib files) |
| NAND-2 | Layout file including transistors T1, T2, . . . and interconnects X1, X2 . . .<br>n-channel T1 having parallel nanowire channel - 2 stacks of 5 layers each,,<br>p-channel T2 having parallel nanowire channel - 2 stacks of 6 layers each,<br>n-channel T3 having parallel nanowire channel - 3 stacks of 2 layers each and 1 stack of 2X width and layers<br>. . .<br>Interconnect X1 having 16 parallel nanowires<br>Interconnect X2 having 8 parallel nanowires<br>. . .<br>Structure and Timing parameters (e.g. GDS and .lib files) |
| . . . | |
| NOR-1 | Layout file including transistors T1, T2, . . . and interconnects X1, X2 . . .<br>n-channel T1 having 10 parallel nanowire channel,<br>p-channel T2 having 12 parallel nanowire channel<br>n-channel T3 having 8 parallel nanowire channel<br>. . .<br>Interconnect X1 having 16 parallel nanowires<br>Interconnect X2 having 8 parallel nanowires<br>Structure and Timing parameters (e.g. GDS and .lib files) |
| NOR-2 | Layout file including transistors T1, T2, . . . and interconnects X1, X2 . . .<br>n-channel T1 having 9 parallel nanowire channel,<br>p-channel T2 having 12 parallel nanowire channel<br>n-channel T3 having 6 parallel nanowire channel<br>. . .<br>Interconnect X1 having 16 parallel nanowires<br>Interconnect X2 having 8 parallel nanowires<br>Structure and Timing parameters (e.g. GDS and .lib files) |
| . . . | |
| BUFFER 1 | Layout file including transistors T1, T2, . . . and interconnects X1, X2 . . .<br>n-channel T1 having 9 parallel nanowire channel,<br>p-channel T2 having 12 parallel nanowire channel<br>. . .<br>Interconnect X1 having 16 parallel nanowires<br>Interconnect X2 having 8 parallel nanowires<br>Structure and Timing parameters (e.g. GDS and .lib files) |
| BUFFER 2 | Layout file including transistors T1, T2, . . . and interconnects X1, X2 . . .<br>n-channel T1 having 3 parallel nanowire channel,<br>p-channel T2 having 5 parallel nanowire channel<br>. . .<br>Interconnect X1 having 8 parallel nanowires<br>Interconnect X2 having 8 parallel nanowires<br>Structure and Timing parameters (e.g. GDS and .lib files) |
| . . . | |
| SRAM ARRAY MACROCELL | Unit cell file including transistors T1, T2, . . . and interconnects X1, X2 . . .<br>n-channel T1 having 9 parallel horizontal nanowire channel,<br>p-channel T2 having 12 parallel horizontal nanowire channel<br>n-channel T3 having 6 parallel horizontal nanowire channel<br>. . .<br>Interconnect X1 having . . .<br>Interconnect X2 having . . .<br>Bit lines . . .<br>Word lines . . .<br>Structure and Timing parameters (e.g. GDS and .lib files) |
| . . . | |

In the cell library represented by the above table there is a set of entries for NAND cells, including NAND-1 and NAND-1. The entries in the set of entries specifying NAND cells can specify a functional circuit having in common a circuit configuration for a NAND cell. Entries in the set specifying a functional circuit having a common circuit configuration specify implementation the same number of transistors interconnected in the same manner. The entries can differ as described herein, in the number of parallel nanowires or 2D material strips utilized in particular transistors. Thus, for the entry NAND-1, the specified n-channel transistor T1 has a channel comprising a set of nine parallel nanowires, arranged in three stacks of three layers each. The specified p-channel transistor T2 has a channel comprising a set of 12 parallel nanowires, arranged in four stacks of three layers each. The specified n-channel transistor T3 has a channel comprising six parallel nanowires, arranged in two stacks of three layers each. For the entry NAND-2, the specified n-channel transistor T1 has a channel comprising a set of 10 parallel nanowires, arranged in two stacks of five layers each. The specified p-channel transistor T2 has a channel comprising a set of 12 parallel nanowires, arranged in two stacks of six layers each. The specified n-channel transistor T3 has a channel comprising eight parallel nanowires, arranged in four stacks of two layers each and in which the nanowire in one of the four stacks consists of nanowires which have a width greater than two times the height ("2× width"). The entries in a set of entries for a particular cell can differ in the number of parallel nanowires or 2D material strips in the channel of a particular transistor. Alternatively, entries in the set of entries for a particular cell can differ in the number of parallel nanowires or 2D material strips used in a particular interconnect within the cell.

The entries include computer readable parameters specifying structural features of physical implementations of circuits, such as geometric layout files for the structural elements of each layer of material in the circuit structure, which can be implemented using a computer program language, such as GDS II for example.

The entries also include computer readable parameters specifying parameters used to simulate timing characteristics of a physical implementation of the circuit when placed with other circuits or components. For example, the cell can include a Liberty Timing File (i.e., a .lib file) which contains the computer readable timing, delay and power parameters associated with the cell. These timing parameters can be obtained by doing the SPICE (Simulation Program with integrated Circuit Emphasis) simulation of the cells under variety of conditions, using machine readable parameters specifying the structure features of the cell. The entries in the cell library can be selected according to performance specifications provided by a user to satisfy the elements in a circuit design, such as a netlist.

Also, the entries can define or be utilized to define lithographic mask layers for each cell or macrocell and for a circuit incorporating the cells or macrocells. The specifications can then be utilized by a computer program used to produce a set of masks for a manufacturing process implementing the cells or macrocells selected for the circuit design.

Thus, the entries have functional control of the results of a computer running a placement process to control physical placement of the circuit with other circuits or components. A placement process utilizes the entry to estimate the area and timing behavior of the cell specified by the entry, based on assumptions about the proximity to other cells and capacitance of interconnections among cells and other components. The placement process utilizes this estimate to make a placement of the cell with other cells of a circuit design, to be utilizing in an iterative process that determines final placement and routing of interconnections among cells.

The cell library represented by the table also includes a set of entries specifying NOR cells and a set of entries specifying buffers or inverters. The entries in the set of the NOR cells have in common the same circuit configuration, where the differences arise in the number of parallel nanowires used in the various components within the cell. Likewise, the entries in the set of buffer or inverter cells have in common the same circuit configuration, and differences that arise in the number of parallel nanowires or 2D material strips used in the various components within the cell.

The cell library also includes entries that specify SRAM macrocells, where a macrocell consists of a plurality of unit cells and connections between the unit cells. For SRAM macro cells, the unit cell can be a six transistor memory element. The number of nanowires or 2D material strips utilized in the various transistors within the unit cell can be tuned for the purposes of optimizing performance of the unit cell. The SRAM macrocells can differ in the form of the bit lines utilized for connections among the unit cells. Thus, SRAM ARRAY MACROCELL can specify a patterned metal layer interconnected with horizontal nanowire transistors, to act as bit lines. A placement process can utilize the structural and timing parameters of a macrocell, and of unit cells of a macrocell, as discussed above in connection the cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A computer system adapted to process a computer implemented representation of a circuit design, comprising:
    a processor and a memory coupled to the processor, the memory storing instructions that, when executed by the processor, cause the processor to select cells from a cell library;
    the cell library including entries for a plurality of cells, the entries in the cell library including specifications of particular cells in a computer executable language; and
    at least one entry in the cell library comprising a specification of physical structures and timing parameters of
    an array of circuit cells, wherein one or more circuit cells in the array each including one or more transistors and one or more cell interconnect terminals; and
    a conductor configured to connect cell interconnect terminals of a plurality of the circuit cells in the array, the conductor comprising one or more nanowires or 2D material strips arranged in parallel.

2. The computer system of claim 1, wherein the one or more nanowires or 2D material strips of the conductor include segments disposed horizontally relative to a surface of a substrate, and the one or more transistors of the circuit cells are disposed in a layer above the conductor.

3. The computer system of claim 1, wherein the one or more nanowires or 2D material strips of the conductor include segments disposed horizontally relative to a surface of a substrate, and the one or more transistors of the circuit cells are disposed in a layer below the conductor.

4. The computer system of claim 1, wherein the circuit cells comprise SRAM cells, and the conductor is configured as a bit line.

5. The computer system of claim 1, wherein the circuit cells comprise SRAM cells, and the conductor is configured as a word line.

6. The computer system of claim 1, wherein a circuit cell of the circuit cells comprises:
    a first transistor connected between a first terminal and a second terminal;
    a second transistor connected between the second terminal and a third terminal;
    a third transistor connected between the second terminal and a cell interconnect terminal;
    a first gate conductor connected to gate of the first transistor and gate of the second transistor; and
    a second gate conductor connected to gate of the third transistor.

7. The computer system of claim 1, wherein the one or more nanowires or 2D material strips include nanowires or 2D material strips disposed in a stack having a number of layers.

8. The computer system of claim 1, wherein the one or more nanowires or 2D material strips include nanowires or 2D material strips disposed in a plurality of stacks.

9. The computer system of claim 1, wherein the one or more nanowires or 2D material strips include a nanowire having a minimum dimension which is less than 10 nanometers.

10. The computer system of claim 1, wherein the circuit cells are disposed on a substrate having a surface, and comprise at least one transistor having a channel including a set of nanowires or 2D material strips disposed vertically relative to the surface of the substrate.

11. The computer system of claim 1, wherein the circuit cells are disposed on a substrate having a surface, and comprise at least one transistor having a channel including a set of nanowires or 2D material strips disposed horizontally relative to the surface of the substrate.

12. The computer system of claim 1, wherein
the instructions further include logic to utilize the specification in said at least one entry to determine a physical placement of the cell.

13. The computer system of claim 1, wherein the circuit cells are disposed on a substrate having a surface, and comprise
a first transistor having a channel including a first set of nanowires or 2D material strips disposed vertically relative to the surface of the substrate, and connected in parallel between a first terminal and a second terminal;
a second transistor having a channel including a second set of nanowires or 2D material strips disposed vertically relative to the surface of the substrate and connected in parallel between the second terminal and a third terminal;
a third transistor having a channel including a third set of nanowires or 2D material strips disposed vertically relative to the surface of the substrate, and connected in parallel between the second terminal and a first interconnect point;
a first gate conductor disposed horizontally relative to the surface of the substrate and crossing the channel of the first transistor between the first and second terminals and crossing the channel of the second transistor between the second and third terminals;
a second gate conductor including a second interconnect point, and disposed horizontally relative to the surface of the substrate and crossing the channel of the third transistor between the second terminal and the first interconnect point; and
wherein the conductor comprises a plurality of nanowires or 2D material strips disposed horizontally relative to the surface of the substrate configured to connect one of the first interconnect point and the second interconnect point in a plurality of the circuit cells in the array.

14. A computer program product, comprising:
a memory device having stored thereon a machine readable specification of a cell, the specification of the cell including computer readable parameters specifying structural features of a physical implementation of a circuit, the specification being executable by a computer running a placement process to control physical placement of the circuit with other circuits or components, the circuit including:
an array of circuit cells, wherein one or more circuit cells in the array each including one or more transistors and one or more cell interconnect terminals; and
a conductor configured to connect cell interconnect terminals of a plurality of the circuit cells in the array, the conductor comprising one or more nanowires or 2D material strips arranged in parallel.

15. The computer program product of claim 14, wherein the one or more nanowires or 2D material strips of the conductor include segments disposed horizontally relative to a surface of a substrate, and the one or more transistors of the circuit cells are disposed in a layer above the conductor.

16. The computer program product of claim 14, wherein the one or more nanowires or 2D material strips of the conductor include segments disposed horizontally relative to a surface of a substrate, and the one or more transistors of the circuit cells are disposed in a layer below the conductor.

17. The computer program product of claim 14, wherein the circuit cells comprise SRAM cells, and the conductor is configured as a bit line.

18. The computer program product of claim 14, wherein the circuit cells comprise SRAM cells, and the conductor is configured as a word line.

19. The computer program product of claim 14, wherein a given circuit cell of the circuit cells comprises:
a first transistor, having a gate, and connected between a first terminal and a second terminal;
a second transistor, having a gate, and connected between the second terminal and a third terminal;
a third transistor, having a gate, and connected between the second terminal and a cell interconnect terminal of said one or more interconnect terminals of the given circuit cell;
a first gate conductor connected to the gate of the first transistor and to the gate of the second transistor; and
a second gate conductor connected to the gate of the third transistor.

20. The computer program product of claim 14, wherein the one or more nanowires or 2D material strips include nanowires or 2D material strips disposed in a stack having a number of layers.

21. The computer program product of claim 14, wherein the one or more nanowires or 2D material strips include nanowires or 2D material strips disposed in a plurality of stacks.

22. The computer program product of claim 14, wherein the one or more nanowires or 2D material strips include a nanowire having a minimum dimension which is less than 10 nanometers.

23. The computer program product of claim 14, wherein the circuit cells are disposed on a substrate having a surface, and comprise at least one transistor having a channel including a set of nanowires or 2D material strips disposed vertically relative to the surface of the substrate.

24. The computer program product of claim 14, wherein the circuit cells are disposed on a substrate having a surface, and comprise at least one transistor having a channel including a set of nanowires or 2D material strips disposed horizontally relative to the surface of the substrate.

25. The computer program product of claim 14, wherein the circuit cells are disposed on a substrate having a surface, and comprise
a first transistor having a channel including a first set of nanowires or 2D material strips disposed vertically relative to the surface of the substrate, and connected in parallel between a first terminal and a second terminal;
a second transistor having a channel including a second set of nanowires or 2D material strips disposed vertically relative to the surface of the substrate and connected in parallel between the second terminal and a third terminal;
a third transistor having a channel including a third set of nanowires or 2D material strips disposed vertically relative to the surface of the substrate, and connected in parallel between the second terminal and a first interconnect point;
a first gate conductor disposed horizontally relative to the surface of the substrate and crossing the channel of the first transistor between the first and second terminals and crossing the channel of the second transistor between the second and third terminals;
a second gate conductor including a second interconnect point, and disposed horizontally relative to the surface of the substrate and crossing the channel of the third transistor between the second terminal and the first interconnect point; and wherein the conductor comprises a plurality of nanowires or 2D material strips disposed horizontally relative to the surface of the substrate configured to connect one of the first interconnect point and the second interconnect point in a plurality of the circuit cells in the array.

\* \* \* \* \*